United States Patent
Shimada et al.

(10) Patent No.: US 8,028,264 B2
(45) Date of Patent: Sep. 27, 2011

(54) SEMICONDUCTOR DEVICE AND SEMICONDUCTOR DEVICE LAYOUT DESIGNING METHOD

(75) Inventors: Junichi Shimada, Kyoto (JP); Fumihiro Kimura, Nara (JP); Yoichi Matsumura, Osaka (JP); Takako Ohashi, Shiga (JP); Nobuyuki Iwauchi, Osaka (JP); Takeya Fujino, Osaka (JP); Takayuki Araki, Nara (JP); Yukiji Hashimoto, Osaka (JP); Takuya Yasui, Osaka (JP); Hirofumi Taguchi, Osaka (JP)

(73) Assignee: Panasonic Corporation, Osaka (JP)

( * ) Notice: Subject to any disclaimer, the term of this patent is extended or adjusted under 35 U.S.C. 154(b) by 595 days.

(21) Appl. No.: 11/790,736

(22) Filed: Apr. 27, 2007

(65) Prior Publication Data

US 2007/0252258 A1 Nov. 1, 2007

(30) Foreign Application Priority Data

Apr. 28, 2006 (JP) .................. 2006-126083

(51) Int. Cl.
*G06F 17/50* (2006.01)
(52) U.S. Cl. .................. 716/122; 716/118; 716/119
(58) Field of Classification Search .................. 716/1, 2, 716/5, 7–10, 118, 119, 122; 257/678, 922, 257/368; 438/129, 622
See application file for complete search history.

(56) References Cited

U.S. PATENT DOCUMENTS

| | | | |
|---|---|---|---|
| 5,278,105 A * | 1/1994 | Eden et al. ............ | 438/129 |
| 5,744,838 A | 4/1998 | Matsuo et al. | |
| 5,994,742 A | 11/1999 | Krishnan et al. | |
| 6,448,599 B1 * | 9/2002 | Wang .................... | 257/300 |
| 6,751,519 B1 | 6/2004 | Satya et al. | |
| 6,948,141 B1 | 9/2005 | Satya et al. | |
| 2002/0192886 A1 | 12/2002 | Inoue | |
| 2003/0080385 A1 * | 5/2003 | Kimura ................ | 257/347 |
| 2005/0006707 A1 | 1/2005 | Eriguchi et al. | |
| 2005/0010890 A1 | 1/2005 | Nehmadi et al. | |
| 2006/0026472 A1 | 2/2006 | Adkisson et al. | |
| 2007/0108614 A1 * | 5/2007 | Eriguchi et al. ........ | 257/741 |

FOREIGN PATENT DOCUMENTS

| | | |
|---|---|---|
| CN | 1574392 A | 2/2005 |
| JP | 2000-332206 | 11/2000 |
| JP | 2000-349243 | 12/2000 |
| JP | 2002-9161 | 1/2002 |
| JP | 2004-363255 | 12/2004 |

* cited by examiner

*Primary Examiner* — Vuthe Siek
(74) *Attorney, Agent, or Firm* — McDermott Will & Emery LLP

(57) ABSTRACT

A semiconductor device including a plurality of cells having an antenna protection element and a cell other than the antenna protection element; and a first dummy pattern and a second dummy pattern arranged in a layer above the plurality of cells. Further, the first dummy pattern overlaps with the antenna protection element, the second dummy pattern overlaps with the cell other than the antenna protection element, and a first layout rule of the first dummy pattern is different from a second layout rule of the second dummy pattern.

5 Claims, 50 Drawing Sheets

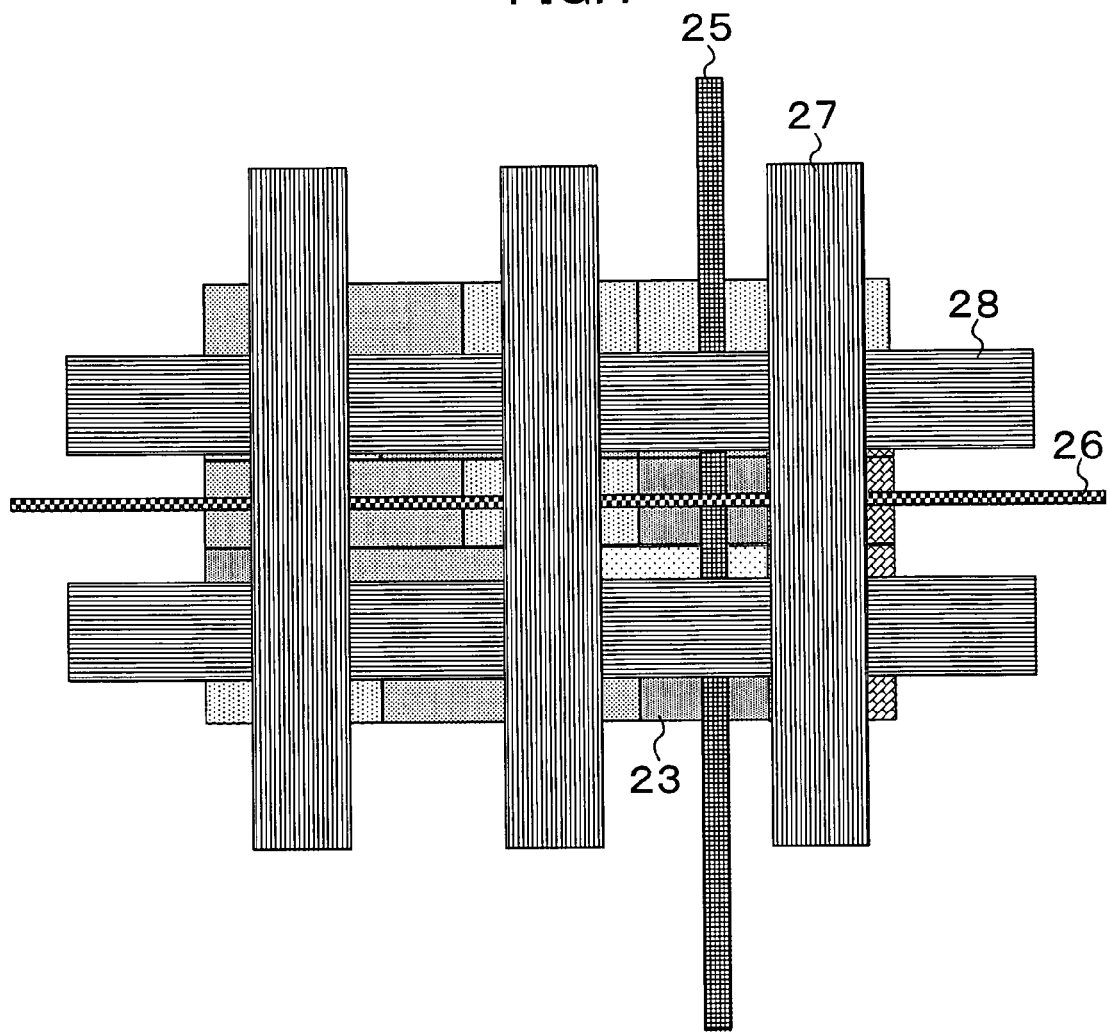

Section A-A

Section A-A

Section A-A

Section A-A

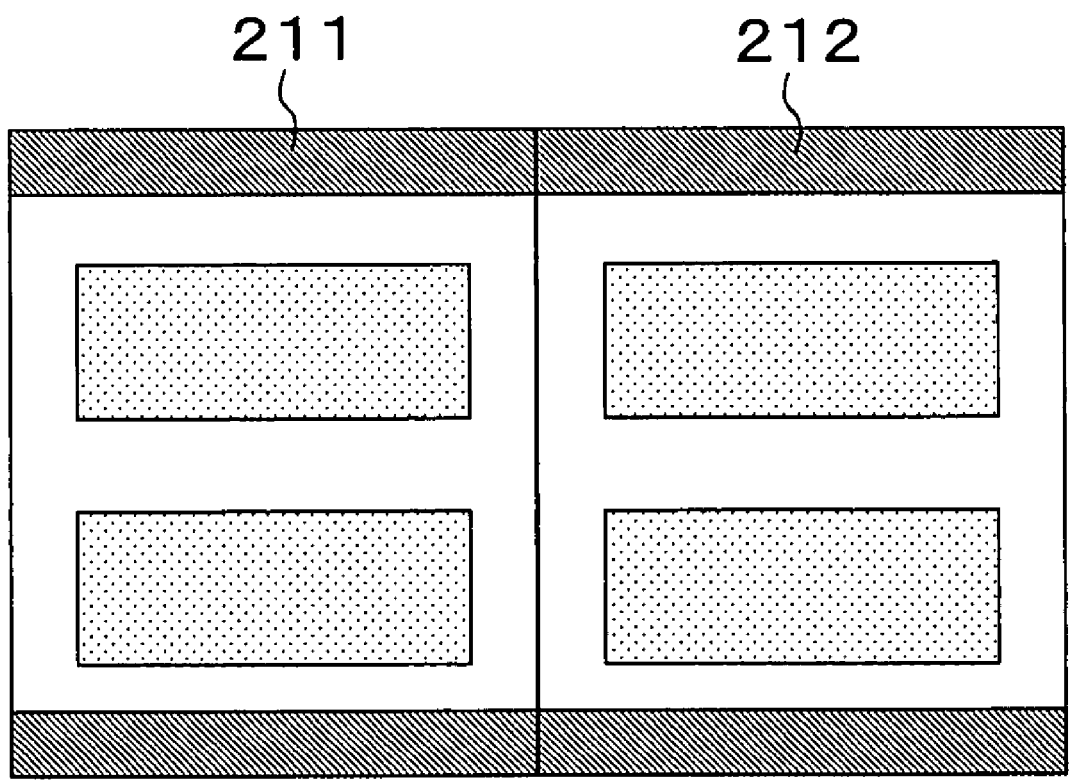

Section A-A

Section A-A

←M4
←M3
←M2
←M1

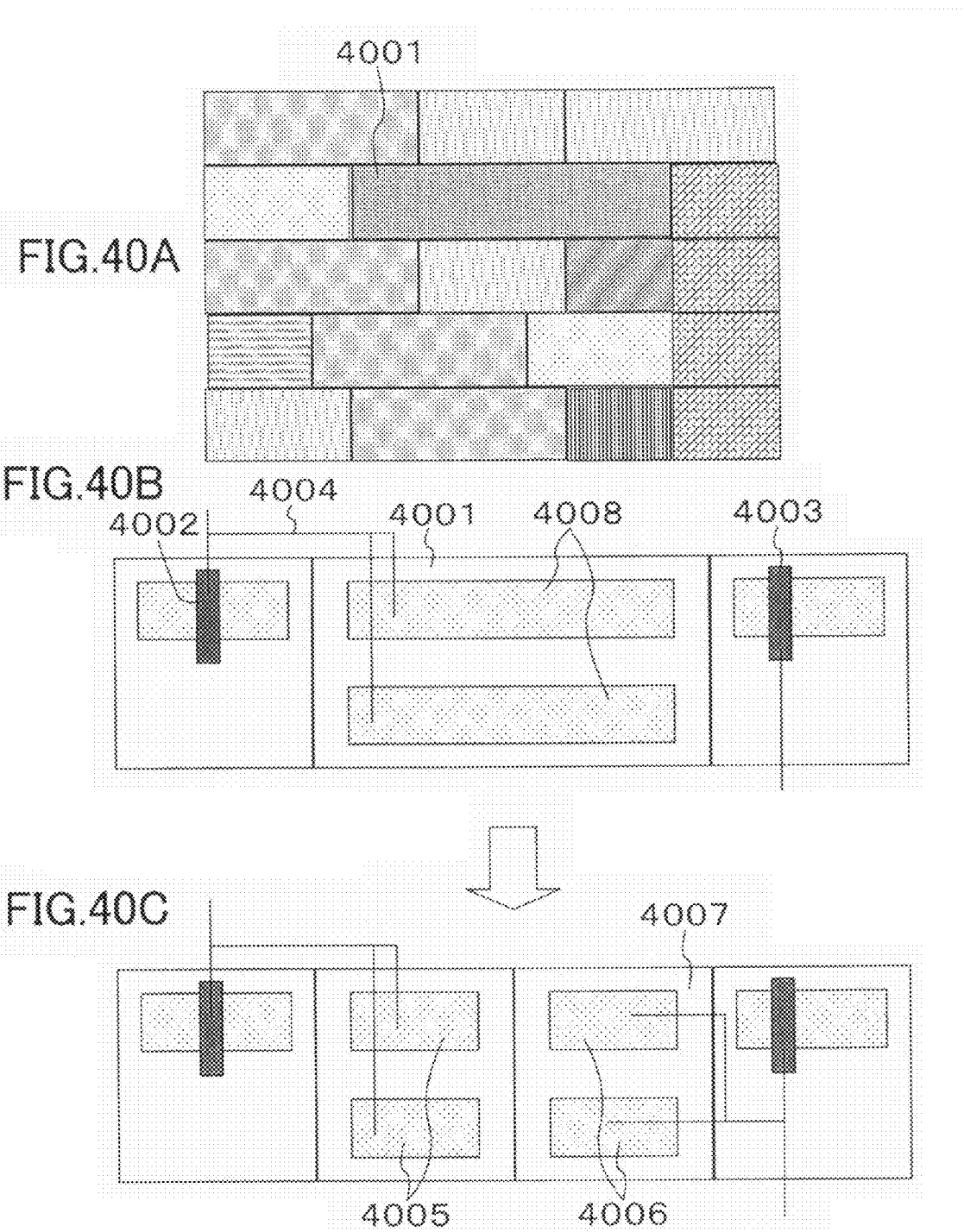

FIG.52
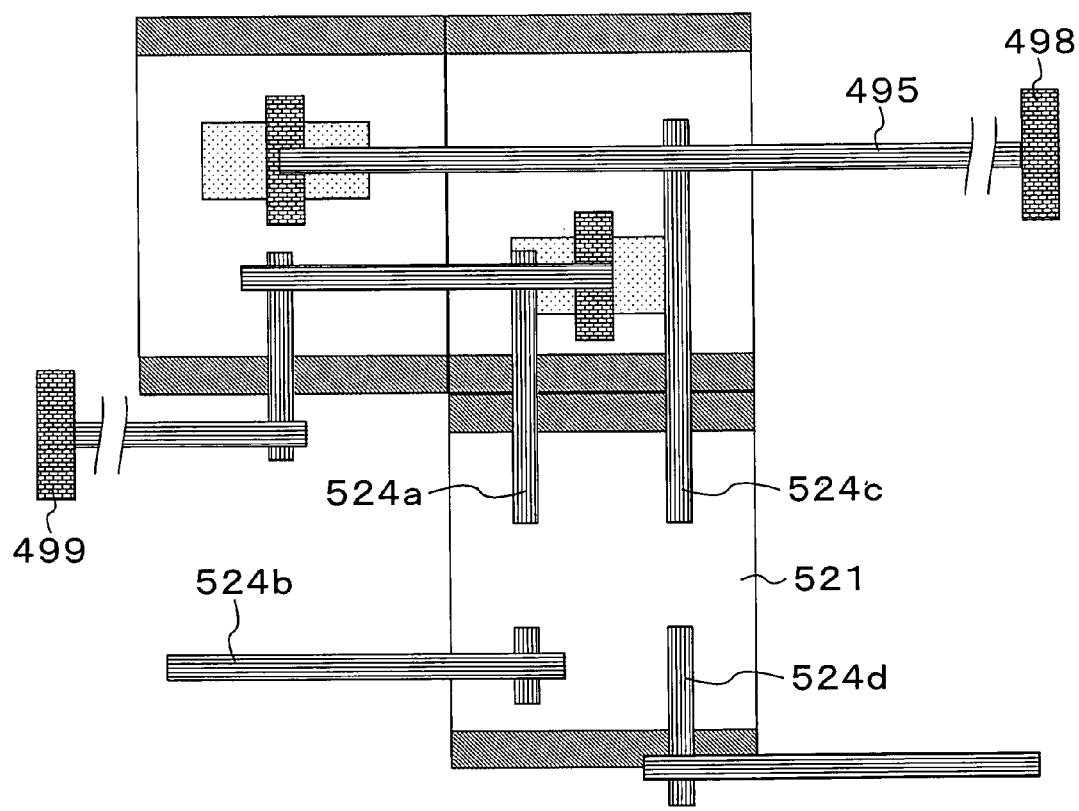
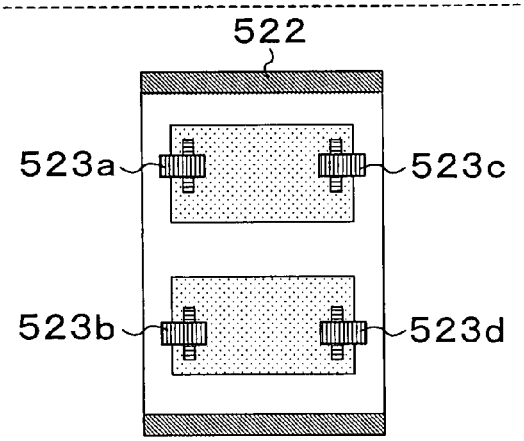

SEMICONDUCTOR DEVICE AND SEMICONDUCTOR DEVICE LAYOUT DESIGNING METHOD

CROSS REFERENCE TO RELATED APPLICATIONS

This Non-provisional application claims priority under 35 U.S.C. §119(a) on Patent Application No. 2006-126083 filed in Japan on Apr. 28, 2006, the entire contents of which are hereby incorporated by reference.

BACKGROUND OF THE INVENTION

1. Field of the Invention

The present invention relates to a semiconductor device including an antenna protection element for avoiding antenna damage and a layout designing method thereof.

2. Background Art

In association with recent miniaturization in semiconductor manufacturing technology, employment of a plasma process typified by plasma etching and plasma CVD becomes general in device manufacturing processes. While, there arises a serious problem of flaws of semiconductor elements called plasma charging damage, which is caused due to the plasma process.

The plasma charging damage is called also antenna damage and serves as a factor of an increase in gate leakage current, degradation of characteristics of semiconductor elements, such as variation in threshold voltage, breakdown, and reduction in lifetime. Further, scale down of the thicknesses of the gate oxide films accompanied by miniaturization in the process technology makes the antenna damage more serious.

Referring to one example of methods for solving such problems, Patent Document 1 (U.S. Pat. No. 5,994,742) discloses a method using a protection element (hereinafter referred to as an antenna protection element). Herein, the antenna protection element means an element including a diode, a thyristor, or the like of which conductivity increases when a beam (hereinafter referred to merely as UV light) in the ultra violet region emitted from plasma is irradiated to an active region thereof. According to Patent Document 1, a charge current that causes antenna damage is discharged to the ground potential through the antenna protection element, so that damage to the semiconductor element can be avoided.

Patent Document 1 further suggests that unless the UV light is irradiated to the active region of the antenna protection element, protection performance of the antenna protection element for protecting the semiconductor device from antenna damage is lowered. In view of this, Patent Document 1 discloses an arrangement in which a space is formed above the active region of an antennal protection element so that the UV light is irradiated to the active region thereof.

The configuration of Patent Document 1 will be described briefly with reference to FIG. 55. FIG. 55 is a diagram of a general layout using standard cells. In FIG. 55, reference numeral 5501 denotes an antenna protection element, 5502 and 5503 each denote a standard cell, 5504 and 5505 each denote a signal pattern, and 5506 denotes a dummy pattern. As can be understood from FIG. 55, any mask pattern is not arranged above the antenna protection element 5501. Namely, in Patent Document 1, in order to create a space above the antenna protection element, no mask pattern is arranged thereabove.

Referring to another document, Patent Document 2 (Japanese Patent Application Laid Open Publication No. 2004-363255A), it discloses an arrangement in which no dummy pattern is arranged above the active region of an antenna protection element so that the UV light is irradiated to the active region for relieving antenna damage. FIG. 56 shows an example of the arrangement employing the technique of Patent Document 2. FIG. 56 shows that the signal patterns 5504, 5505 are arranged above the antenna protection element 5501 while the dummy pattern 5506 is not arranged thereabove.

When the arrangement of Patent Document 2 is employed, a signal wiring can be arranged above an antenna protection element. Accordingly, when compared with Patent Document 1, the amount of the UV light irradiated to the active region reduces to lower the performance of the antenna protection element while the wiring efficiency of the signal patterns increases with a result of reduction in area of the semiconductor integrated circuit in design.

In the etching process and the CMP process, it is essential to satisfy an area ratio in a target layer which is obtained on the basis of a process condition. Unless the area ratio is satisfied, the etching rate varies and the surface of the substrate is planarized insufficiently in the CMP process, thereby achieving insufficient process accuracy. For tackling this problem, Patent Document 3 (Japanese Patent Application Laid Open Publication No. 2002-9161A) discloses that dummy patterns having different pitches or shapes in every check window are arranged in an unoccupied region.

In both Patent Document 1 and Patent Document 2, however, any dummy pattern cannot be arranged above the antenna protection element, thereby making the area ratio around the antenna protection element small to achieve insufficient process accuracy.

In Patent Document 2, the protection performance of the antenna protection element is determined independently from the amount of signal patterns arranged above the active region of the antenna protection element, so that too many or too few antenna elements may be arranged.

Further, since miniaturization in process technology, such as scale down in thicknesses of gate oxide films accompanies more serious antenna damage, the number and the area of the antenna elements to be arranged is liable to increase. For this reason, the dummy pattern in the underlying layer, which have been arranged in an unoccupied region conventionally, such as polysilicon, the active region, or the like, is reduced, involving difficulty in adjusting the area ratio in the underlying layer.

As described above, in designing and manufacturing a semiconductor device including an antenna protection element, various problems as exampled as above are involved, and therefore, a configuration and a layout designing method of a semiconductor device which solve the above problems are desired.

SUMMARY OF THE INVENTION

The present invention has its object of designing and manufacturing a semiconductor device including an antenna protection element more appropriately than ever before.

The present invention provides a semiconductor device, including: a gate; an antenna protection element including an active region and connected to the gate; a first wiring connected to the gate; and a second wiring which is not connected to the gate and is arranged in a layer above a wiring layer in which the first wiring is formed, wherein in the wiring layer in which the first wiring is formed, each wiring is provided so as not to cover an active region of the antenna protection element, and the second wiring is provided so as to cover at least a part of the active region of the antenna protection element.

In the above invention, each wiring is provided in the wiring layer in which the first wiring connected to the gate is formed so as not to cover the active region of the antenna protection element. Accordingly, the amount of the light to the antenna protection element can be secured until the wiring layer is formed, thereby allowing the antenna protection element to exert sufficient performance for protecting the semiconductor device from antenna damage. On the other hand, the second wiring provided in the upper layer of this wiring layer is provided so as to cover at least a part of the active region of the antenna protection element. Because any wiring layers formed above the wiring layer in which the first wiring is formed causes no antenna damage at the gate, it is allowed to be overlaid with the antenna protection element. This avoids antenna damage and secures wiring resources.

The present invention provides a semiconductor device, including: a plurality of cells including an antenna protection element; and dummy patterns arranged in a layer above the plurality of cells, wherein in the dummy patterns arrangement, a layout rule above the antenna protection element is different from a layout rule above a cell other than the antenna protection element.

In the above invention, the dummy pattern above the antenna protection element and the dummy pattern above cells other than the antenna protection element are different from each other in layout rule. In other words, a dummy pattern is arranged above the antenna protection element in accordance with a layout rule different from a layout rule above the other region so that the amount of the light to the active region can be secured. This enables both planarization and avoidance of antenna damage.

The present invention provides a semiconductor device, including: a plurality of cells including an antenna protection element; a running wiring arranged in a layer above the plurality of cells and running above the antenna protection element; and a dummy pattern arranged in layer above or below the running wiring, wherein the dummy pattern is arranged so as to overlap with the running wiring above the antenna protection element.

In the above invention, the dummy pattern is arranged above the antenna protection element so as to overlap with the running wiring, and accordingly, no reduction in the amount of the light to the antenna protection element is caused by the dummy pattern. This allows the antenna protection element to exhibit the performance sufficiently and satisfies the area ratio easily.

The present invention provides a semiconductor device, including: a plurality of cells including an antenna protection element; and a running wiring arranged in a layer above the plurality of cells and running above the antenna protection element, wherein the running wiring has a part above the antenna protection element which is smaller in area per unit length than a part other than the part above the antenna protection element.

In the above invention, the running wiring includes a part above the antenna protection element of which area per unit length is smaller than that of a part other than the part above the antenna protection element. Accordingly, the amount of the light to the antenna protection element can be secured while the wiring pattern necessary as the running wiring is maintained, thereby allowing the antenna protection element to exhibit the performance sufficiently.

The present invention provides a semiconductor device, including: a plurality of cells including an antenna protection element; and a plurality of running wirings arranged in a layer above the plurality of cells and running above the antenna protection element, wherein the plurality of running wirings are arranged apart from each other at an interval larger than a minimum interval of other wirings.

In the above invention, the plurality of running wirings running above the antenna protection element are arranged at the interval larger than the minimum interval of the other wirings, thereby securing the amount of the light to the antenna protection element to allow the antenna protection element to exhibit the performance sufficiently.

The present invention provides a semiconductor device, including: a plurality of cells including an antenna protection element; and a wiring arranged in a layer above the plurality of cells, wherein a direction of the wiring is fixed to one of a longitudinal direction and a lateral direction above the antenna protection element.

In the above invention, the direction of the wiring is fixed to one of the longitudinal direction and the lateral direction above the antenna protection element, thereby securing the amount of the light to the antenna protection element to allow the antenna protection element to exhibit the performance sufficiently.

The present invention provides a semiconductor device, including: a gate; and an antenna protection element connected to the gate, wherein the antenna protection element has active region patterns of which numbers are different between in a p well and in an n well.

In the above invention, there is provided the antenna protection element having the active regions, the numbers of patterns of which are different from each other between in the p well and in the n well. This avoids antenna damage further reliably with further less waste.

The present invention provides a semiconductor device, including: a plurality of cells including a plurality of antenna protection elements, wherein at least two of the plurality of antenna protection elements have different area ratios of a p well to an n well.

In the above invention, the antenna protection elements having different area ratios of the p well to the n well are provided, enabling antenna protection elements having appropriate performances to be provided at parts where antenna damage errors are caused. Hence, antenna damage error is addressed by an antenna protection element having minimally necessary performance, and space of the semiconductor device can be utilized efficiently.

The present invention provides a semiconductor device, including: a gate; an antenna protection element; and a wiring which connects the gate and the antenna protection element, wherein the wiring is connected to a branch wiring extending to an unoccupied region.

In the above invention, the branch wiring extending to the unoccupied region is connected to the wiring connecting the gate and the antenna protection element. It is necessary for avoiding antenna damage error to add a wiring to the antenna protection element, which involves influence on the existing wirings, with a result that re-design would be necessitated. In view of this, when the branch wiring extending to the unoccupied region is connected to the wiring connecting the gate and the antenna protection element, as in the above invention, the influence of the wiring to be added for error avoidance on the existing wirings is suppressed, leading to avoidance of re-design.

The present invention provides a semiconductor device layout designing method, including: a step of arranging a gate and an antenna protection element; a first routing step of routing a first wiring connected to the gate, connecting the gate and the antenna protection element, and routing another wiring in a wiring layer in which the first wiring is formed so as not to cover an active region of the antenna protection element; and a second wiring step of routing, in a wiring layer upper than the wiring layer in which the first wiring is formed, a wiring with it allowed to cover the active region of the antenna protection element.

In the above invention, the wiring is arranged in the wiring layer in which the first wiring connected to the gate is formed so as not to cover the active region of the antenna protection element in the first wiring step. Accordingly, the amount of the light to the antenna protection element can be secured until this wiring layer is formed, leading to sufficient exhibition of the performance of the antennal protection element for protecting the semiconductor device from antenna damage. Further, the wiring is arranged in the wiring layer upper than the wiring layer in which the first wiring is formed so as to allow the active region of the antenna protection element to be covered. This avoids antenna damage and secures wiring resources.

The present invention provides a semiconductor device layout designing method for designing a layout of a semiconductor device including a gate and an antenna protection element connected to the gate, which includes the steps of: performing rough routing in a layer above a cell arrangement including the gate and the antenna protection element; and verifying antenna damage at the gate, wherein in the verifying step, verification is performed on an assumption of performance of the antenna protection element with taking an overlap area between the antenna protection element and a wiring in the layer into consideration.

In the above invention, antenna damage verification at the gate is performed on the assumption of the performance of the antenna protection element with taking an overlapping area between the antenna protection element and the wiring in the upper layer thereof into consideration. Hence, highly accurate antenna damage verification is enabled with taking the amount of the light to the antenna protection element into consideration.

The present invention provides a semiconductor device layout designing method, including the steps of: arranging a plurality of cells including an antenna protection element; routing a wiring in a layer above the plurality of cells; and arranging a dummy pattern in a layer above or below the wiring, wherein in the dummy pattern arranging step, when a running wiring runs above the antenna protection element, the dummy pattern is arranged above the antenna protection element so as to overlap with the running wiring.

In the above invention, the dummy pattern is arranged so as to overlap with the running wiring above the antenna protection element in the dummy pattern arranging step, which prevents the amount of the light to the antenna protection element to be reduced by the dummy pattern. Hence, the antenna protection element can exhibit the performance sufficiently. Further, when a dummy pattern for planarization is arranged, the area ratio can be satisfied easily.

The present invention provides a semiconductor device layout designing method, including the steps of: arranging a plurality of cells including an antenna protection element; and routing wirings in a layer above the plurality of cells, wherein when a wiring having a width larger than a predetermined width runs above the antenna protection element, a position of the antenna protection element is changed to a position on which the wiring having the width larger than the predetermined width does not run.

In the above invention, if a wiring having a width larger than the predetermined width runs above the antenna protection element, the position of the antenna protection element is changed to a position where the wiring having the width larger than the predetermined width does not run. Accordingly, the amount of the light to the antenna protection element can be secured, allowing the antenna protection element to exhibit the performance sufficiently.

The present invention provides a semiconductor device layout designing method, including the steps of: arranging a plurality of cells including antenna protection elements; and routing wirings in a layer above the plurality of cells, wherein in the wiring routing step: a plurality of windows having a predetermined size are virtually set for the plurality of cells; a wiring usage indicating number of wirings that are allowed to run is provided to each of the windows; and the wirings are routed so as not to exceed the wiring usage provided in each of the windows, and the wiring usage of a window including an antenna protection element is set lower than that of a window including no antenna protection element.

In the above invention, the wiring usage of the window including the antenna protection element is set smaller than that of the window including no antenna protection element in the wiring arranging step. Accordingly, the amount of the light to the antenna protection element can be secured, allowing the antenna protection element to exhibit the performance sufficiently. In other words, a wiring addressing antenna damage error, besides conventional problems of wiring congestion, timing convergence, and the like, can be attained.

The present invention provides a semiconductor device layout designing method, including the steps of: arranging a plurality of cells including an antenna protection element; and routing wirings in a layer above the plurality of cells, wherein in the wiring routing step, an interval of wirings running above the antenna protection element is set wider than a minimum interval determined according to a process.

In the above invention, the interval of the wiring running above the antenna protection element is set larger than the minimum interval determined according to the process to secure the amount of the light to the antenna protection element, allowing the antenna protection element to exhibit the performance sufficiently.

The present invention provides a semiconductor device layout designing method, including the steps of: arranging a plurality of cells including an antenna protection element connected to a gate; verifying antenna damage at the gate in an arrangement result by the cell arranging step; computing, from a verification result by the verifying step, an overlap allowable area where a wiring is allowed to overlap with the antenna protection element or an overlap unallowable area where a wiring is not allowed to overlap with the antenna protection element; and setting a routing inhibiting region above the antenna protection element on the basis of the computed overlap allowable area or the computed overlap unallowable area and routing a wiring in a region other than the routing inhibiting region.

In the above invention, the overlap allowable area where the wiring is allowed to overlap with the antenna protection element or the overlap unallowable area where the wiring is not allowed to overlap with the antenna protection element is computed from the result of antenna damage verification, and a routing inhibiting region is set above the antenna protection element on the basis of the overlap allowable area or the overlap unallowable area. Then, the wiring is arranged so as not to be arranged in the routing inhibiting region. Accordingly, the region where the light enters in the antenna protection element is secured, allowing the antenna protection element to exhibit the performance sufficiently.

The present invention provides a semiconductor device layout designing method including the steps of: arranging a plurality of cells including an antenna protection element; and routing a wiring in a layer above the plurality of cells, wherein when a running wiring runs above the antenna protection element, an inside configuration of the antenna protection element is changed according to an overlap area between the antenna protection element and the running wiring.

In the above invention, if there is a running wiring above the antenna protection element, the inside configuration of the antenna protection element is changed according to an area where the antenna protection element overlaps with the running wiring. Thus, the inside configuration of the antenna protection element can be changed so that sufficient light can enter in the active region of the antenna protection element, allowing the antenna protection element to exhibit the performance sufficiently.

The present invention provides a semiconductor device layout designing method, including the steps of: arranging a plurality of cells including antenna protection elements; and replacing, when a plurality of antenna protection elements connected to a same gate are arranged adjacently to each other in an arrangement result by the cell arranging step, the plurality of antenna protection elements by a single antenna protection element.

In the above invention, if a plurality of antenna protection elements connected to the same gate are arranged adjacently to each other, the plurality of antenna protection elements are replaced by a single antenna protection element. In a design method using standard cells (including an antenna protection element), a given space (determined by a design rule) is formed on each side of the cells. When the plurality of adjacent antenna protection elements are replace by a single antenna protection element as in the above invention, the area of the active region increases, enhancing the performance of the antenna protection element.

The present invention provides a semiconductor device layout designing method, including the steps of: arranging a plurality of cells including antenna protection elements; and connecting, when a plurality of antenna protection elements connected to a same gate are arranged adjacently to each other in an arrangement result by the cell arranging step, active regions of the plurality of antenna protection elements in at least one of each p well and each n well.

In the above invention, if a plurality of antenna protection elements connected to the same gate are arranged adjacently to each other, the active regions of the plurality of antenna protection elements are connected to each other in at least one of each p well and each n well. This increases the area of the active regions, enhancing the performance of the antenna protection element.

The present invention provides a semiconductor device layout designing method, including the steps of: arranging a plurality of cells including an antenna protection element; and replacing, when an unoccupied region is present next to the antenna protection element in an arrangement result by the cell arranging step, the antenna protection element by an antenna protection element having an area that fills the unoccupied region.

In the above invention, the antenna protection element adjacent to the unoccupied region is replace by an antenna protection element having an area that fills the unoccupied region. This increases the area of the active region, enhancing the performance of the antenna protection element.

The present invention provides a semiconductor device layout designing method, including the steps of: arranging a plurality of cells including antenna protection elements connected to gates; verifying antenna damage at the gates in an arrangement result by the cell arranging step; and modifying, when a plurality of antenna protection element adjacent to each other are connected to different gates, a connection relationship between active regions of the plurality of antenna protection elements on the basis of safety margins from antenna damage of the gates connected to the plurality of antenna protection elements.

In the above invention, the connection of the active regions of the plurality of antenna protection elements arranged adjacently to each other and connected to different gates are modified on the basis of the safety margin from antenna damage at each connected gate. This enables processing, such as increasing the area of the active region connected to a gate having no or less safety margin from antenna damage without necessitating an additional antenna protection element. Hence, antenna damage can be avoided further reliably.

The present invention provides a semiconductor device layout designing method, including the steps of: arranging a plurality of cells including an antenna protection element connected to a gate; verifying antenna damage at the gate in an arrangement result by the cell arranging step; and dividing, when the gate has a safety margin from antenna damage, an active region of the antenna protection element and reconnecting one of the divided active regions to another gate.

In the above invention, the active region of the antenna protection element connected to a gate having a safety margin from antenna damage is divided, and either of the divided active regions is reconnected to another gate. This enables processing, such as increasing the area of the active region connected to a gate having no or less safety margin from antenna damage without necessitating an additional antenna protection element. Hence, antenna damage can be avoided further reliably.

The present invention provides a semiconductor device layout designing method, including the steps of: arranging gates and a plurality of cells including antenna protection elements connected to the gates; cutting connection between the gates and the antenna protection elements in an arrangement result by the cell arranging step; and reconnecting the gates and the antenna protection elements, wherein in the reconnecting step: a central point of a gate arrangement region is determined, and selection of a gate closer to the central point, and connection of an antenna protection element closest to the selected gate to the selected gate are repeated.

In the above invention, in reconnecting the antenna protection elements to the gates, processing of selecting a gate closer to the central point of the region where the gate is to be arranged and connecting the closest antenna protection element to the selected gate is repeated. This achieves connection of each gate to the corresponding closest antenna protection element to eliminate the need of a longer wiring in connecting the antenna protection elements to the gates, increasing the wiring efficiency.

The present invention provides a semiconductor device layout designing method, including the steps of: arranging gates and a plurality of cells including antenna protection elements connected to the gates; routing a wiring in a layer above the plurality of cells; cutting, when the wiring routing step results in that a running wiring runs above an antenna protection element at a rate equal to or larger than a predetermined rate, connection between the gates and the antenna protection elements in an arrangement result by the cell arranging step; and replacing the antenna protection element above which the running wiring runs at a rate equal to or larger than the predetermined rate by a cell other than an antenna protection element and reconnecting the gates to the antenna protection elements.

In the above invention, the antenna protection element above which a running wiring run at a rate equal to or larger than the predetermined rate is replaced by a cell other than an antenna protection element. This means replacement of the antenna protection element which secures an insufficient light amount by another cell, such as a capacitance cell, a buffer, or the like, enabling efficient space utilization of the semiconductor device.

The present invention provides a semiconductor device layout designing method, including the steps of: arranging gates and a plurality of cells including antenna protection elements connected to the gates; routing a wiring in a layer above the plurality of cells; additionally arranging, when the wiring routing step results in that a running wiring runs above a first antenna protection element at a rate equal to or larger than a predetermined rate, a second antenna protection element within a predetermined distance range from a gate connected to the first antenna protection element; cutting connection between the gate and the first antenna protection element and connecting the second antenna protection element to the gate; and replacing the first antenna protection element by a cell other than an antenna protection element.

In the above invention, if there is the first antenna protection element above which running wirings run at a rate equal to or larger than the predetermined rate, the second antenna protection element additionally provided in place of the first antenna protection element within the predetermined distance region is connected to the gate connected to the first antenna protection element. Further, the first antenna protection element is replaced by a cell other than an antenna protection element. In other words, the antenna protection element which secures an insufficient light amount is replace by another cell, such as a capacitance cell, a buffer, or the like, and hence, the space of the semiconductor device can be utilized efficiently.

The present invention provides a semiconductor device layout designing method, including the steps of: arranging a gate and a plurality of cells including an antenna protection element connected to the gate; routing a wiring in a layer above the plurality of cells; and routing, when the wiring routing step results in that a wiring which has a wiring length larger than a predetermined length connects the antenna protection element to the gate, a branch wiring connected to the wiring and extending to an unoccupied region.

In the above invention, if there is a wiring having a wiring length larger than the predetermined length and connecting the antenna protection element and the gate, the branch wiring connected to the wiring and extending to the unoccupied region is routed. It is necessary for avoiding antenna damage error to add a wiring to the antenna protection element, which involves influence on the existing wirings, with a result that re-design would be necessitated. In view of this, when the branch wiring extending to the unoccupied region is routed to the wiring that connects the gate and the antenna protection element, as in the above invention, the influence of the wiring to be added for error avoidance on the existing wirings is suppressed, leading to avoidance of re-design.

As described above, according to the present invention, a semiconductor device which avoids antenna damage, secures wiring efficiency, and achieves planarization within a chip can be attained with ease.

BRIEF DESCRIPTION OF THE DRAWINGS

FIG. 4 is a layout in which a wiring is routed in a cell region.

FIG. 21 is a diagram showing adjacent antenna protection elements.

FIG. 40 is a diagram showing the case where the active region of an antenna protection element is divided in a semiconductor layout.

FIG. 52 is a diagram showing the case where branch wirings are routed so as to agree with the positions of connection pins included in a prepared antenna protection element in FIG. 49.

DESCRIPTION OF THE PREFERRED EMBODIMENTS

Embodiment 1

Figure 1:
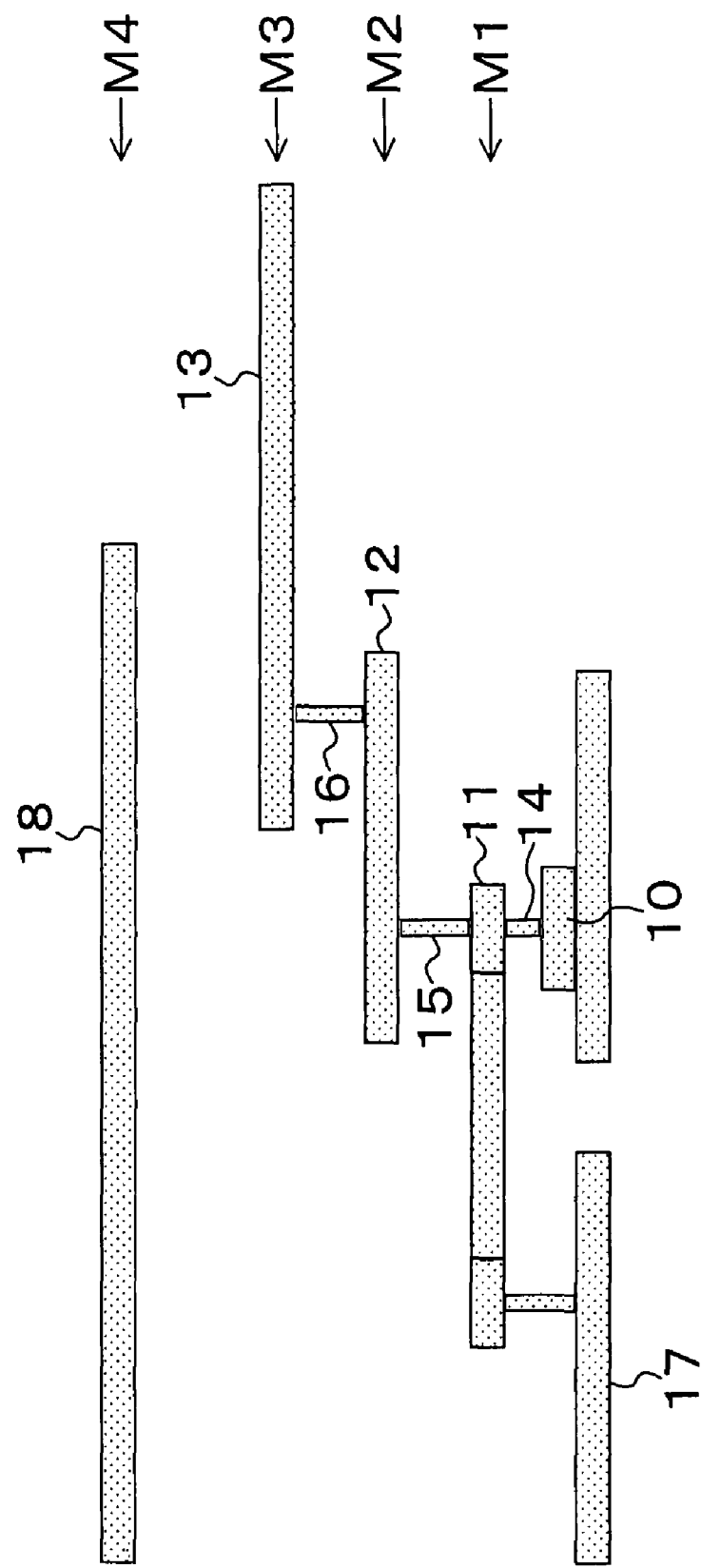
FIG. 1 is a sectional view showing a configuration of a semiconductor device according to Embodiment 1 of the present invention.

FIG. 1 is a sectional view showing a configuration of a semiconductor device according to Embodiment 1 of the present invention. In FIG. 1, reference numeral 10 denotes a gate, 11 denotes a wiring in a metal wiring layer M1, 12 denotes a wiring in a metal wiring layer M2, 13 denotes a wiring in a metal wiring layer M3, 14 denotes a contact which connects the gate 10 and the wiring 11, 15 denotes a first via which connects the wiring 11 and the wiring 12, 16 denotes a second via which connects the wiring 12 and the wiring 13, and 17 denotes an antenna protection element (a diffusion region). The antenna protection element 17 is connected electrically to the gate 10 by means of the wiring 11 in the metal wiring layer M1.

The wirings 11, 12, 13 form a first wiring connected to the gate 10. In a metal wiring layer M4 above the first wiring, a wiring 18 as a second wiring is formed.

Figure 2:
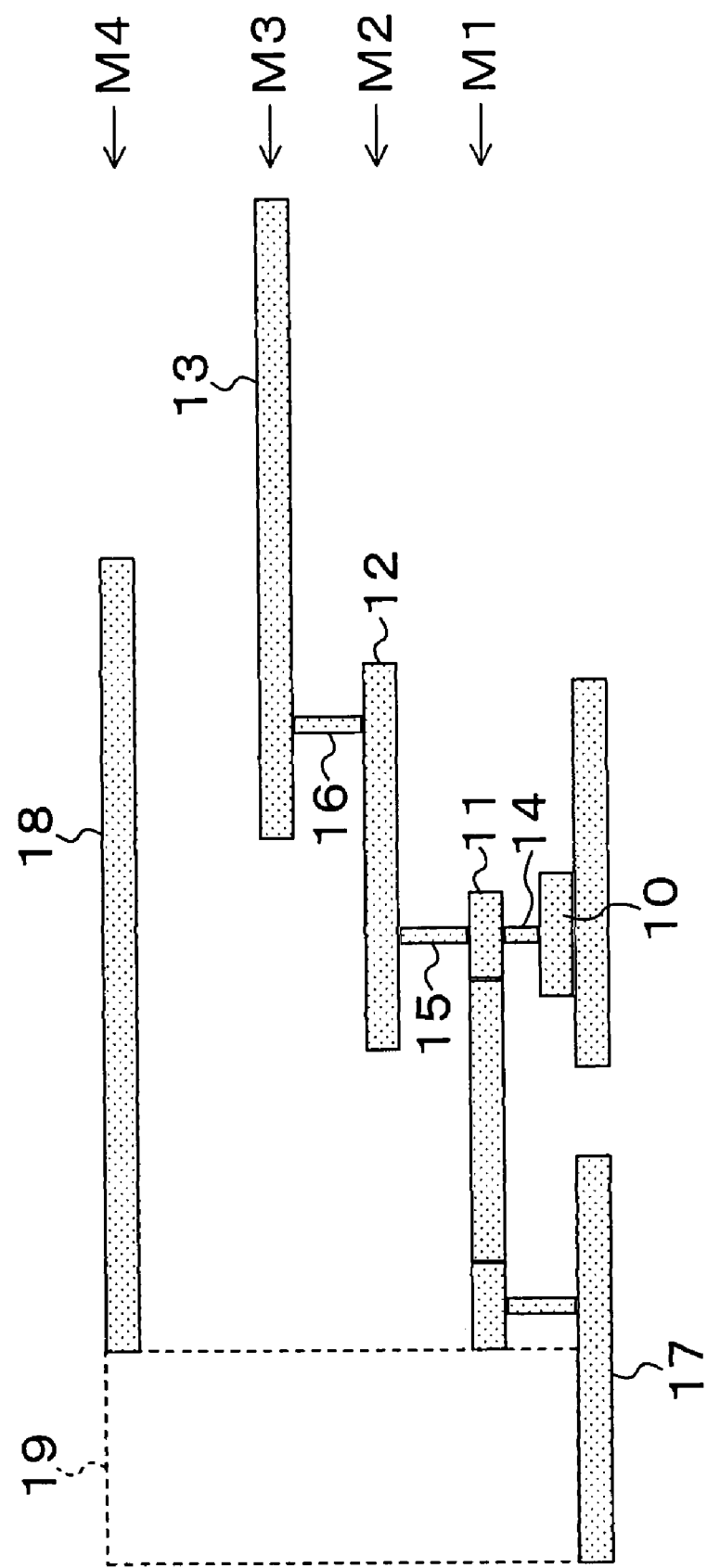
FIG. 2 is a sectional view showing a configuration of a conventional semiconductor device.

FIG. 2 is a sectional view showing a configuration of a conventional semiconductor device, wherein the same reference numerals are assigned to constitutional elements common to those in FIG. 1. As shown in FIG. 2, the conventional concept is that no pattern must be arranged in a space 19 over the antenna protection element 17 in all the layers.

As a matter of fact, the wirings connected to the gate 10 extend up to the metal wiring layer M3, and accordingly, damage to the gate 10 may be caused until the metal wiring layer M3 is formed. No antenna damage to the gate 10 is caused when the metal wiring layer M4 is formed. In other words, the UV light should be irradiated to the antenna protection element 17 up to the stage of forming the metal wiring layers M1 to M3. In forming the metal wiring layer M4, as shown in FIG. 1, the amount of antenna damage to the gate 10 is not changed even if the wiring 18 is routed on the active region of the antenna protection element 17. Namely, no problem is involved even if the metal wiring layer M4 is formed freely.

Accordingly, in the present invention, the number of layers connected to a gate connected to an antenna protection element is taken into consideration, and wirings formed in the layers are not routed on the antenna protection element while a wiring in a layer above the wiring layers is allowed to overlap with the antenna protection element. In other words, in the configuration shown in FIG. 1, the wirings 11, 12, 13 connected to the gate 10 and formed in the wiring layers M1 to M3 are routed so as not to cover the active region of the antenna protection element 17. Further, the wiring 18 provided in the wiring layer M4 above the layers is formed so as to cover at least a part of the active region of the antenna protection element 17.

The layout design according to the present embodiment is performed in the following manner. The gate 10 and the antenna protection element 17 are arranged first. Then, the wirings 11, 12, 13 connected to the gate 10 are routed, the gate 10 and the antenna protection element 17 are connected to each other, and the other wirings are routed in the respective wiring layers M1, M2, M3 in which the respective wirings 11, 12, 13 are formed so as not to cover the active region of the antenna protection element 17. Thereafter, wirings including the wiring 18 are routed in the wiring layer M4 above the wiring layers M1, M2, M3 with it allowed to cover the active region of the antenna protection element 17.

By avoiding the wiring pattern overlapping with the antenna protection element, the amount of the light to the antenna protection element is secured to allow the antenna protection element to exhibit its performance sufficiently. Wherein, when wirings are routed so as not to cover the antenna protection element in all the wiring layers, the wirings may be hardly converged (wiring resources may be degraded). For this reason, wiring in a wiring layer upper than the uppermost layer of the wiring layers connected to the antenna protection element is allowed to overlap with the antenna protection element. This avoids antenna damage and secures wiring resources. For example, in the case where a six-layer design product is composed of an antenna protection element connected to a gate and wirings connected to both of them in three layers, no problem is involved even when a wiring is formed on the antenna protection element in the fourth layer and the layers thereon.

Figure 3:
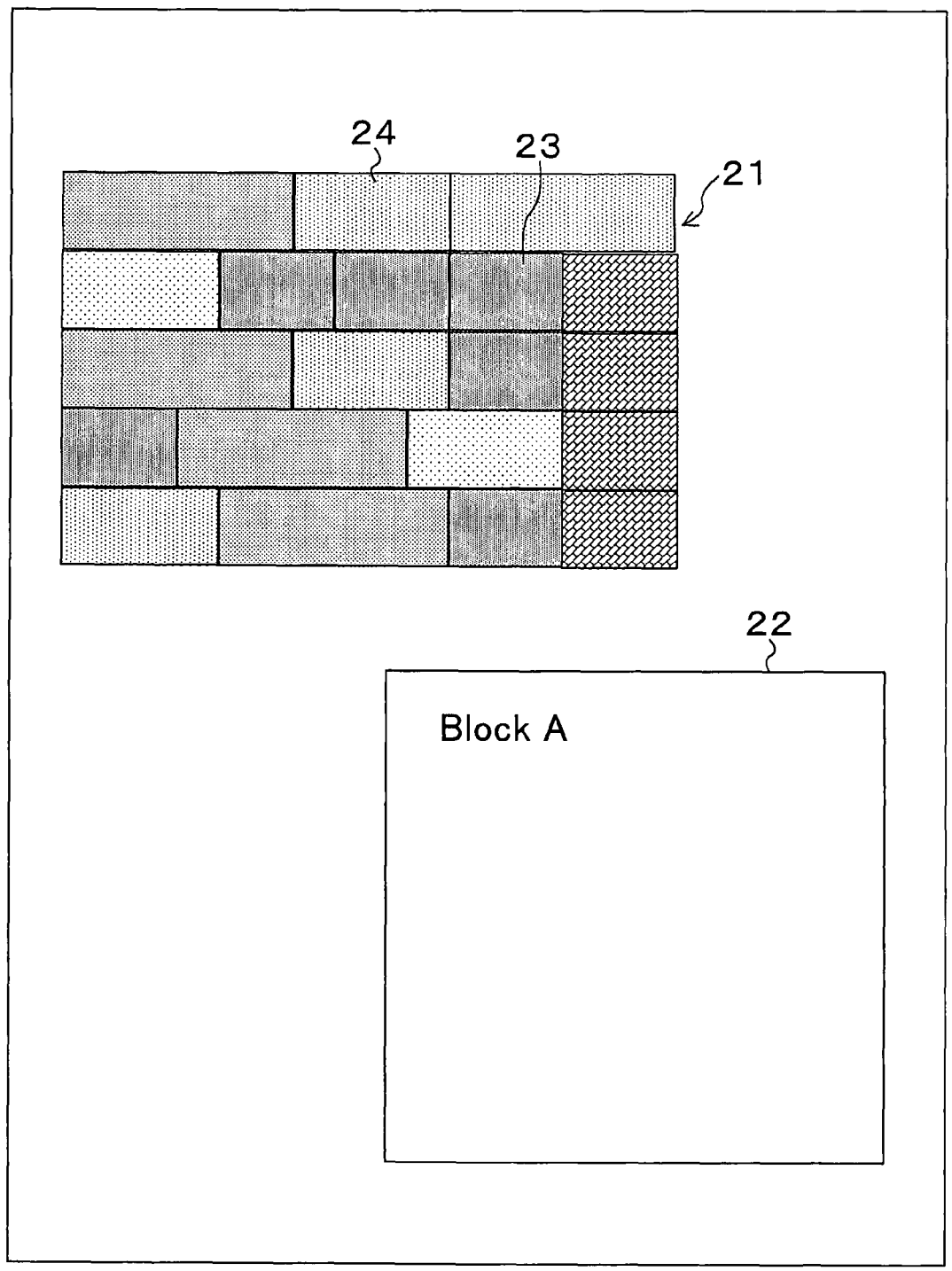
FIG. 3 presents one example of a layout of a semiconductor integrated circuit including an antenna protection element.

FIG. 3 shows one example of a layout of a semiconductor device including an antenna protection element. In general, semiconductor layouts are composed of a combination of a standard cell region 21 and a block region 22 of a SRAM, a DRAM or the like. An antenna protection element 23 is inserted between cells 24 in the standard cell region 21. Cells having the same pattern as the cell indicated at reference numeral 23 are antenna protection elements, and cells having the other patterns are cells other than an antenna protection element (the same is applied to the drawings below).

FIG. 4 shows a layout in which wirings are arranged in the standard cell region 21. As shown in FIG. 4, in order to minimize the chip area, signal wirings 25, 26 and source wirings 27, 28 in a mesh-like form have to be routed above the antennal protection element 23 in general semiconductor layouts in many cases. For this reason, the mount of the light to the active region of the antenna protection element reduces to lower the performance of the antenna protection element.

Under present circumstances, antenna damage at gates is verified by applying a uniform value of power to antenna protection elements. In other words, the performance of the antenna protection elements is not changed according to a corresponding overlap area between the antenna protection element and the wiring in the layer thereabove.

Figure 5A:
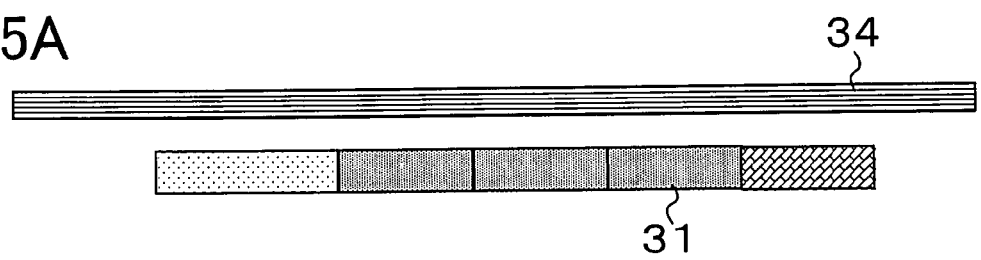
FIG. 5 is a sectional view showing an example of a relationship between an antenna protection element and a wiring thereabove.
Figure 5B:
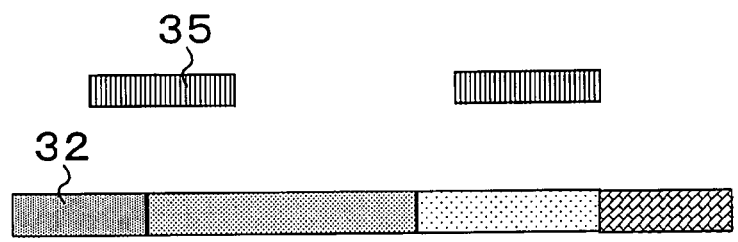
Figure 5C:
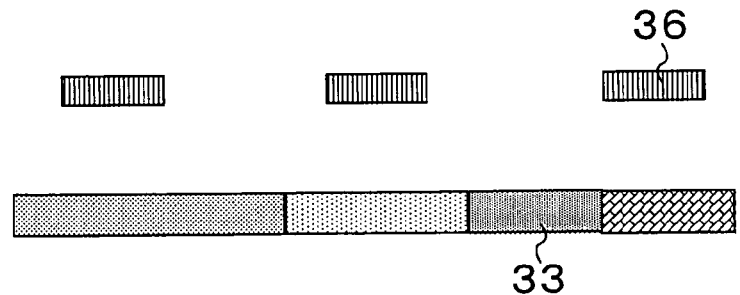

FIG. 5 is a sectional view showing an example of the relationship between an antenna protection element and a wiring in the layer thereabove. Wherein, FIG. 5A shows a state in which an antenna protection element 31 overlaps with a wiring 34 completely, FIG. 5B shows a state in which a half of an antenna protection element 32 overlaps with a wiring 35, and FIG. 5C shows a state in which an antenna protection element 33 does not overlap with a wiring 36. Under present circumstances, verification is performed on every antenna protection element on the assumption of the state shown in FIG. 5C. As a mater of fact, however, a signal wiring, a source wiring, and the like are usually routed in the layer above the antenna protection element. Therefore, verification on the assumption that the antenna protection element does not overlap with the wirings causes yield lowering because the performance of the antenna protection element at actual manufacture reduces when compared with that at verification.

Referring to verification on the assumption of the state shown in FIG. 5A in which all antennal protection elements overlap with the wiring completely, it is verified that the performances of the antenna protection elements 32, 33, which have sufficiently high performances actually, are low in the respective states shown in FIG. 5B and FIG. 5C. Accordingly, an additional antenna protection element may be inserted, which serves as a factor of inhibiting insertion of a necessary logic cell.

In view of this, in the present embodiment, verification is performed on the assumption of the performance of the antenna protection element with taking an overlap area between the antenna protection element and the wiring in the layer thereabove into consideration in the step of verifying antenna damage to a gate. Prior to the verification, wirings are routed roughly in the layer above the cell layout including the gate and the antenna protection element. The rough routing may be mere estimation of the number of wirings running on the antenna protection element.

When the amount of the light to the active region of the antenna protection element is reduced, the performance of the antenna protection element lowers. The current antenna damage verification, however, takes no account of the relationship between the light amount and the antenna protection element, and therefore, product failure by antenna damage is caused actually in some cases even if the product is accepted in the antenna damage verification. When antenna damage verification is performed appropriately on the assumption of the performance of the antenna protection element with taking an overlap area between the antenna protection element and the wiring in the layer thereabove into consideration, failure by antenna damage in manufacture can be obviated.

An overlap allowable area where the wiring is allowed to overlap with the antenna protection element or an overlap unallowable area where the wiring is not allowed to overlap with the antenna protection element may be computed from the result of antenna damage verification. Further, a dummy pattern may be arranged on the antenna protection element on the basis of the computed overlap allowable or unallowable area.

Figure 6:
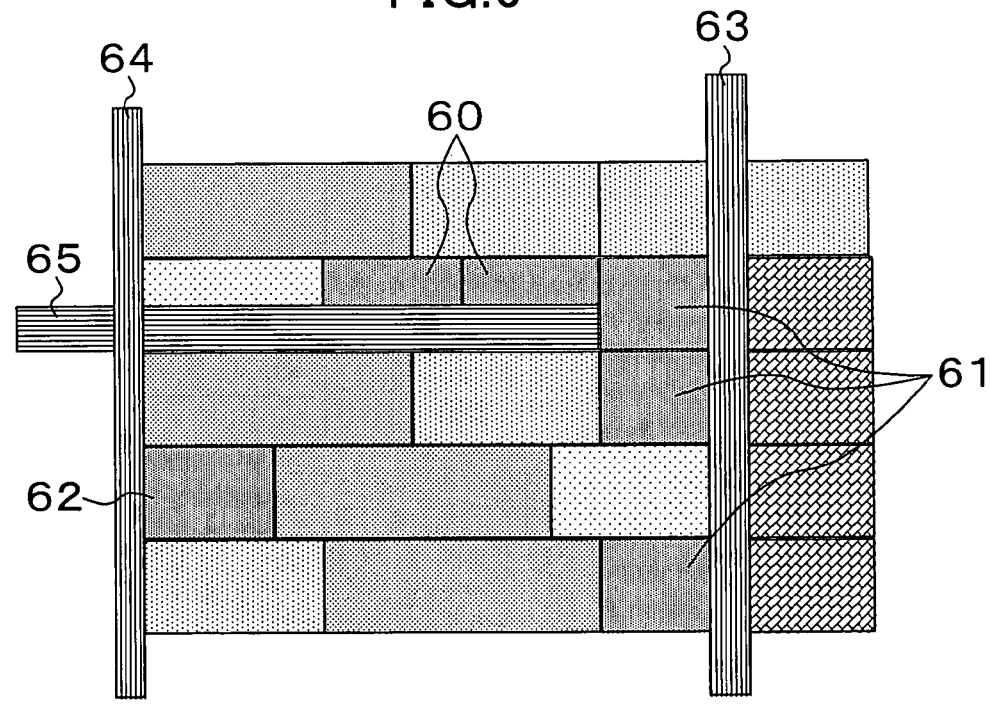
FIG. 6 presents an example of a layout after routing is completed in a semiconductor integrated circuit.

FIG. 6 shows an example of a layout after routing is completed in a semiconductor device. In FIG. 6, a half of an antenna protection element 60 overlaps with a wiring 65, one fourth of an antenna protection element 61 overlaps with a wiring 63, and one tenth of an antenna protection element 62 overlaps with a wiring 64. If antenna damage verification finds that a half of each antenna protection element 60, 61, 62 may overlap with wiring, further overlap with wiring is unallowable for the antenna protection element 60 while further one fourth and further four tenth of the antenna protection elements 61, 62, respectively, may overlap with a wiring in the layer thereabove. From the information about such overlap allowable areas, it is found that a dummy pattern can be arranged on each of the antenna protection elements 61, 62. Hence, a dummy pattern for planarization can be inserted with securing sufficient unoccupied regions above the antenna protection elements for avoiding antenna error.

In other words, some antenna protection element has an antenna safety margin while some antenna protection element has no antenna safety margin, and a wiring pattern may be arranged on the antenna protection element having an antenna safety margin. This increases the degree of freedom of the layout. The antenna safety margin herein means a value obtained by subtracting a conduction amount necessary for antenna error avoidance from a conduction amount when the UV light is irradiated to an active region of an antenna protection element.

Figure 7:
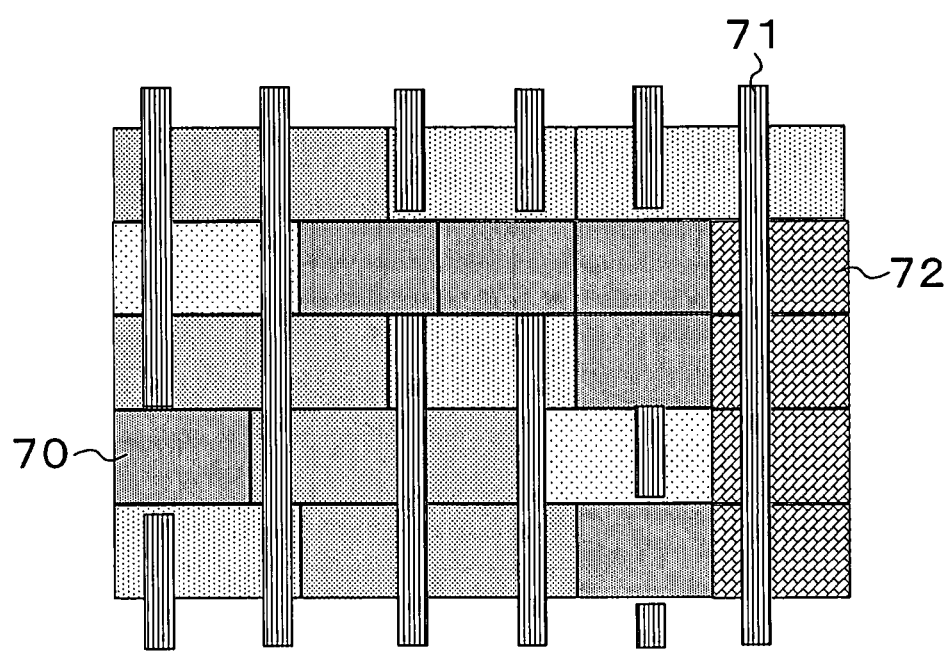
FIG. 7 presents an example of a layout of a semiconductor integrated circuit in which a dummy pattern is arranged.

Description will be given with reference to FIG. 7 and FIG. 8 to a method for avoiding antenna damage and securing planarization by changing a layout rule of a dummy pattern on an antenna protection element. In FIG. 7, reference numeral 70 denotes an antenna protection element, 71 denotes a dummy pattern, and 72 denotes a cell other than an antenna protection element.

Usually, the dummy patterns 71 having a width determined according to the process condition are arranged uniformly at regular intervals, as shown in FIG. 7. Further, in the conventional technology, no dummy pattern is arranged, and an unoccupied region is formed above each antenna protection element 70 instead. Accordingly, in a region where many antenna protection elements 70 are arranged collectively, an area of the unoccupied regions thereabove increases remarkably, involving adverse influence on planarization. In view of this, an area of a dummy pattern which is allowed to overlap with an antenna protection element is computed, and the dummy pattern is arranged in accordance with the computed area.

Figure 8:
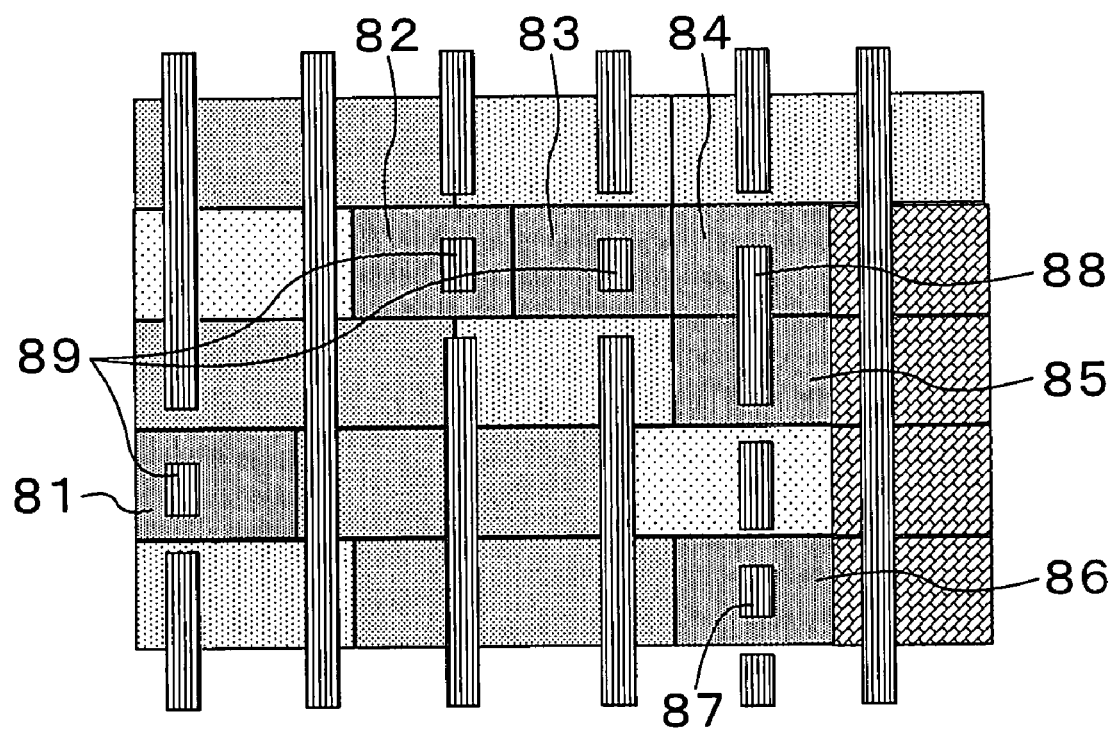
FIG. 8 presents an example of a layout of a semiconductor integrated circuit in which a dummy pattern is arranged according to Embodiment 1 of the present invention.

FIG. 8 shows an embodiment. Suppose herein that a half of each antenna protection element 81, 82, 83, 84 and one tenth of each antenna protection element 85, 86 may overlap with a dummy pattern. Dummy patterns 87, 88, 89 are arranged on the antenna protection elements 81 to 86 so as to overlap therewith up to the respective overlap allowable areas. Specifically, for the dummy patterns arranged in the layer above a plurality of cells including the antenna protection elements 81 to 86, a layout rule above the antenna protection elements 81 to 86 is different from a layout rule above the cells other than the antenna protection elements 81 to 86. Wherein, the layout rule herein means a length, a space, a width, and the like of a dummy pattern.

When the amount of the light to the active region of an antenna protection element is reduced, the performance of the antenna protection element lowers. For tackling this problem, dummy patterns are arranged on antenna protection elements in accordance with a layout rule different from that on the other region so that the amount of the light to the active region of the antenna protection elements can be secured as far as possible. This achieves both securing of the amount of the light to the active region of the antenna protection elements and planarization.

Layout modification is performed only at the stage when the area ratio cannot be achieved by the above processing. This increases accuracy of planarization to the maximum with antenna damage avoided.

A source wiring and/or a signal wiring would be routed on an antenna protection element. In this case, a dummy pattern may be arranged in the following manner.

Figure 9A:
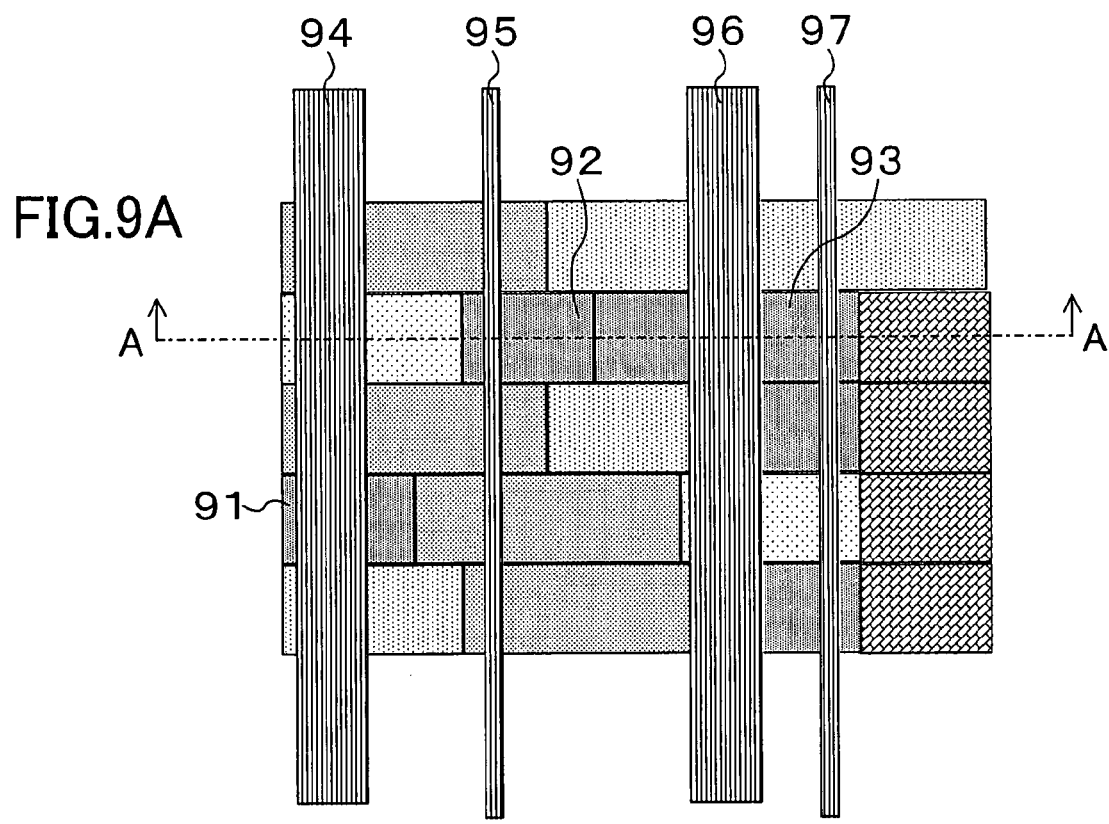
FIG. 9 is a diagram showing a layout of a semiconductor device in which a wiring is routed in a layer above an antenna protection element.
Figure 9B:
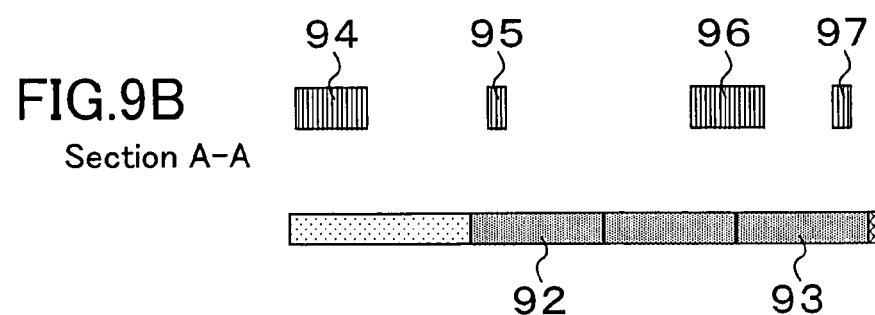

FIG. 9 shows a layout of a semiconductor device in which wirings are arranged in a layer above antenna protection elements, wherein FIG. 9A is a plan view and FIG. 9B is a sectional view taken along the line A-A in FIG. 9A. In FIG. 9, a plurality of cells including antenna protection elements 91, 92, 93 are arranged, and wirings are routed in a metal wiring layer above the plurality of cells. For example, a source wiring 94, a signal wiring 95, and a source wiring 96 and a signal wiring 97 are routed above the antenna protection element 91, the antenna protection element 92, and the antenna protection element 93, respectively. The source wirings herein includes a shielding wiring as a wiring of which potential is fixed for removing noise influence on a clock.

Figure 10A:
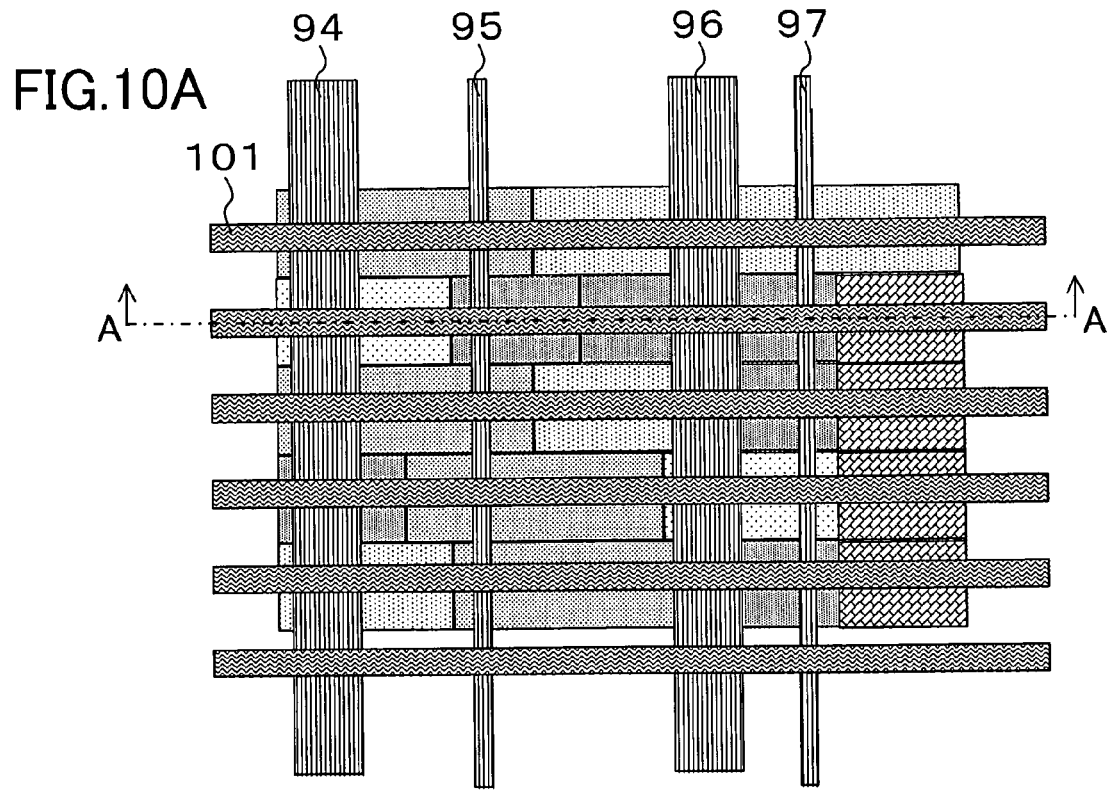
FIG. 10 is a diagram showing the case where dummy patterns are arranged uniformly in the layout of FIG. 9.
Figure 10B:
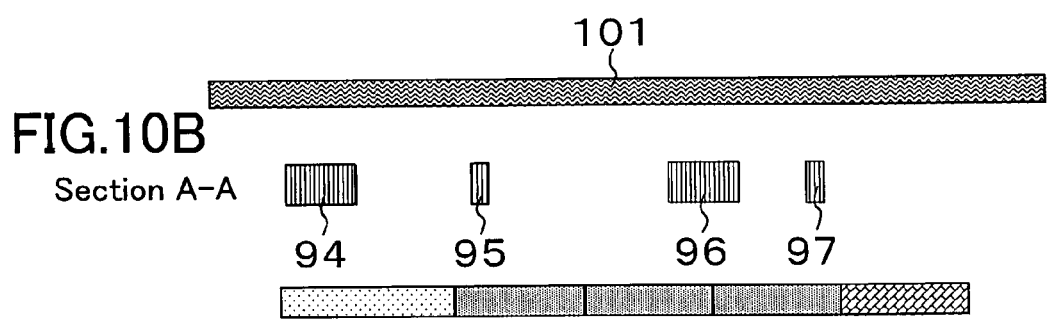
Figure 11A:
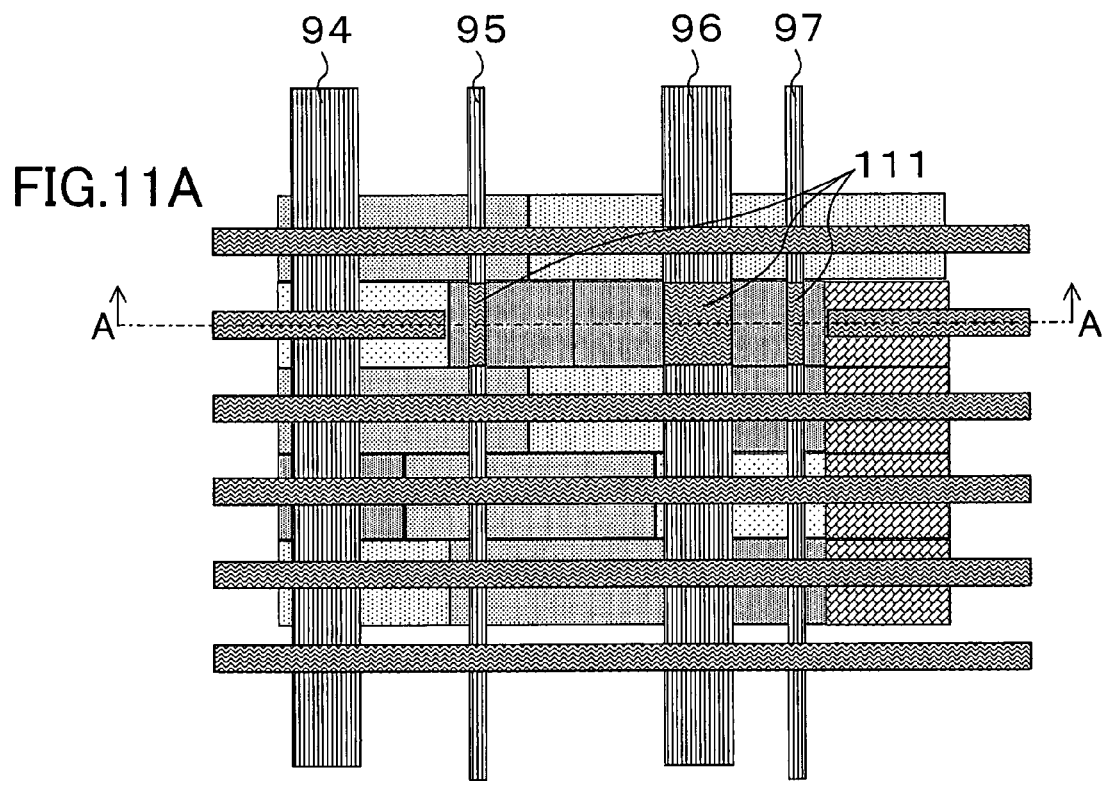
FIG. 11 is a diagram showing the case where dummy patterns are arranged by a method according to Embodiment 1 of the present invention in the layout of FIG. 9.
Figure 11B:
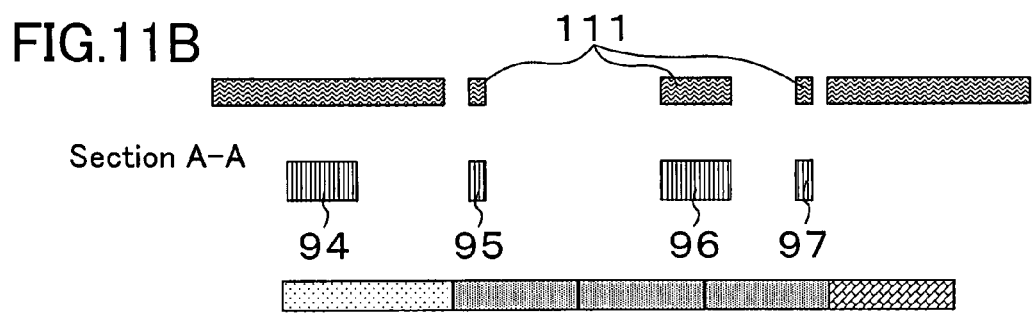

FIG. 10 shows the case where dummy patterns 101 are arranged uniformly in a metal wiring layer above the wiring layer in which the wirings 94 to 97 are routed in the layout of FIG. 9. In FIG. 10, in which the dummy patterns 101 are arranged above the antenna protection elements, the performances of the antenna protection elements lower. In view of this, the dummy patterns 101 arranged above the antenna protection elements are re-arranged (dummy patterns 111) so as to overlap with the source wiring 96 and the signal wirings 95, 97, as shown in FIG. 11. This increases the amount of the UV light irradiated to the antenna protection elements when compared with the case shown in FIG. 10, enhancing the performances of the antenna protection elements. In re-arrangement, the dummy patterns to be arranged so as to overlap with the source wiring or the signal wirings are desirable to be deformed by, for example, changing the width or the length thereof with taking the area ratio into consideration.

Specifically, the layout of FIG. 11 attains a semiconductor device in which the dummy patterns 111 overlap with the source wiring 96 and the signal wirings 95, 97 as running wirings on the antenna protection element. This leads to no reduction in the amount of the light to the antenna protection elements, allowing the antenna protection elements to exhibit the performances sufficiently and achieving a given area ratio. It is noted that the dummy patterns herein are arranged in a layer above the running wirings, but may be arranged in a layer below the running wirings.

Further, an area ratio in the wiring layer in which the dummy pattern is formed may be computed from the result of the dummy pattern layout. When the thus computed area ratio is smaller than a predetermined value, a dummy pattern is arranged on the antenna protection element on the basis of the above descried overlap allowable or unallowable area.

When dummy patterns are arranged so as to overlap with the signal wirings 95, 97, timing error would be caused at the signal wirings 95, 97. In the case where timing error is caused, the dummy pattern is not changed in shape or may be deleted.

Figure 12A:
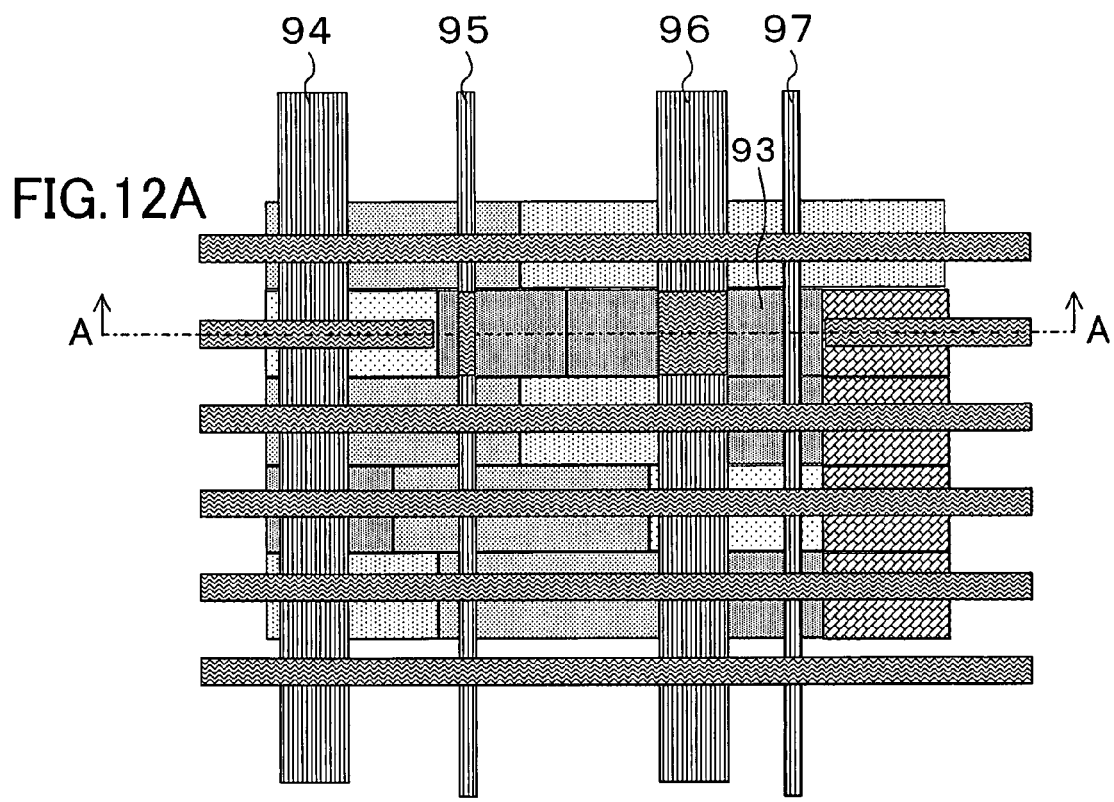
FIG. 12 is a diagram showing the case where a dummy pattern is deleted from the layout of FIG. 11 according to a timing margin.
Figure 12B:
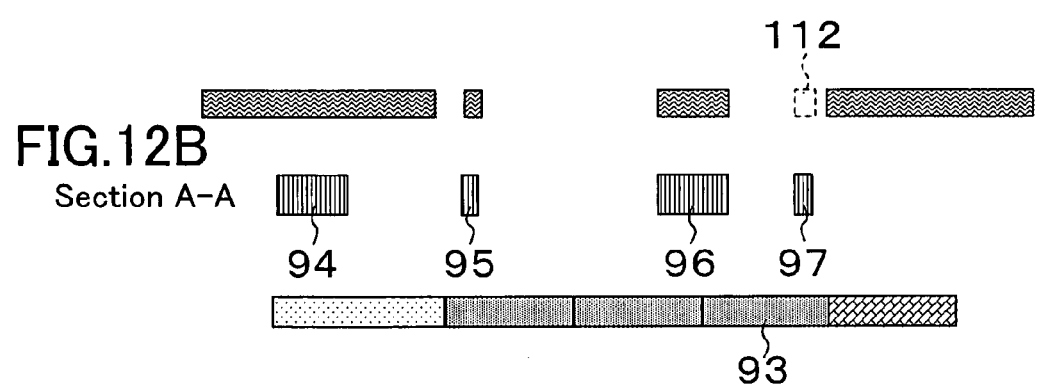

Further, both the source wiring 96 and the signal wiring 97 may run on the antenna protection element 93 in some cases, as shown in FIG. 9. In this case, a dummy pattern of the source wiring 96 is rearranged with priority for reducing the capacity increased by dummy pattern arrangement, and then, the dummy pattern of the signal wiring 97 is rearranged as well if there is a sufficient timing margin. With no sufficient timing margin, the dummy pattern may be deleted within the extent to which no adverse influence on planarization is involved. For example, in the case where timing error is caused when a dummy pattern 112 is arranged so as to overlap with the signal wiring 97, as shown in FIG. 12, the dummy pattern 112 is deleted.

In other words, if running wirings running on an antenna protection element include both a source wiring and a signal wiring, the following processing is performed. Namely, a dummy pattern is arranged so as to overlap with only a source wiring first, and an area ratio in the wiring layer in which the dummy pattern is arranged is computed from the arrangement result. When the computed area ratio is smaller than the predetermined value, judgment is performed as to whether or not timing error is caused when the dummy pattern is arranged so as to overlap also with a signal wiring. When it is judged that no timing error is caused, the dummy pattern is arranged so as to overlap also with the signal wiring. On the other hand, when it is judged that timing error is caused, the dummy pattern is arranged so as not to overlap with the signal wiring.

When the area ratio is smaller than the predetermined value even when the dummy pattern is arranged so as to overlap also with the signal wiring, the dummy pattern is arranged in another wiring region on the active region of the antenna protection element with taking the overlap allowable or unallowable area into consideration. Even this cannot achieve the area ratio yet, layout modification is performed in the end. The above processing eliminates the need for extra design modification.

Embodiment 2

Figure 13A:
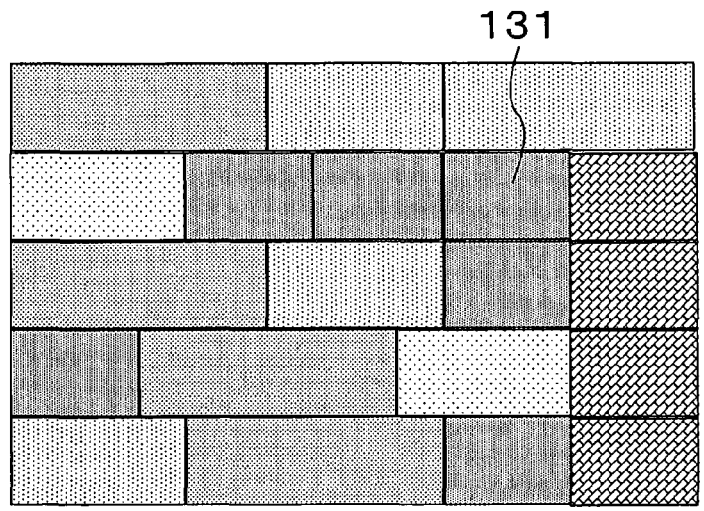
FIG. 13 presents a layout of a semiconductor integrated circuit for explaining Embodiment 2 of the present invention.
Figure 13B:
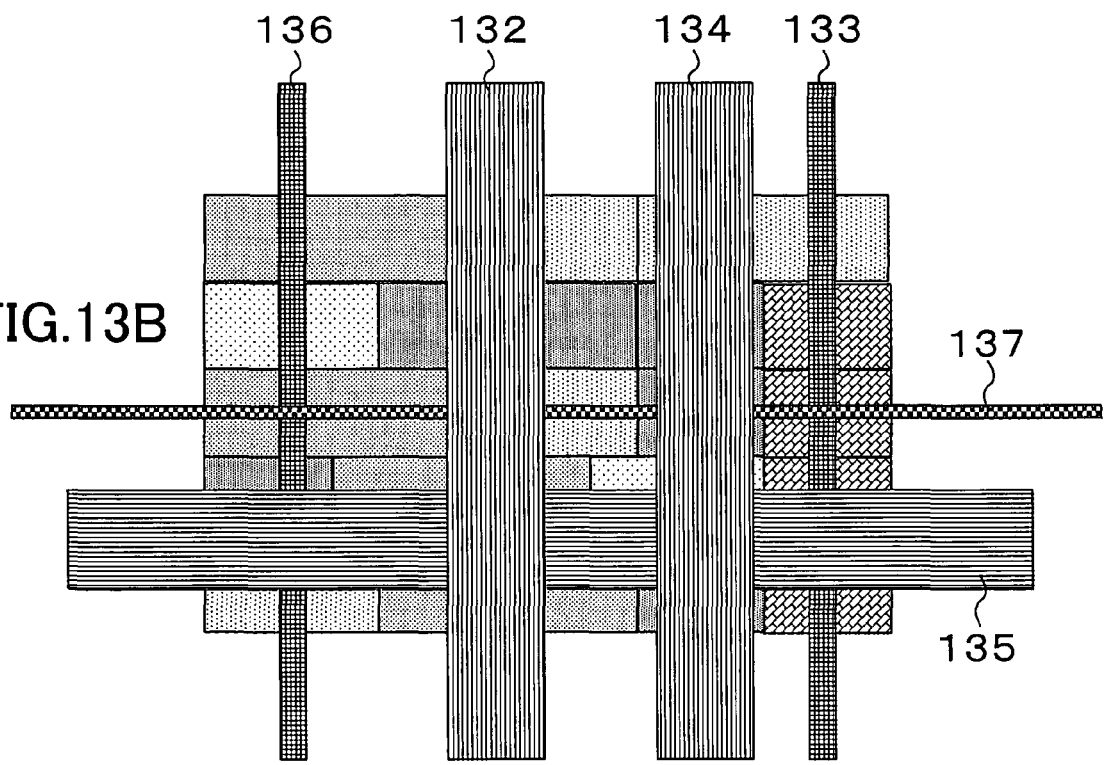

FIG. 13 shows a general layout of a semiconductor device. In FIG. 13, a plurality of cells including antenna protection elements 131 are arranged, and source wirings 132, 134, 135 and signal wirings 133, 136, 137 are routed in layers above the cells. In general, as shown in FIG. 13, source wirings and signal wirings are formed in layers above antenna protection elements in many cases. For example, the source wiring 134 is formed in the layer above the antenna protection element 131. This reduces the amount of the UV light irradiated to the active region, lowering the performance of the antenna protection element.

In Embodiment 1, an area where wirings and dummy patterns can be arranged is estimated through antenna damage verification on the assumption of the performance of the antenna protection element from an overlap area between the antenna protection element and a wiring thereabove after completion of routing.

In some layouts, however, error would be caused in antenna damage verification after completion of routing. For example, when an antenna protection element is arranged in a region congested with wirings, the amount of the UV light irradiated to the antenna protection element reduces considerably to lower the performance of the antenna protection element, causing error in antenna damage verification. In this case, it is necessary to provide an additional antenna protection element or to re-rout the wiring, which takes time for design modification.

Figure 14A:
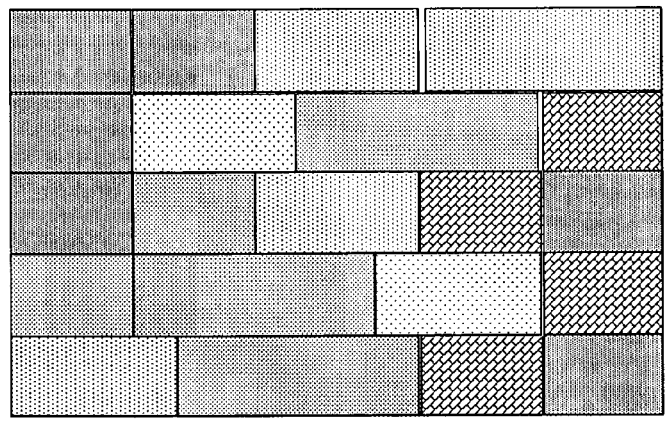
FIG. 14 presents a layout of a semiconductor integrated circuit according to Embodiment 2 of the present invention.
Figure 14B:
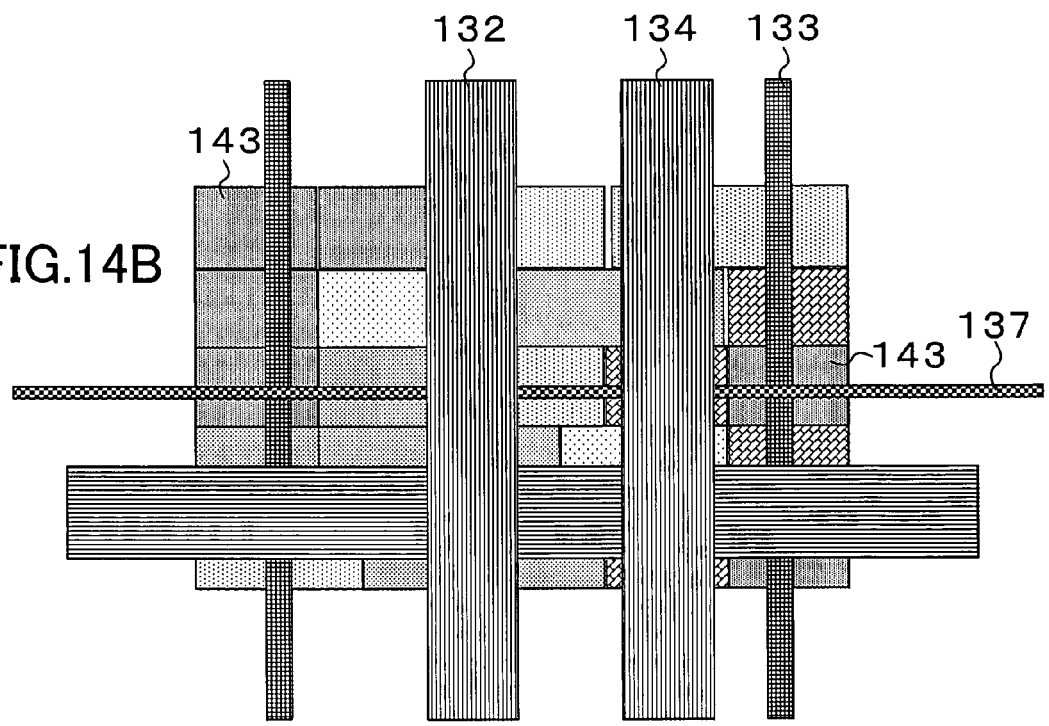

In view of this, in the present embodiment, an antenna protection element 143 is arranged under a narrow wiring, such as signal wirings 133, 137 rather than under a wiring having a width larger than a predetermined width, such as source wirings 132, 134, as sown in FIG. 14, to increase an amount of the UV light irradiated to the antenna protection element. For example, when arrangement of a plurality of cells including an antenna protection element and a plurality of wirings in a layer above the plurality of cells results in that a wiring having a width larger than the predetermined width, such as a source wiring runs above the antenna protection element, the position of the antenna protection element is changed to a position where no wiring having a width larger than the predetermined width runs. This avoids reduction in amount of the UV light irradiated to the antenna protection element.

Figure 15A:
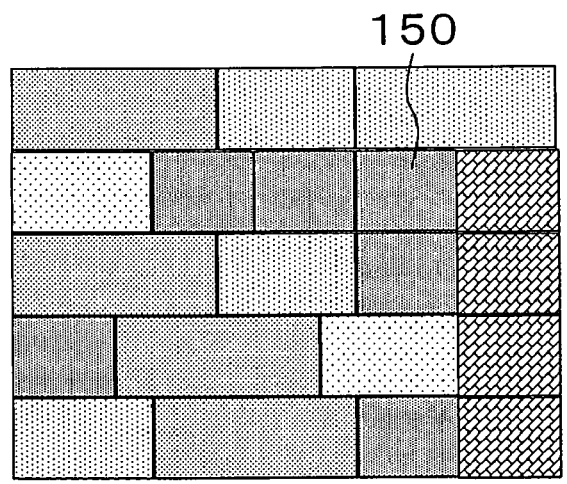
FIG. 15 is a diagram showing change in shape of a wiring above an antenna protection element according to Embodiment 2 of the present invention.
Figure 15B:
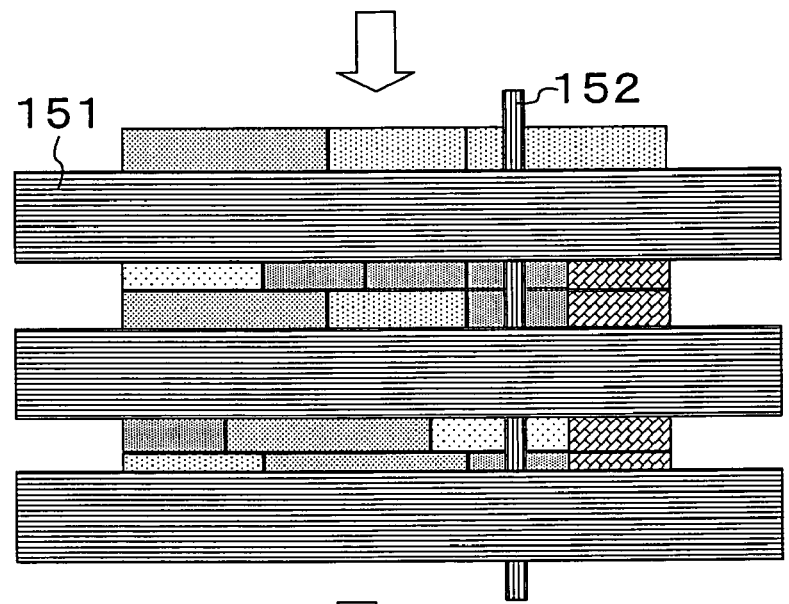
Figure 15C:
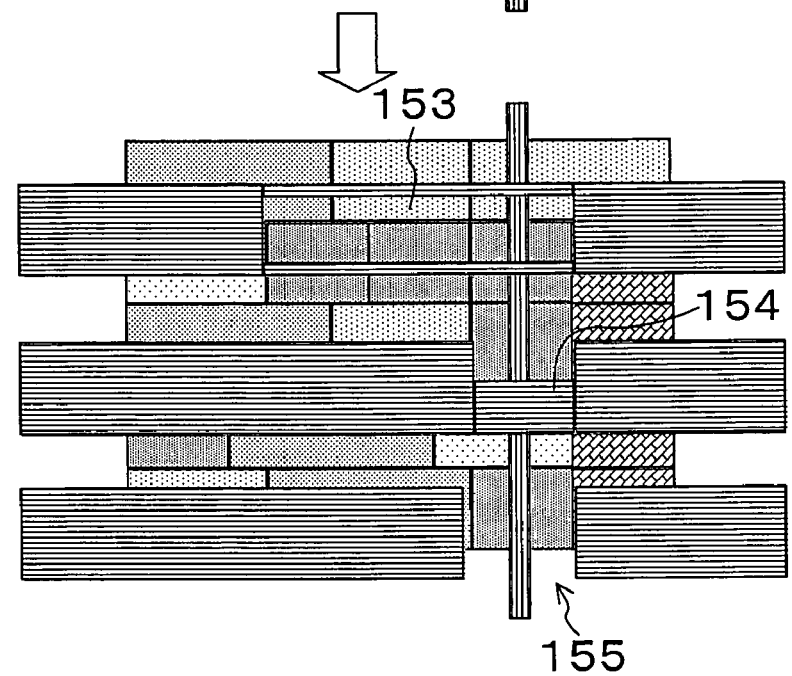

Alternatively, in the case where a wiring having a width larger than the predetermined width, such as a source wiring 151 is arranged unavoidably as a running wiring in a layer above an antenna protection element 150, as shown in FIG. 15, the shape of the wiring may be changed within a limit that meets the design rule. For example, if there is sufficient residual strength against voltage drop (IR-Drop), a slit 153 is formed in the source wiring 151 above the antenna protection element 150 or the width of the source wiring 151 is reduced (154). When further residual strength against voltage drop is left, a part of a wiring source 155 above an antenna protection element is deleted to increase the area of the antenna protection element for receiving the UV light. As a result, the safety margin from antenna damage increases, thereby remarkably lowering a possibility of causing error in antenna damage verification after completion of routing.

In short, a running wiring running above an antenna protection element is set to have a shape having a part above the antenna protection region of which area per unit length is smaller than that of the other part. This increases the amount of the UV light irradiated to the antenna protection element with a necessary wiring pattern, such as a source wiring and the like secured.

Deletion of a wiring pattern on an antenna protection element may form a wiring region which cannot achieve the area ratio. In this case, when a dummy pattern is arranged by the method described in Embodiment 1, a planarized chip can be attained.

Figure 16:
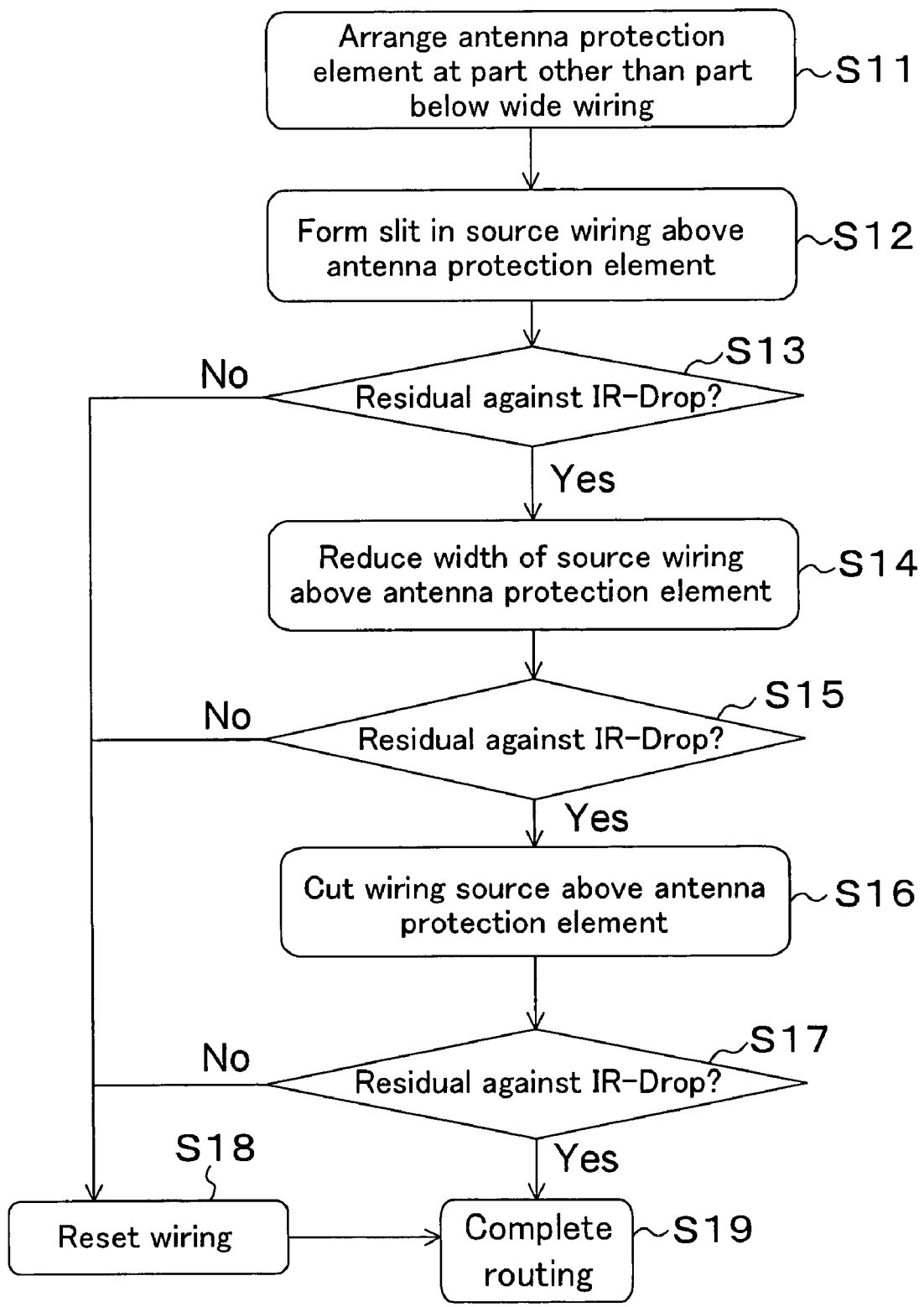
FIG. 16 is a flowchart depicting one example of processing according to Embodiment 2 of the present invention.

FIG. 16 is a flowchart depicting one example of the processing according to the present embodiment. First, an antenna protection element is arranged at a part in which no wiring having a width larger than the predetermined width is routed (S11). If a source wiring is located above the antenna protection element, a slit is formed in the source wiring (S12). If residual strength against voltage drop is left (Yes in S13), the width of the source wiring is reduced (S14). If residual strength against voltage drop is still left (Yes in S15), the source wiring is cut (S16). If residual strength against voltage drop is left yet (Yes in S17), the routing is terminated (S19). Otherwise, namely, when no residual strength against voltage drop is left (No in S12, S15, or S17), the wiring is reset (S18) and the routing is terminated (S19).

Embodiment 3

In Embodiment 2, the amount of the UV light irradiated to the antenna protection element is increased by changing the shape of a wiring pattern above an antenna protection element, for example, by deleting a part of the wiring which is located above the antenna protection element. As to a signal wiring above the antenna protection element, however, change in shape and cutting are difficult in view of the timing and the logic. Further, when an antenna protection element is arranged in a region congested with signal wirings, the area of the antenna protection element to which the UV light is irradiated reduces to lower the performance of the antenna protection element.

In the present embodiment, the UV light irradiated to the antenna protection element is secured by limiting in advance an amount of wirings running above an antenna protection element.

Figure 17:
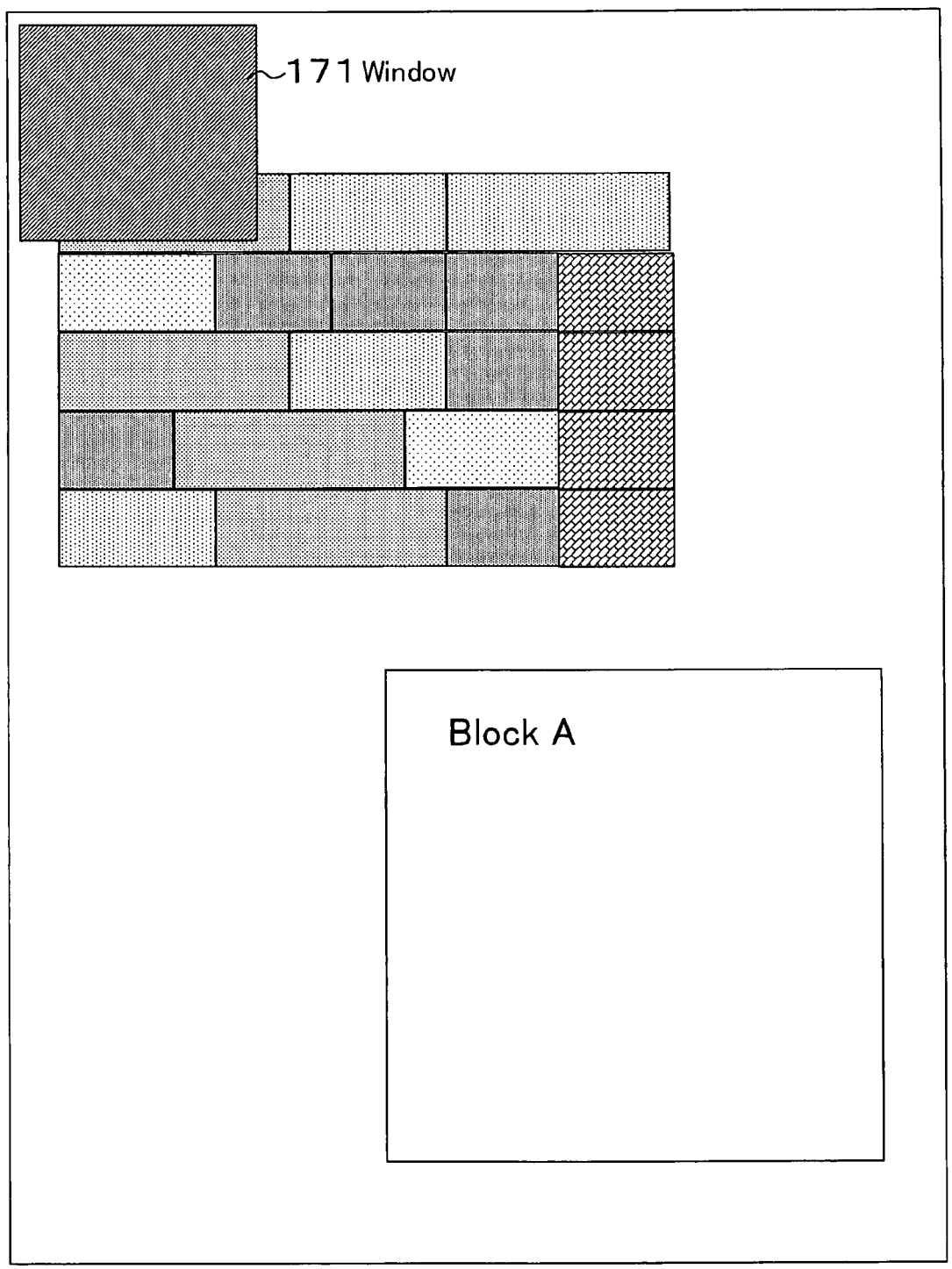
FIG. 17 presents a layout of a semiconductor integrated circuit for explaining Embodiment 3 of the present invention.

FIG. 17 shows a layout of a semiconductor device. FIG. 17 indicates a virtually set window 171 in the same layout as that of FIG. 3. For automatic layout, in general, wiring design is performed in such a manner that a plurality of windows having a predetermined size are set virtually on a semiconductor integrated circuit and a wiring usage indicating the number of wirings capable of being routed is given to each of the windows. In doing so, when a wiring usage is set low in a region which might be congested with wirings, wiring congestion is relieved.

In the present embodiment, a window including an antenna protection element is set to have a wiring usage lower than the other window including no antenna protection element.

Figure 18:
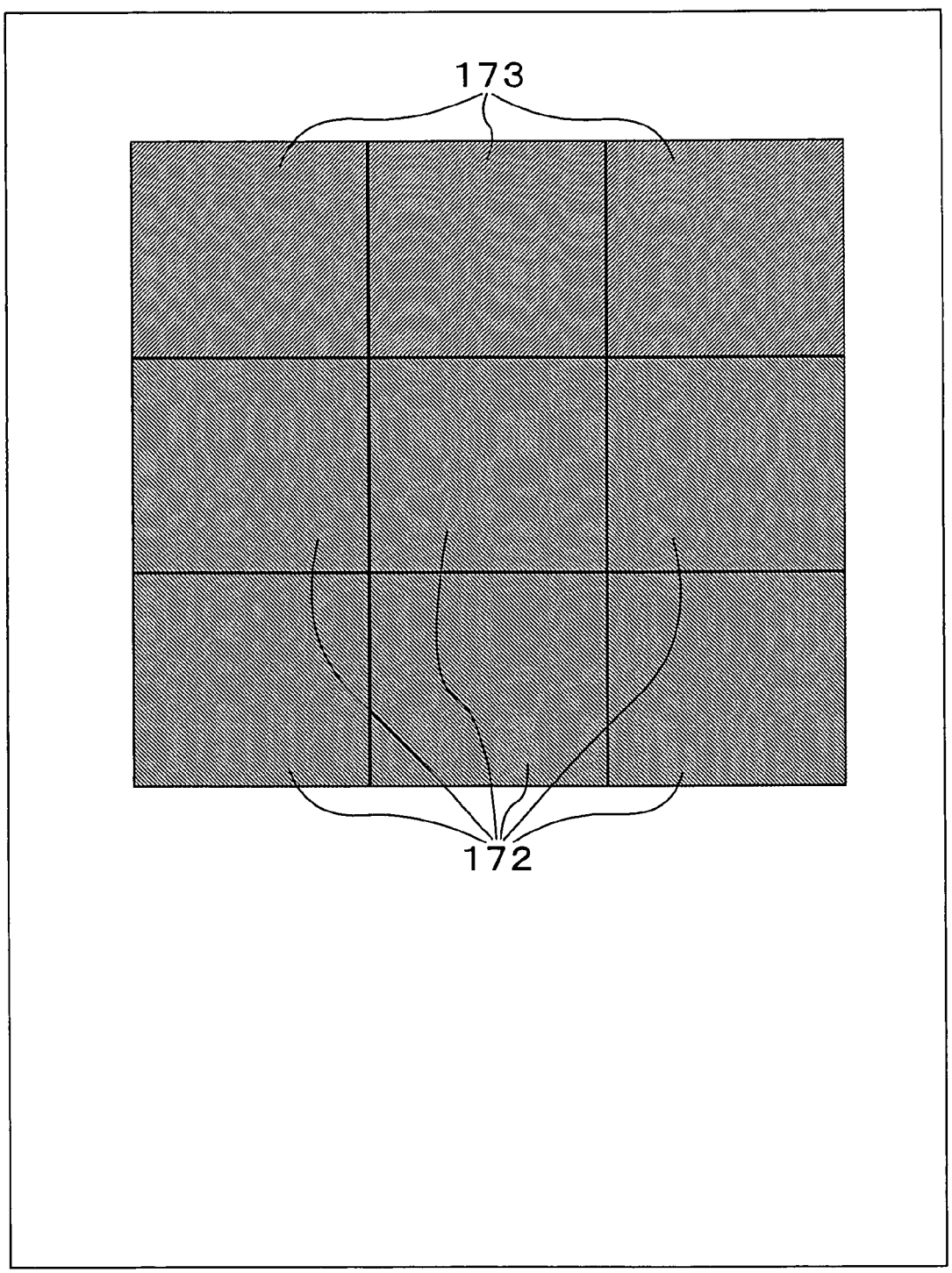
FIG. 18 is a schematic diagram showing windows set in a logic region in FIG. 17.
Figure 19:
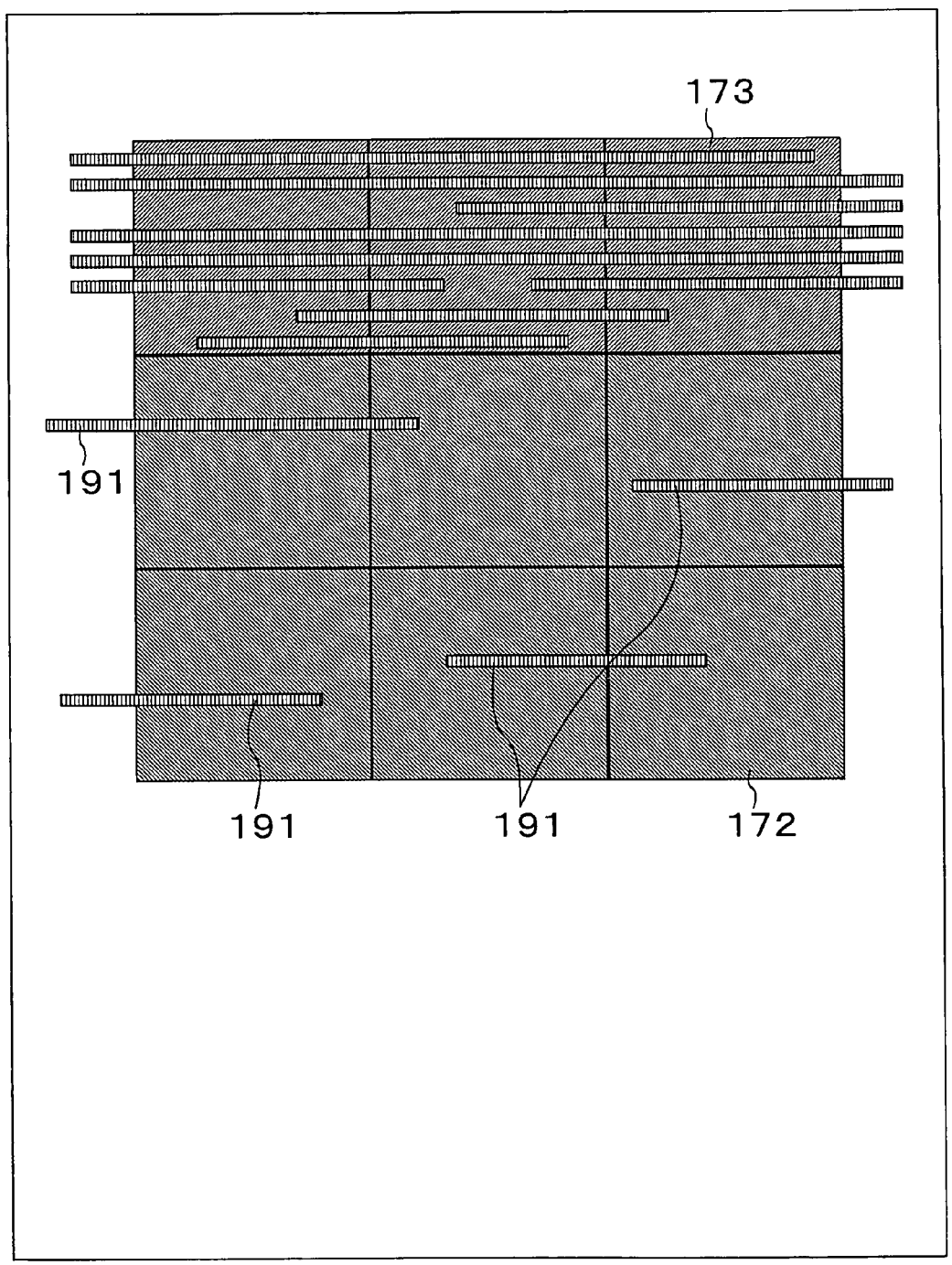
FIG. 19 is a diagram showing a wiring routed on the windows in FIG. 18.

FIG. 18 is a schematic diagram showing windows set in a logic region in which a plurality of cells including an antenna protection element are arranged. In FIG. 18, each window 172 includes an antenna protection element while each window 173 includes no antenna protection element. Suppose that 10% wiring usage is given to the windows 172 while 80% wiring usage is given to the windows 173. If the number of wirings capable of running in each window 173 is 10 when the wiring usage is 100%, one wiring and eight wirings can be routed at the maximum in each window 172 and each window 173, respectively. As a result, in each window 172, namely, in a layer above the antenna protection element, wirings 191 is routed sparsely, as shown in FIG. 19, thereby securing a sufficient amount of the UV light irradiated to the antenna protection element to secure the performance of the antenna protection element.

The wiring usage is set to 10% for each window 172 herein, wherein this value may be determined by a strength value, which is based on an overlap area between the active region of an antenna protection element and a wiring and is determined according to the process, and an area of the active region of the antenna protection element included in each window 172. Various determination methods are possible according to accuracy of wiring estimation. For example, in the case where the criterion of antenna damage is very strict due to the characteristic of the process and the performances of the antenna protection elements are desired to be enhanced uniformly, the wiring usage of each window 172 is set low. When further increased accuracy is desired, the wiring usage is determined according to the area of the active region of the antenna protection element included in each window 172. If still further increased accuracy is desired, the wiring usage is computed according to the area of the active region of the antenna protection element included in each window 172 and residual strength against antenna damage at a gate to be connected to the antenna protection element.

Figure 20:
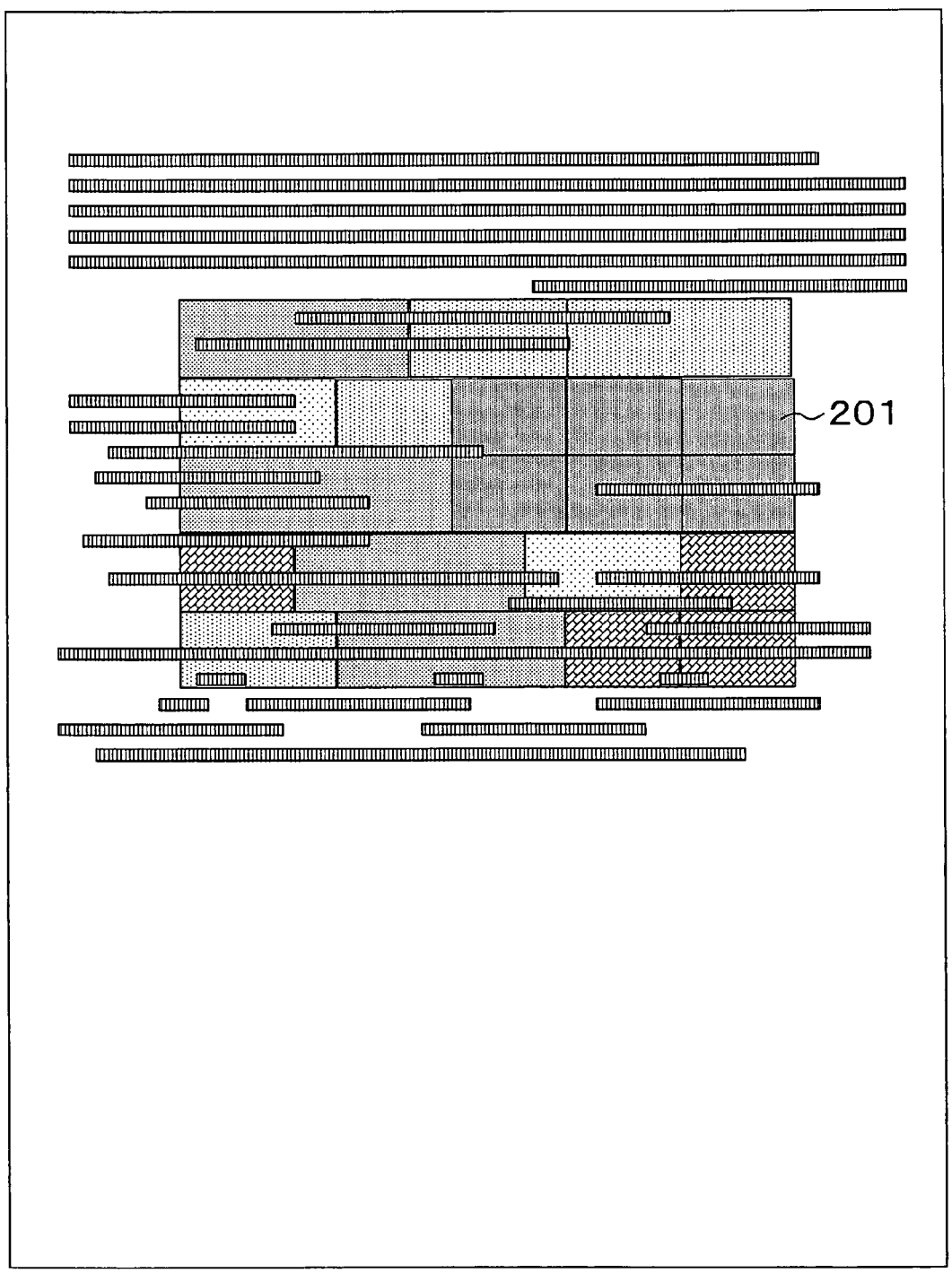
FIG. 20 is a diagram showing an arrangement where antenna protection elements are arranged collectively and wirings therefor according to Embodiment 3 of the present invention.

In the case where the antenna protection elements are distributed as shown in FIG. 17, a low wiring usage above the antenna protection elements provides wiring limitations on all over the chip, thereby hardly achieving full completion of the routing. In view of this, as shown in FIG. 20, antenna protection elements 201 are arranged collectively and only the wiring usage of a region above the antenna protection elements 201 is lowered, thereby increasing the wiring efficiency as a whole.

When the wiring usage above an antenna protection element is set low in advance, an amount of the UV light irradiated to the antenna protection element can be secured sufficiently, avoiding error in antenna damage verification after completion of routing.

Wherein, in arranging antenna protection elements collectively, antenna protection elements within a range of distance determined according to the process are collected. For example, in the case where antenna protection elements are arranged upper left and lower right in a chip, when the lower right antenna protection element is rearranged at an upper left part, a gate must be connected to the rearranged upper left antenna protection element for avoiding antenna error caused at the lower right of the chip. This extends the wiring to make wiring efficiency worse remarkably. Therefore, it is preferable to collect only antenna protection elements within a range of distance determined according to the process.

Specifically, for example, a plurality of cells including antenna protection elements are once arranged, and then, antenna protection elements within a predetermined distance range are rearranged collectively. This secures the amount of the light to the antenna protection elements without inviting lowering of wiring efficiency.

Instead of rearrangement of antenna protection elements within a predetermined distance range, the antenna protection elements may be grouped in advance for arranging the antenna protection elements group by group. This eliminates the need for layout change by rearrangement, increasing wiring efficiency.

Figure 22A:
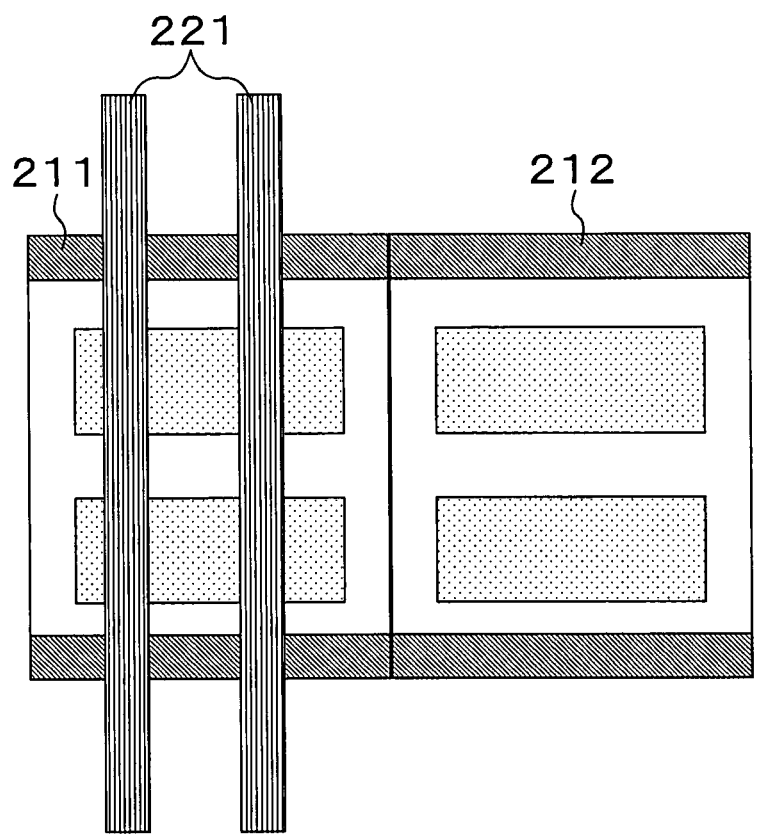
FIG. 22 is a diagram showing a wiring routed above the adjacent antenna protection elements in FIG. 21.

Further, in the present embodiment, wiring spacing on the active region of an antenna protection element is set wider than a minimum interval determined according to the process within a limit where routing is allowed. FIG. 21 shows antenna protection elements arranged adjacently to each other. In FIG. 21, the number of wirings which can be routed on each antenna protection element 211, 212 is set to two in the stage of estimation. In this case, when routing is performed actually, two wirings 221 may be routed in only the antenna protection element 211, as shown in FIG. 22A. This lowers the performance of the antenna protection element 211.

Figure 22B:
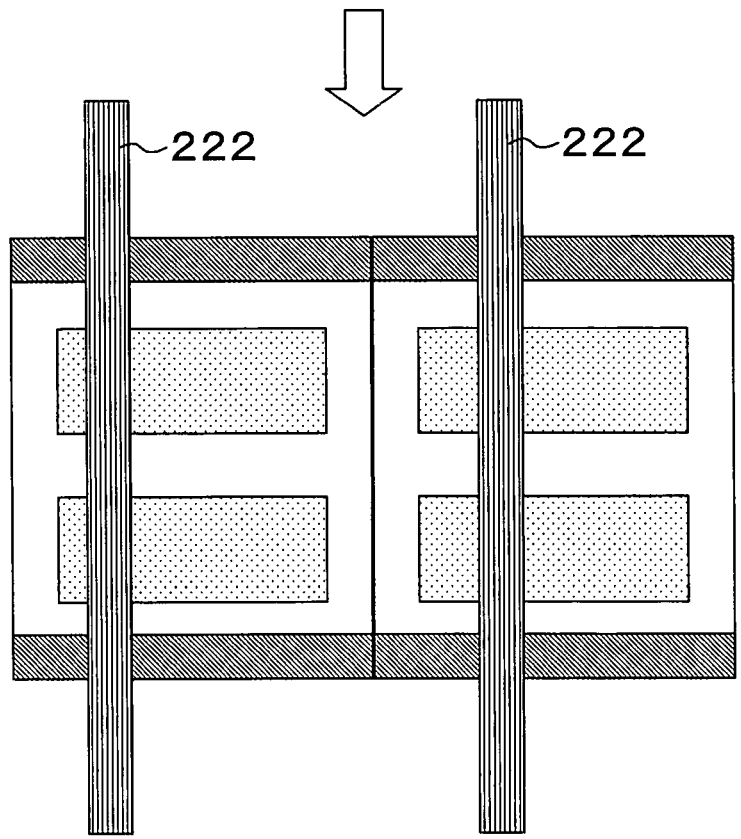

In view of this, the interval between the wirings running on an antenna protection element is set wider than the minimum interval determined according to the process. This increases the interval between the wirings running on the antenna protection element, so that the respective wirings 222 are arranged as running wirings on the respective antenna protection elements 211, 212, as shown in FIG. 22B. Accordingly, remarkable lowering of the performance of the antenna protection elements is prevented. In this case, a plurality of running wirings running on the antenna protection elements are arranged at intervals wider than the minimum interval of the other wirings in a manufactured semiconductor device.

Figure 23:
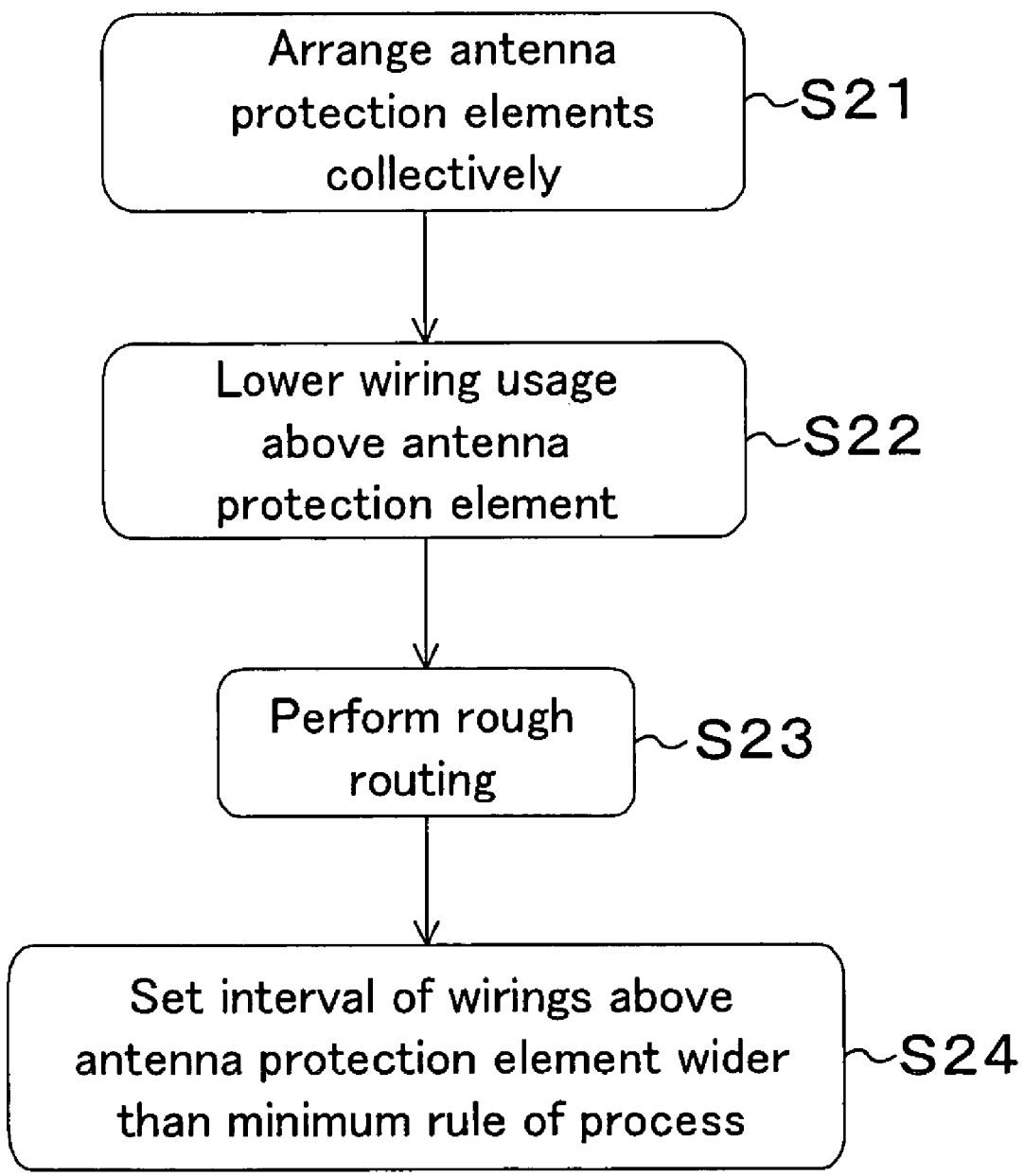
FIG. 23 is a flowchart depicting one example of processing according to Embodiment 3 of the present invention.

FIG. 23 is a flowchart depicting one example of the processing according to the present embodiment. Antenna protection elements are arranged collectively first (S21). Then, the wiring usage on the antenna protection elements is lowered (S22). Thereafter, rough routing is performed (S23), and the interval of the wirings on the antenna protection elements is set wider than the minimum rule of the process (S24).

Embodiment 4

Figure 24A:
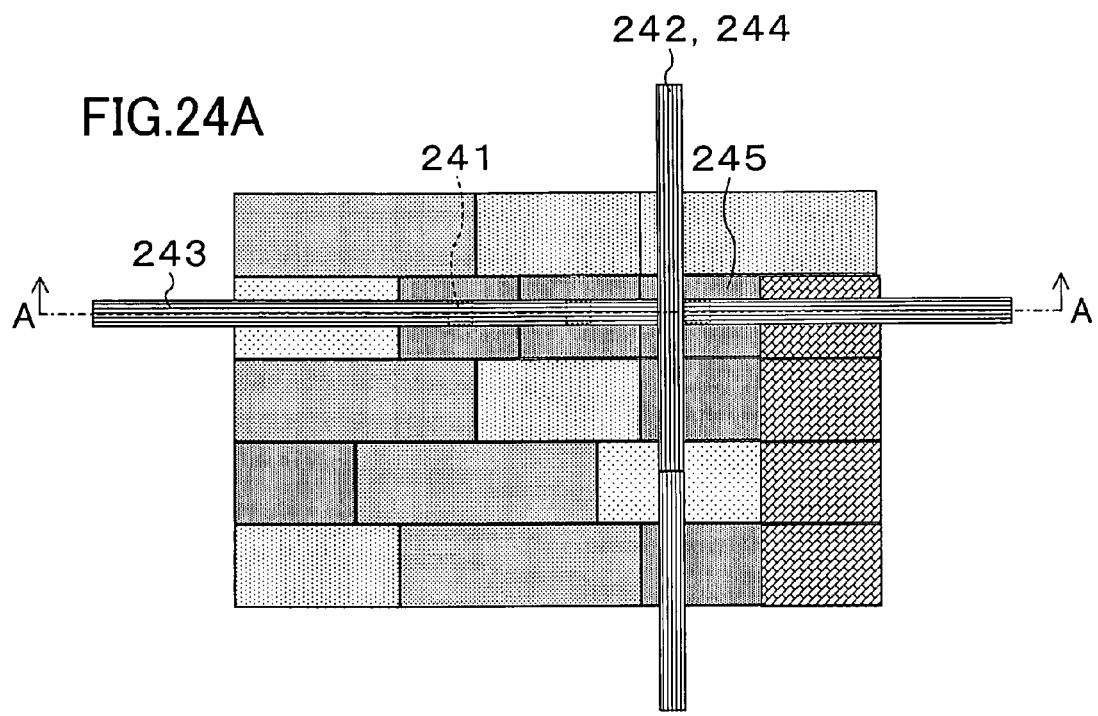
FIG. 24 presents a layout of a semiconductor integrated circuit for explaining Embodiment 4 of the present invention.
Figure 24B:
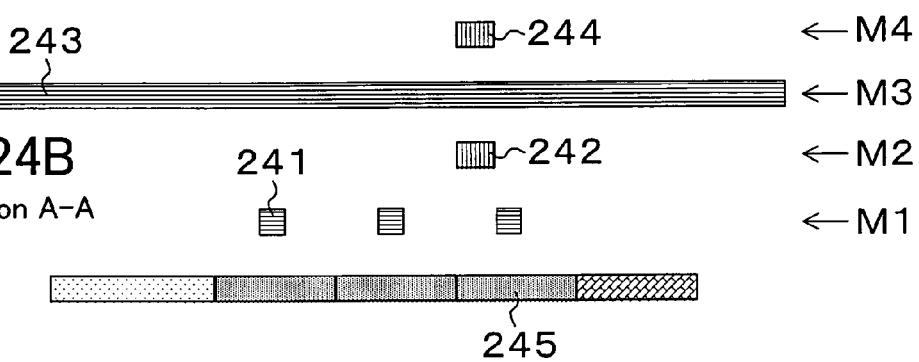

FIG. 24 shows a layout of a semiconductor integrated circuit, wherein FIG. 24A is a plan view and FIG. 24B is a sectional view taken along the line A-A in FIG. 24A. In automatic routing, in general, a preferential wiring direction is set in each wiring layer to increase wiring efficiency in the routing. In four-layer design, as shown in FIG. 24, for example, when a wiring 241 in a metal wiring layer M1 runs in the lateral direction, a wiring 242 in a metal wiring layer M2, a wiring 243 in a metal wiring layer M3, and a wiring 244 in a metal wiring layer M4 run in the longitudinal direction, the lateral direction, and the longitudinal direction, respectively. When the preferential directions of the wirings are set in this way, the wiring efficiency increases, for example, wiring migration can be carried out smoothly. On the other hand, an area of the wirings overlapping with an antenna protection element 245 increases undesirably.

In view of this, in the present embodiment, the preferential direction of each wiring in each wiring layer on each antenna protection element is fixed to one direction.

Figure 25A:
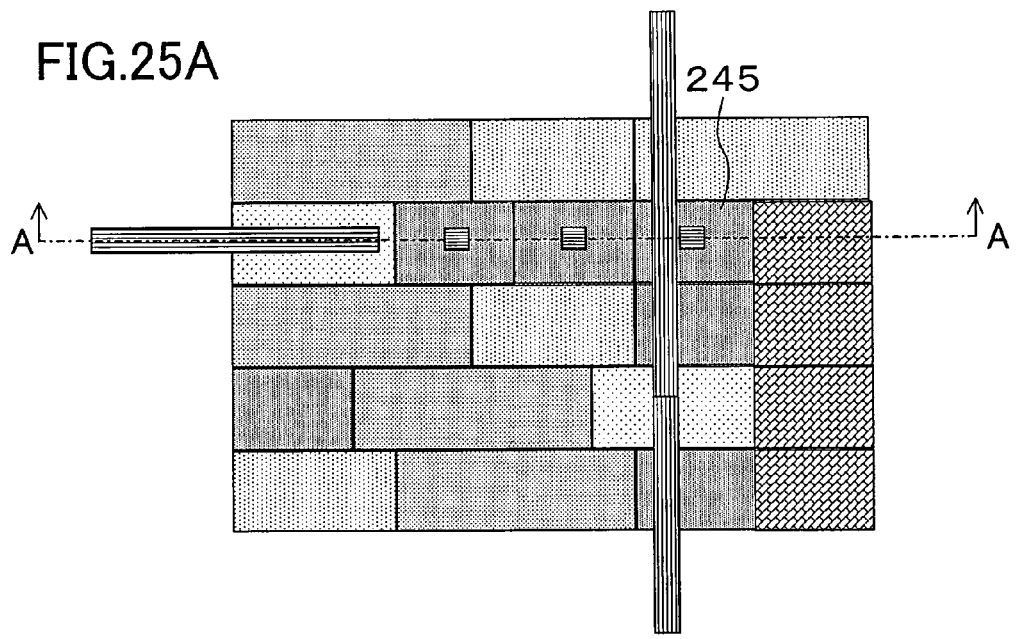
FIG. 25 is a diagram showing the case where a preferential direction of each wiring above the antenna protection elements is fixed in one direction in the layout of FIG. 24.
Figure 25B:
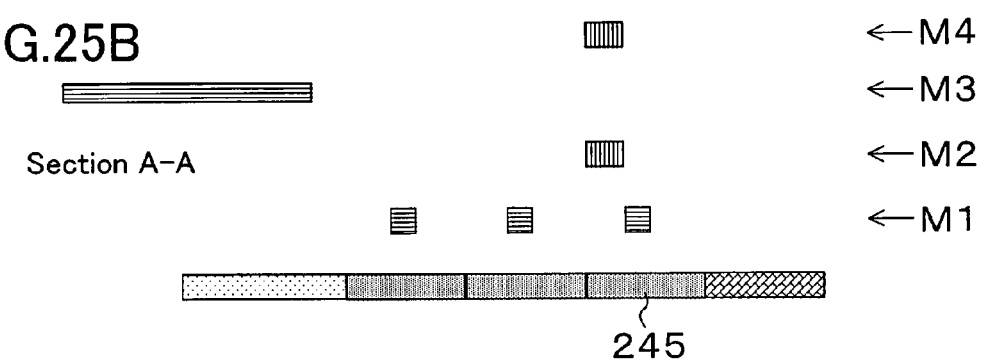

FIG. 25 is a schematic diagram showing the case where the preferential direction of wirings on an antenna protection element is fixed in the longitudinal direction, wherein FIG. 25A is a plan view and FIG. 25B is a sectional view taken along the line A-A in FIG. 25A. In FIG. 25, wirings are routed in layers above a plurality of cells including an antenna protection element 245, and the direction of the wirings above the antenna protection element 254 is fixed in the longitudinal direction. This prevents the area of a part of each wiring which overlaps with the antenna protection element to increase unnecessarily, securing the amount of the light irradiated to the antenna protection element and securing the performance of the antenna protection element. The preferential direction may be set longitudinally or laterally according to a state of congested wirings on each antenna protection element.

In the case where the preferential directions of the wirings are different from each other in the wiring layers, the wirings are routed crosswise. It is probable that the wirings are arranged in a lattice form. In contrast, when the preferential direction of wirings on an antenna protection element is fixed in one direction in each wiring layer, the wirings are arranged in lines on the antenna protection element. Accordingly, the amount of the UV light increases in comparison with the case of the wirings arranged in a lattice form, thereby enhancing the performance of the antenna protection element to avoid antenna error easily.

Embodiment 5

In Embodiments 3 and 4, an area of a part of an antenna protection element which overlaps with a wiring in a layer thereabove is reduced by reducing the amount of wirings capable of being routed above the antenna protection element at the stage of estimation or by controlling the directions of the wirings. Due to constraint, such as a design rule, however, actual routing would cause wirings to run above the antenna protection element at a rate equal to or larger than that in the estimation.

Figure 26:
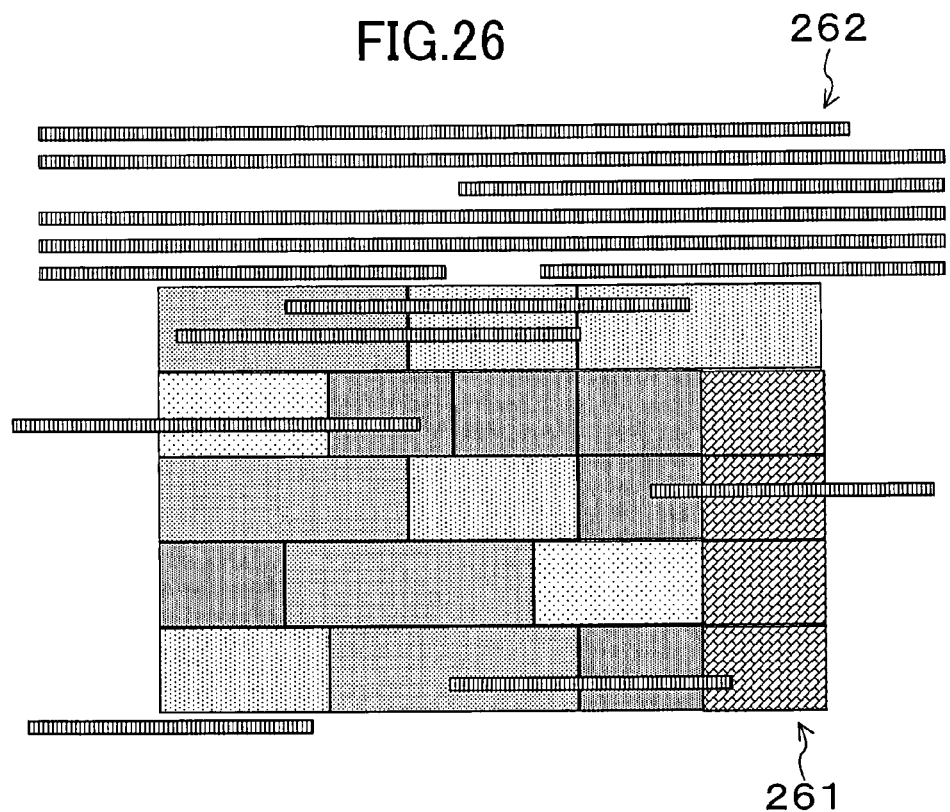
FIG. 26 is a diagram showing an estimated routing in a semiconductor layout according to Embodiment 5 of the present invention.
Figure 27:
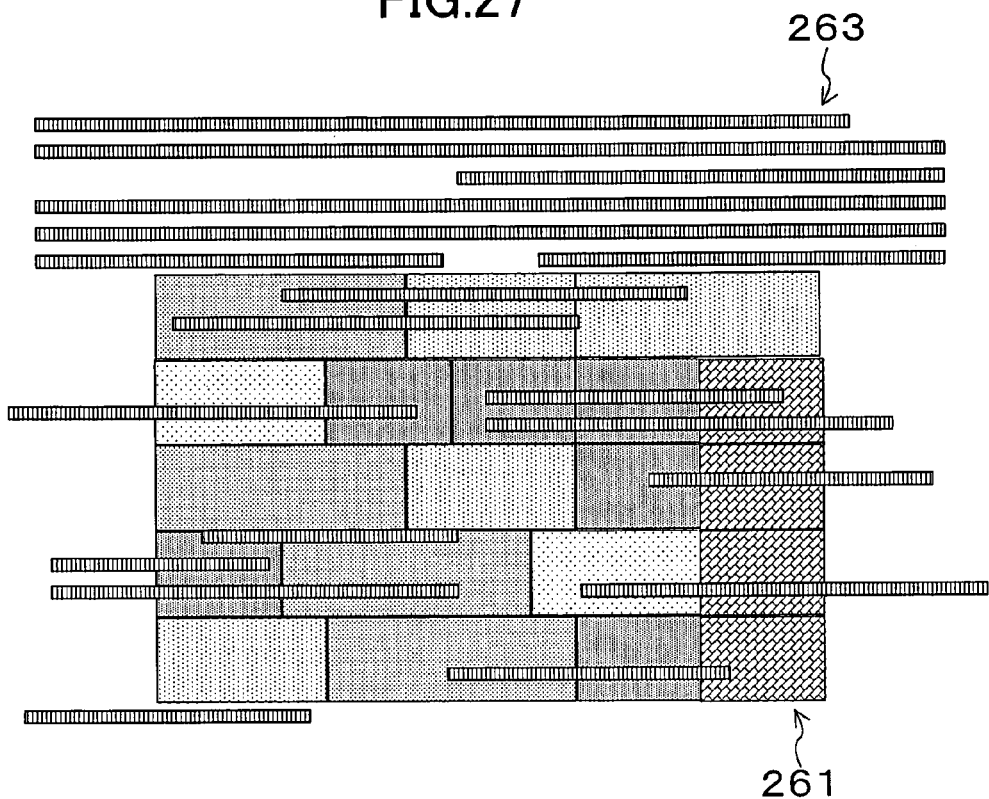
FIG. 27 is a diagram showing a result of actual routing according to the estimation in FIG. 26.

FIG. 26 shows wirings to be routed in a semiconductor layout 261 in the stage of estimation, and FIG. 27 shows a result of actual routing in the same semiconductor layout 261 as in FIG. 26. The number of wirings 263 in FIG. 27 running above the antenna protection elements increases when compared with that of wirings 262 in FIG. 26. In this case, antenna error may be caused in the final stage though antenna error has been avoided at the stage of estimation.

In the present embodiment, wirings are routed with a wiring inhibiting region set in each wiring layer above an antenna protection element on the basis of the overlap allowable area or the overlap unallowable area computed from the result of antenna damage verification as described in Embodiment 1.

Figure 28:
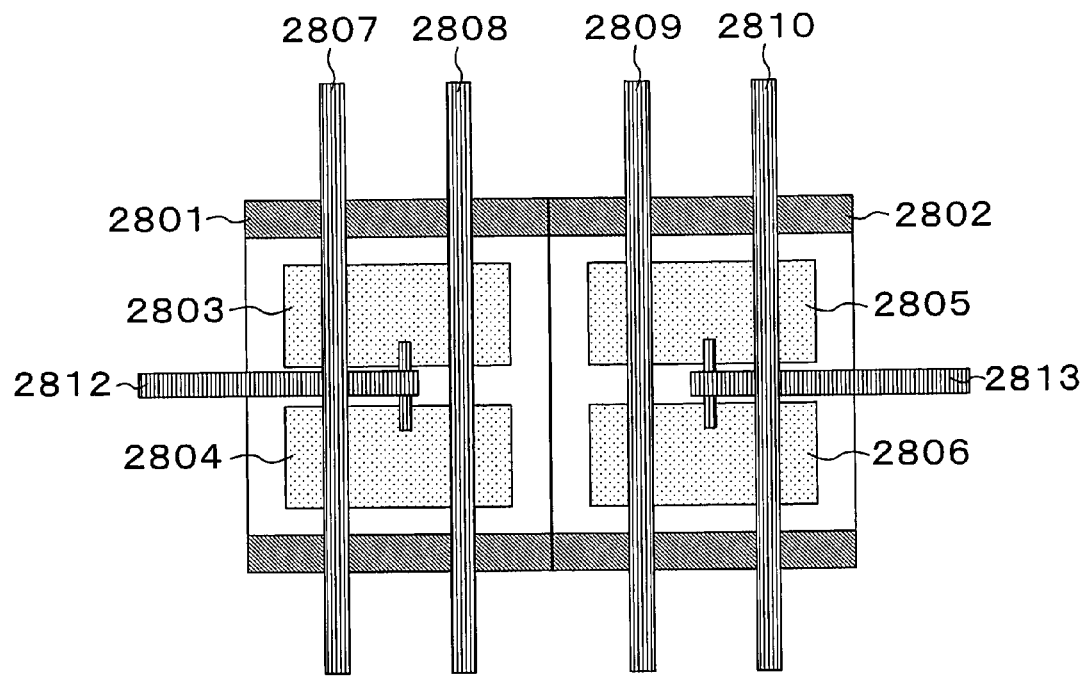
FIG. 28 is a diagram showing a wiring running above an antenna protection element according Embodiment 5 of the present invention.

FIG. 28 is a schematic diagram of wirings running above antenna protection elements. An antenna protection element 2801 includes active regions 2803, 2804, above which wirings 2807, 2808 run. An antenna protection element 2802 includes active regions 2805, 2806, above which wirings 2809, 2810 run. A wiring 2812 is connected to a first gate (not shown) and is connected to the active regions 2803, 2804. A wiring 2813 is connected to a second gate (not shown) and is connected to the active regions 2805, 2806.

Suppose that antenna damage error is caused at the first gate due to running of the wirings 2807, 2808 above the antenna protection element 2801 and that antenna damage error is caused at the second gate due to running of the wirings 2809, 2810 above the antenna protection element 2802.

Figure 29:
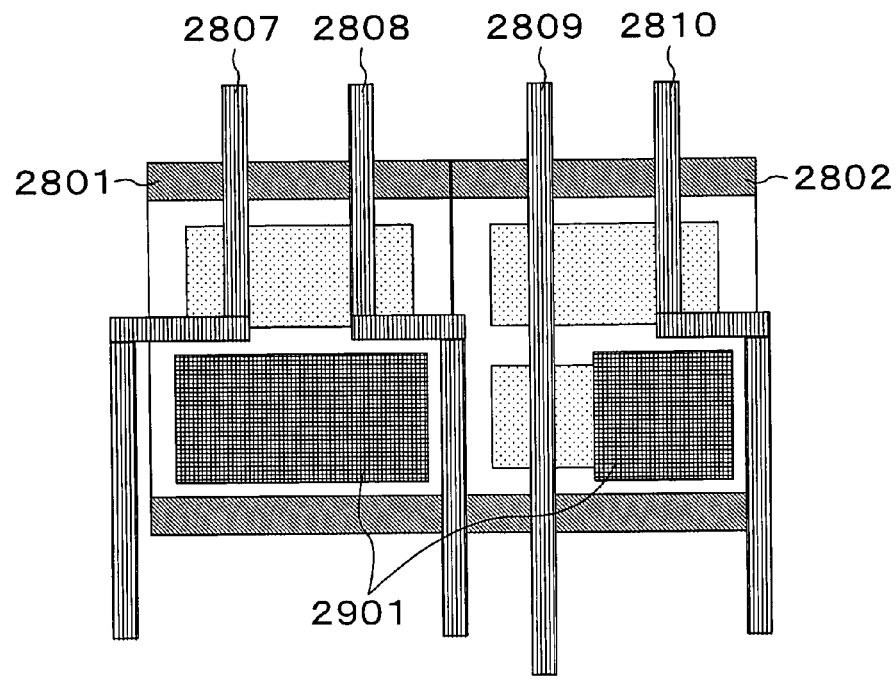
FIG. 29 is a diagram showing routing in the case where a routing inhibiting region is set above an antenna protection element according to Embodiment 5 of the present invention.

Under the supposition, each overlap allowable area or each overlap unallowable areas of the antenna protection elements 2801, 2802 is computed, a routing inhibiting region 2901 is set above each antenna protection element 2801, 2802 on the basis of the computed result, as shown in FIG. 29, and then, routing is performed so as not to route any wiring in each routing inhibiting region. In actual routing, with the routing inhibiting regions 2901 set, the wirings 2807, 2808, 2810 are routed so as to detour around the active regions. This increases an amount of the UV light irradiated to the antenna protection elements 2801, 2802, avoiding antenna damage.

Embodiment 6

Figure 30:
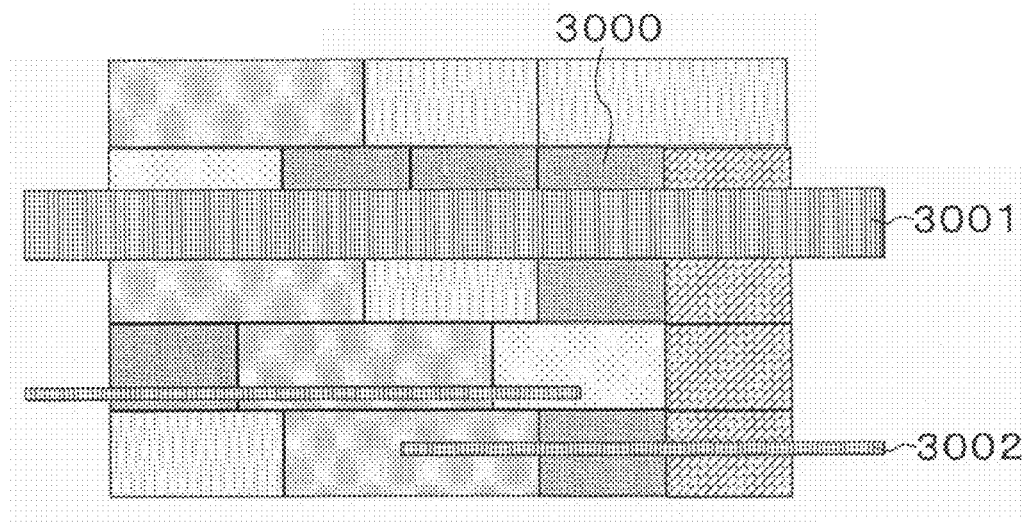
FIG. 30 presents a layout of a semiconductor device for explaining Embodiment 6 of the present invention.

FIG. 30 shows a layout of a semiconductor device. As shown in FIG. 30, a source wiring 3001 and a signal wiring 3002 have to be arranged above an antenna protection element 3000 in some layouts.

In the present embodiment, if a running wiring runs above an antenna protection element, the inside configuration of the antenna protection element is changed according to the overlap area between the antenna protection element and the running wiring.

Figure 31:
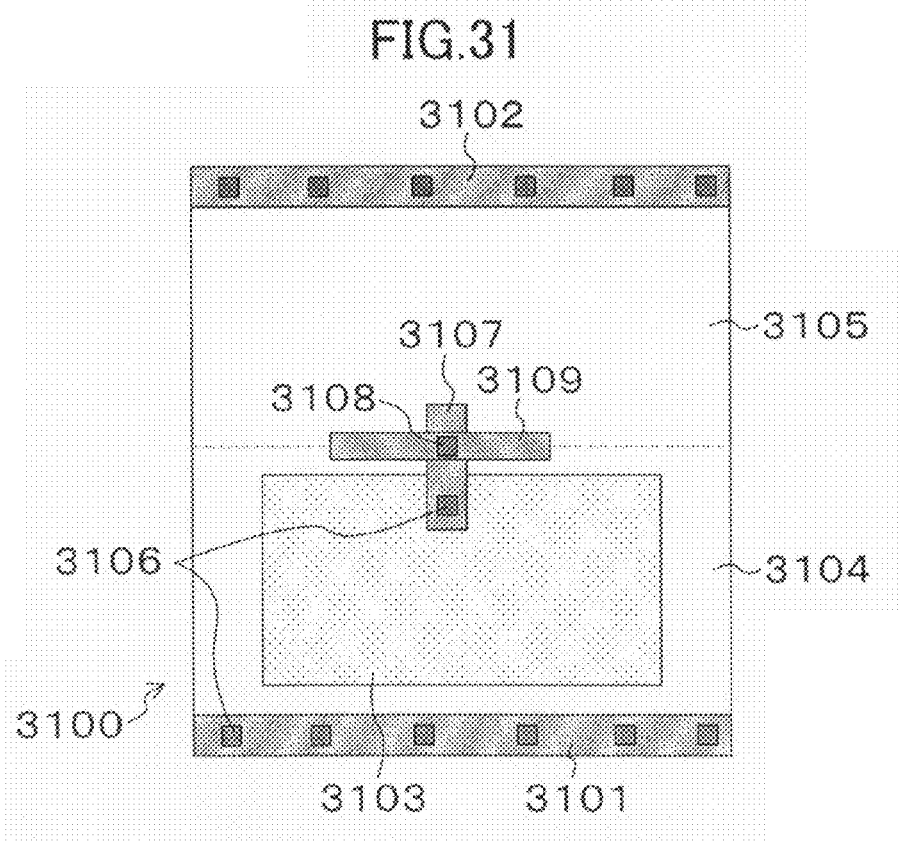
FIG. 31 is a diagram showing an antenna protection element including an active region provided only in a p well.

For example, as shown in FIG. 31, suppose that an antenna protection element 3100 includes an active region 3103 only in a p well region 3104. In FIG. 31, reference numeral 3101 denotes a ground (VSS) wiring in a first metal wiring layer, 3102 denotes a source (VDD) wiring in the first metal wiring layer, 3105 denotes a n well region, 3106 denotes a contact, 3107 denotes a wiring in the first metal wiring layer, 3108 denotes a via, and 3109 denotes a wiring in a second metal wiring layer. The antenna protection element 3100 is connected to a gate by means of the wiring 3109. The antenna protection element 3100 in FIG. 31 has patterns of active regions of which numbers are different from each other between in the p well and in the n well.

Figure 32:
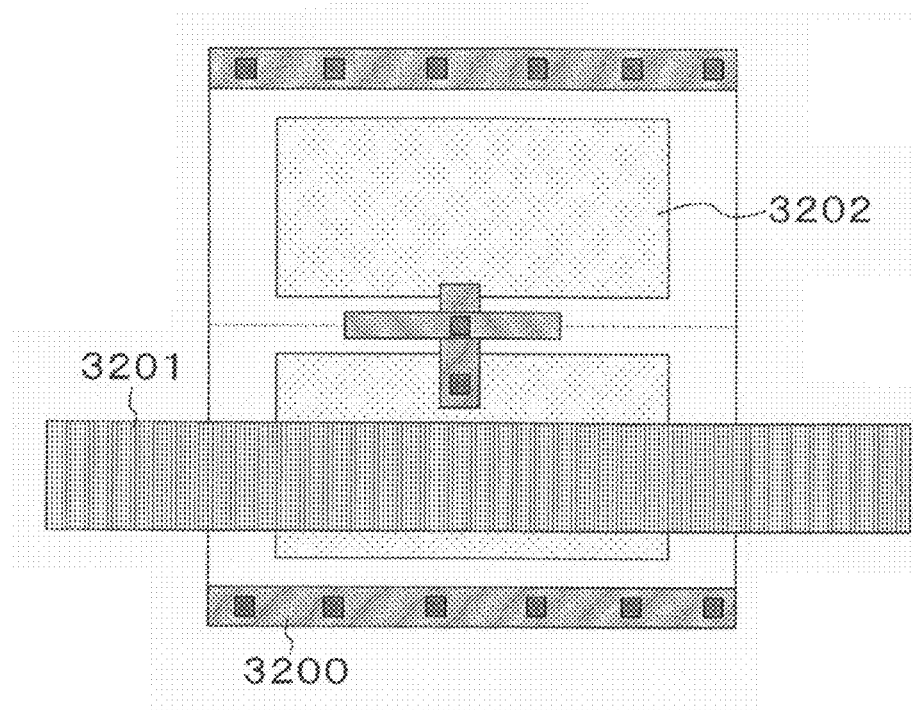
FIG. 32 is a diagram showing an antenna protection element including an active region in each of a p well and an n well.

When a wide wiring, such as a source wiring is routed above an antenna protection element, the amount of the UV light irradiated to the antenna protection element reduces as a matter of course. For avoiding this, as shown in FIG. 32, the antenna protection element 3100 is replaced by a high-performance antenna protection element 3200 having an active region 3202 also in the n well region. This avoids antenna damage even when the source wiring as a wide running wiring is routed thereon.

Figure 33:
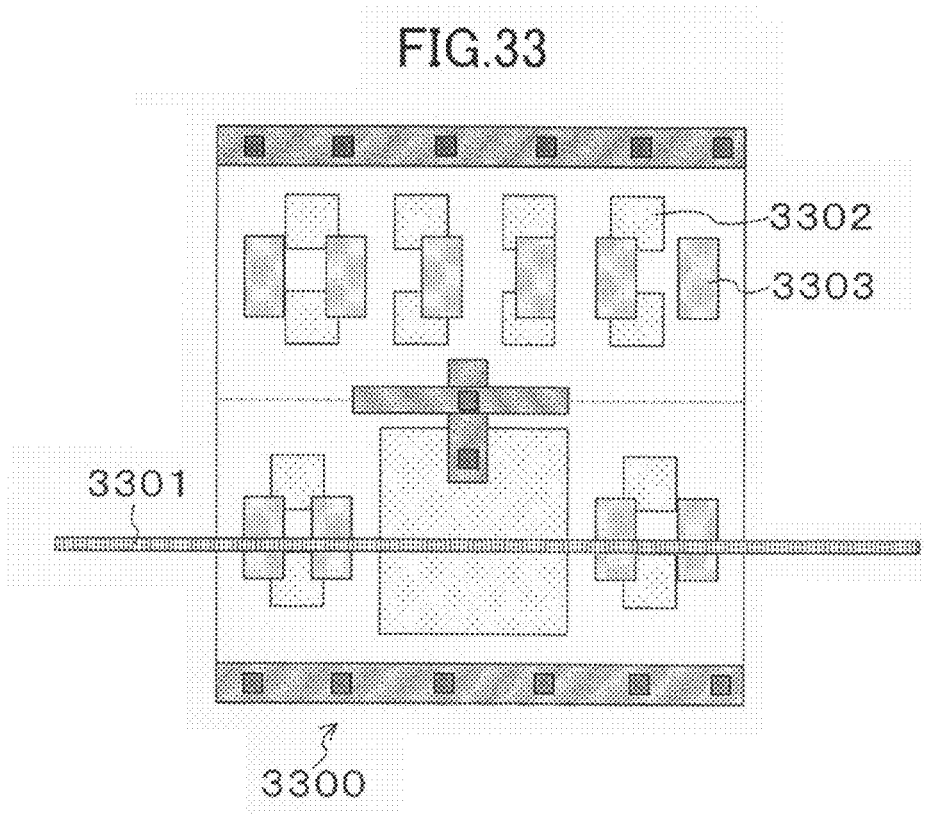
FIG. 33 is a diagram showing an antenna protection element on which a dummy pattern is arranged.

The amount of the UV light irradiated to the antenna protection element is larger than that in the case where a source wiring is routed when a narrow wiring, such as a signal wiring is routed above an antenna protection element. Accordingly, if antenna damage could be avoided, the antenna protection element 3100 may be replaced by an antenna protection element 3300 in which dummy patterns as underlying layers, such as a polysilicon 3303 for area ratio adjustment, an active region 3302, and the like are arranged in unoccupied regions in the n well region and the p well region, as shown in FIG. 33. Reference numeral 3301 denotes a signal wiring as a running wiring. The amount of dummy patterns is changed according to the area ratio. The antenna protection element 3300 in FIG. 33 has patterns of the active regions of which numbers are different from each other between in the p well and in the n well.

Figure 34:
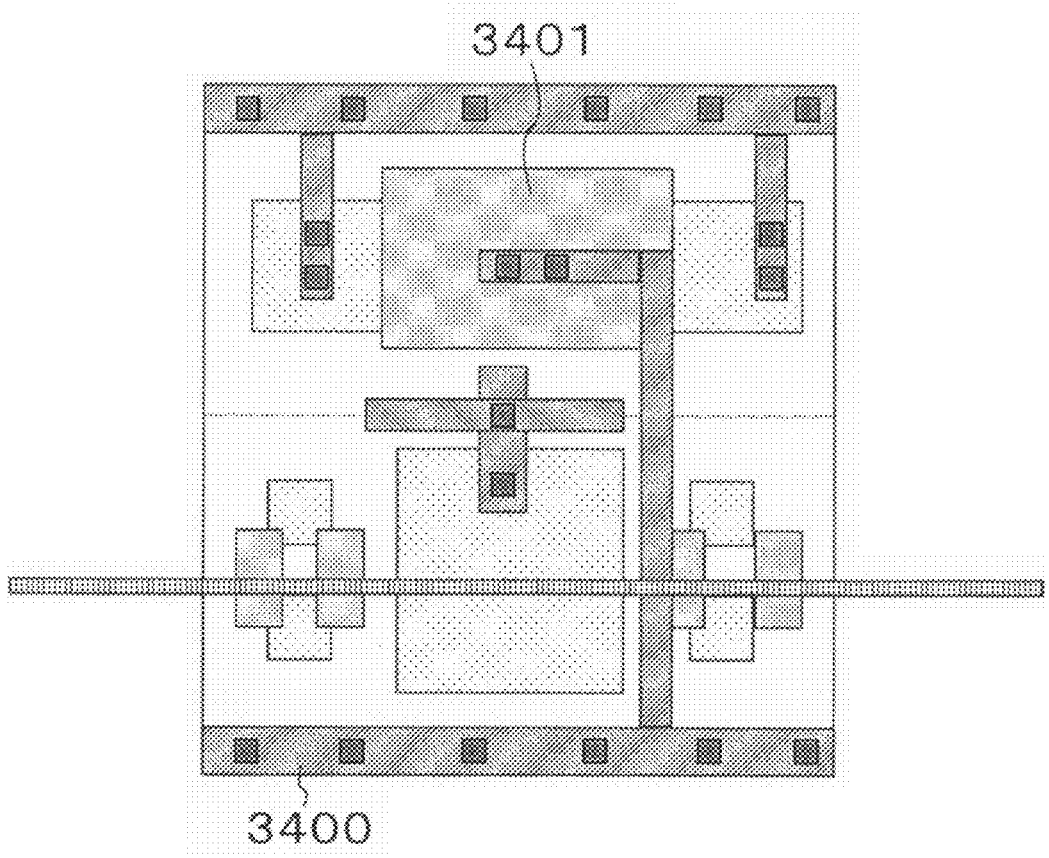
FIG. 34 is a diagram showing an antenna protection element on which a capacitance pattern is arranged.

Further, when the area ratio in the underlying layer includes a spare, the antenna protection element 3100 may be replaced by an antenna protection element 3400 in which a capacitance pattern 3401 is arranged in each of the n well region and the p well region, as shown in FIG. 34.

Hence, antenna damage is avoided, and both area ratio adjustment of the underlying layer and arrangement of a decoupling capacitance pattern for noise absorption are achieved. Optionally, constitutional elements in an antenna protection element may be changed according to variation in performance of the antenna protection elements in a chip.

In the present embodiment, when a plurality of antenna protection elements connected to the same gate are arranged adjacently to each other as a result of arrangement of a plurality of cells including antenna protection elements, the plurality of antenna protection elements are replaced by a single antenna protection element.

Figure 35A:
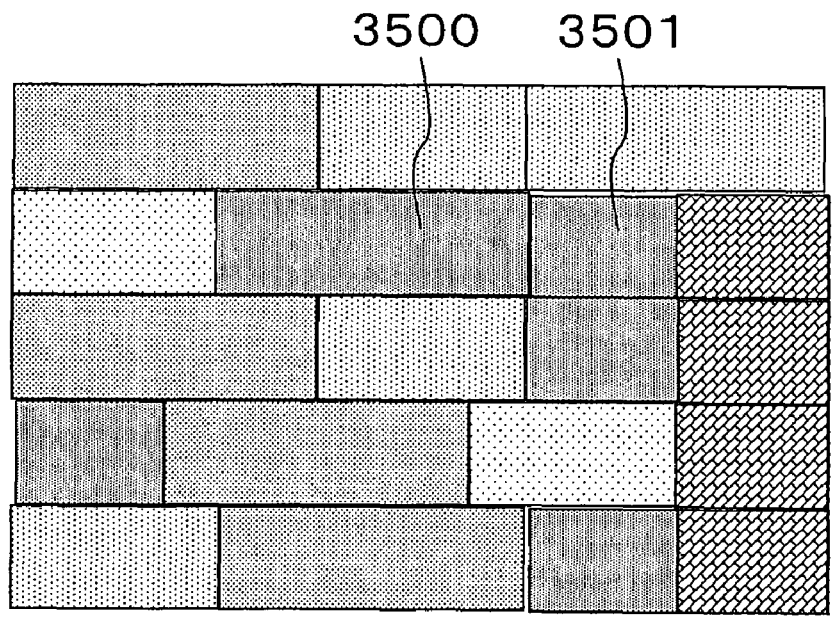
FIG. 35 is a diagram showing an arrangement of antenna protection elements in a semiconductor layout for explaining Embodiment 6 of the present invention.
Figure 35B:
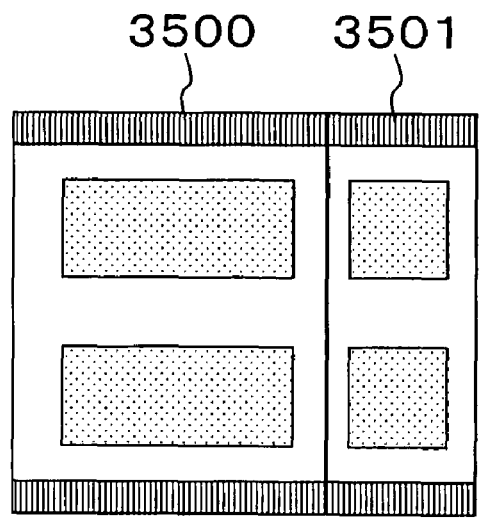

Antenna protection elements are arranged in general in such a manner that a lineup of several kinds of antenna protection elements different in size is prepared and the largest antenna protection element is inserted first so that antenna protection elements having larger diffusion regions can be arranged as many as possible. In doing so, a small antenna protection element 3501 can be arranged next to a large antenna protection element 3500 in some layouts, as shown in FIG. 35. The antenna protection elements 3500, 3501 are supposed to be connected to the same gate herein.

Figure 36A:
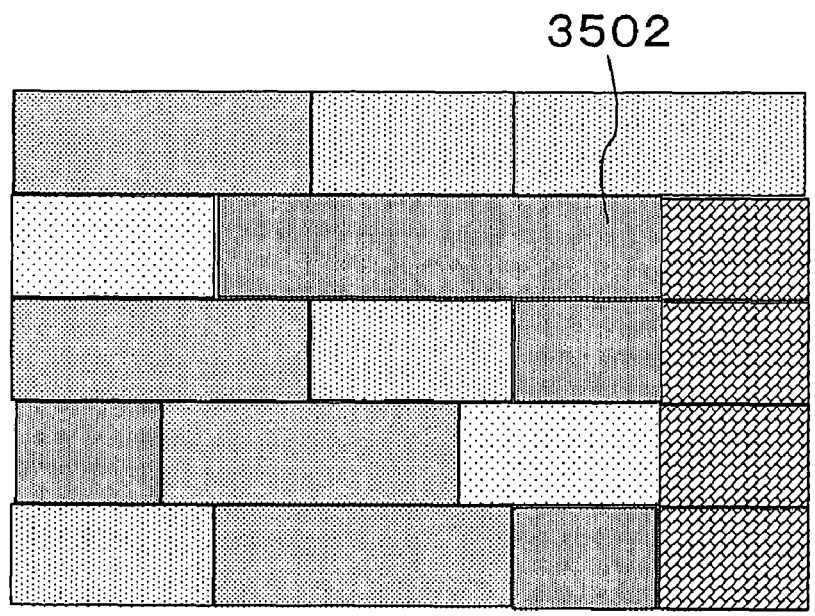
FIG. 36 is a diagram of the layout of FIG. 35 in which the adjacent antenna protection elements are replaced by a single antenna protection element.
Figure 36B:
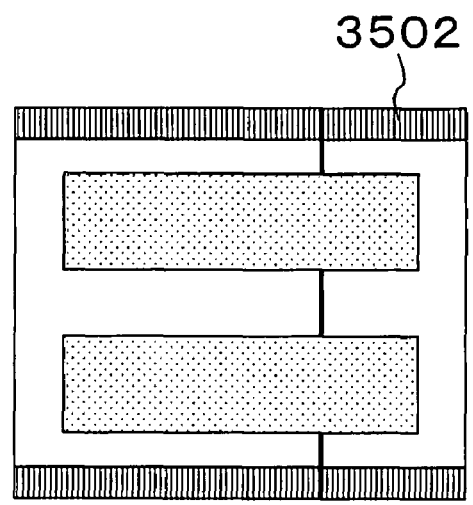

In this case, as shown in FIG. 36, it is preferable to replace the antenna protection elements 3500, 3501 by a single antenna protection element 3502. Namely, a space between the active regions of the adjacent antenna protection elements 3500, 3501 is filled by post treatment to replace them by the antenna protection element 3502 exhibiting higher performance.

Alternatively, the active regions of the adjacent antenna protection elements 3500, 3501 may be connected in at least one of each p well and each n well.

In general, in designing using standard cells, a predetermined space (wiring spacing determined by the design rule) is left on each side of each cell so as not to violate the design rule. This is also applied to the antenna protection elements. In the case where a plurality of antenna protection elements connected to the same gate are arranged adjacently to each other, the predetermined space between the plurality of antenna protection elements is filled with an active region to enhance the performance of the antenna protection elements.

Moreover, in the present embodiment, if an unoccupied region is present next to an antenna protection element as a result of arrangement of a plurality of cells including the antenna protection element, the antenna protection element is replaced by an antenna protection element having an area that can fill the unoccupied region.

Figure 37A:
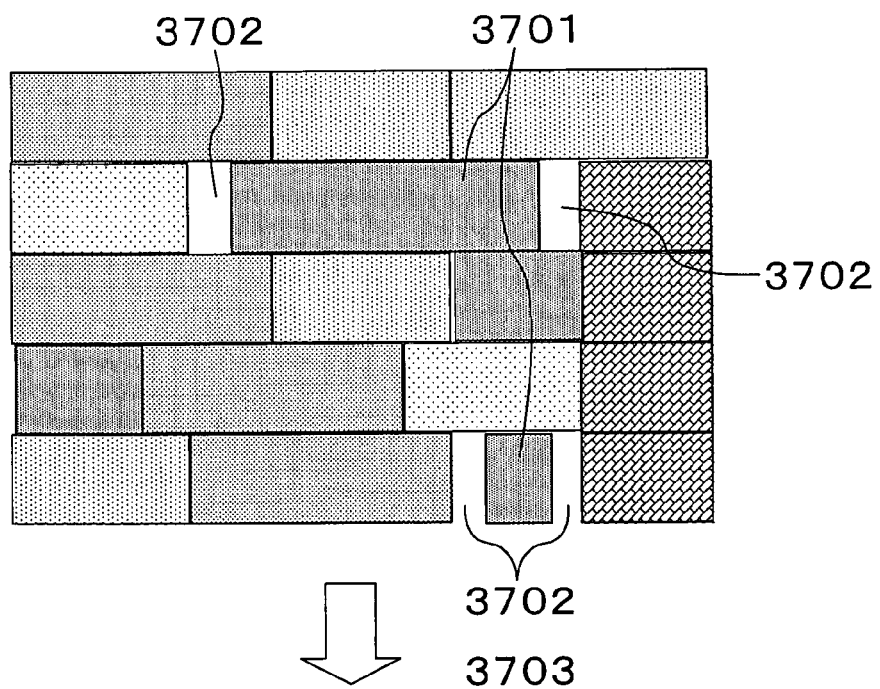
FIG. 37 is a diagram showing the case where an unoccupied region is replace by an antenna protection region in a semiconductor layout.
Figure 37B:
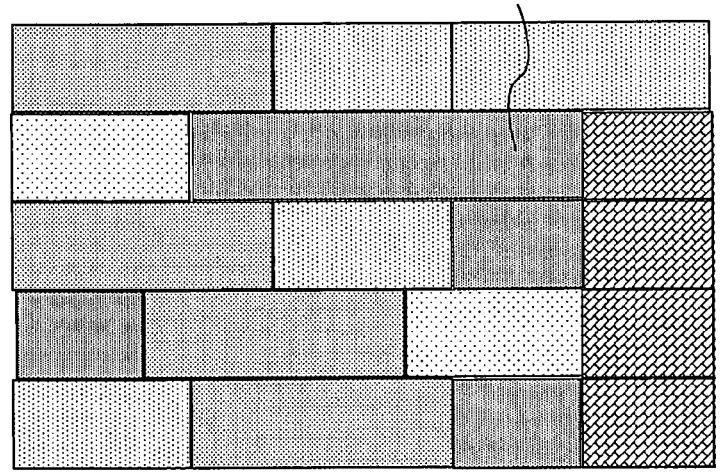

As shown in FIG. 37, an unoccupied region 3702 next to an antenna protection element 3701 may be present in some layouts. This is because sequential insertion of antenna protection elements on the largest-one-first basis results in formation of a small unoccupied region to which no antenna protection element can be inserted. Conventionally, a substrate contact is inserted in such an unoccupied region. In the present embodiment, in order to increase a safety margin from antenna damage, an antenna protection element 3703 having an area that can fill the unoccupied region 3702 is created automatically and replaces the antenna protection element 3701. This increases the safety margin from antenna damage, thereby avoiding antenna damage definitely.

Figure 38A:
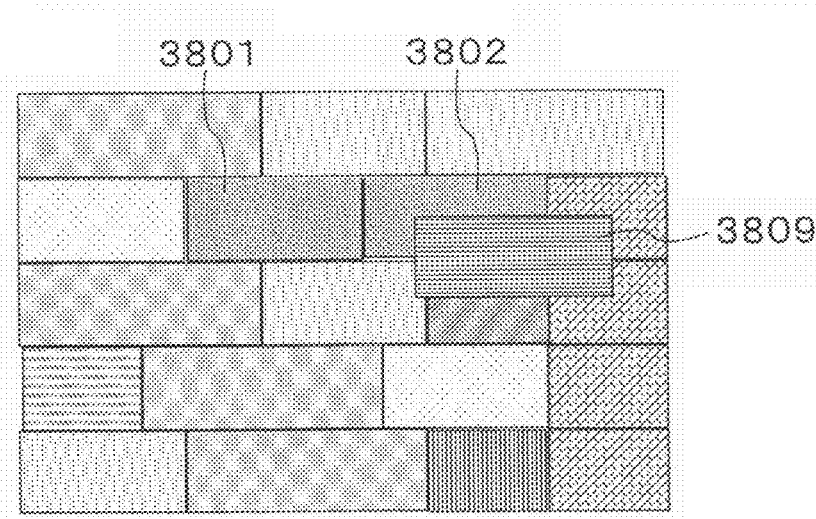
FIG. 38 is a diagram showing the case where connection between the active region of an antenna protection element is changed in a semiconductor layout.
Figure 38B:
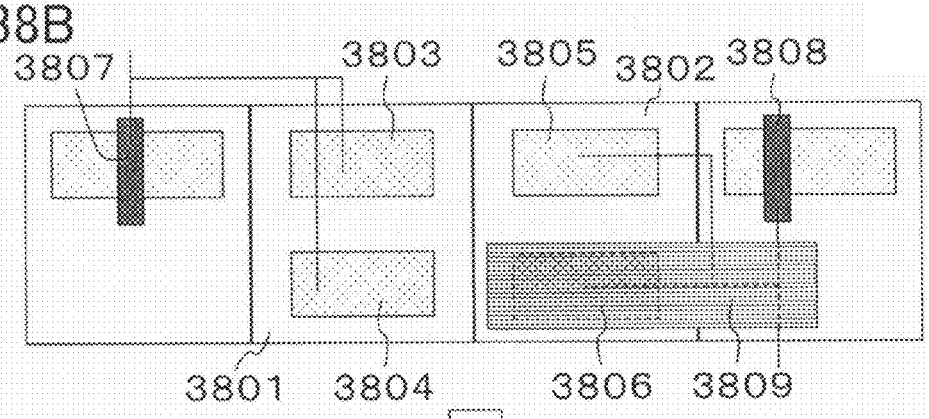
Figure 38C:
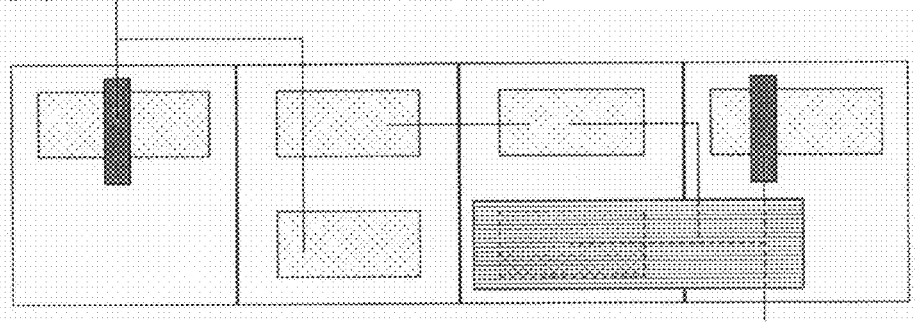

Alternatively, consider the case where antenna protection elements 3801, 3802 are arranged adjacently to each other, as shown in FIG. 38. In FIG. 38B, reference numerals 3803 and 3804 denote a p well side active region and an n well side active region of the antenna protection element 3801, respectively, while 3805 and 3806 denote a p well side active region and an n well side active region of the antenna protection element 3802, respectively. The antenna protection element 3801 and the antenna protection element 3802 are connected to a gate 8007 and a gate 3808, respectively. The gate 3807 has a large antenna safety margin while the gate 3808 has a small antenna safety margin. A wiring 3809 is formed above the n well side active region 3806 of the antenna protection element 3802. With the wiring 3809 formed thereabove, the n well side active region 3806 has performance lower than the p well side active region 3805 to reduce the antenna safety margin of the gate 3808. In view of this, in order to increase the antenna safety margin, the p well side active region 3803 of the antenna protection element 3801 is cut off from the gate 3807 and is connected to the p well side active region 3805 of the antenna protection element 3802, as shown in FIG. 38C. Alternatively, the n well side active region 3804 of the antenna protection element 3801 may be cut off from the gate 3807 and be connected to the p well side active region 3805 of the antenna protection element 3802.

Figure 39A:
FIG. 39 is a diagram showing the case where the active regions of the antenna protection elements are re-grouped in a semiconductor layout.
Figure 39B:
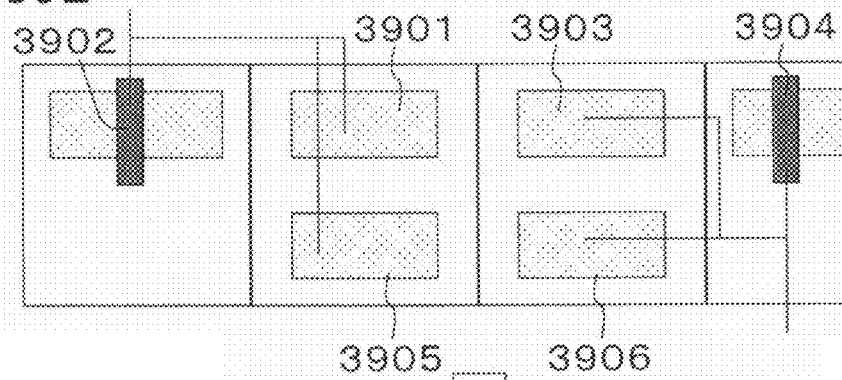
Figure 39C:
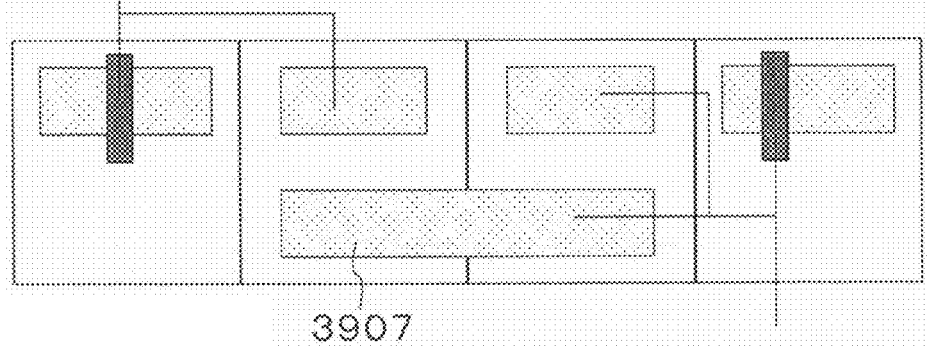

As shown in FIG. 39, it is supposed that antenna protection elements 3901, 3903 are arranged adjacently to each other and the antenna protection element 3901 and the antenna protection element 3903 are connected to a gate 3902 and a gate 3904, respectively. It is further supposed that antenna damage verification finds a safety margin from antenna damage in the gate 3902 and antenna error caused at the gate 3904. In this case, for example, a p well side active region 3905 of the antenna protection element 3901 is connected to a p well side active region 3906 of the antenna protection element 3903 to form a large active region 3907. This enhances the performance of the antenna protection element 3903.

The reverse case can be considered, of course. FIG. 40 shows an arrangement of an antenna protection element 4001 resulted from a cell arrangement. In FIG. 40, an active region 4008 of the antenna protection element 4001 is connected to a gate 4002 by means of a wiring 4004 while no antenna protection element is connected to a gate 4003, wherein it is supposed that antenna damage verification finds a safety margin in the gate 4002 and antenna damage error caused at the gate 4003.

An active region 4008 of the antenna protection element 4001 connected to the gate 4002 having the antenna safety margin is divided into active regions 4005, 4006. Then, one 4006 of the divided active regions is connected again by means of a wiring 4007 to the gate 4003 at which antenna error is caused. This avoids antenna damage error at the gate 4003 with no additional antenna protection element inserted.

Figure 41:
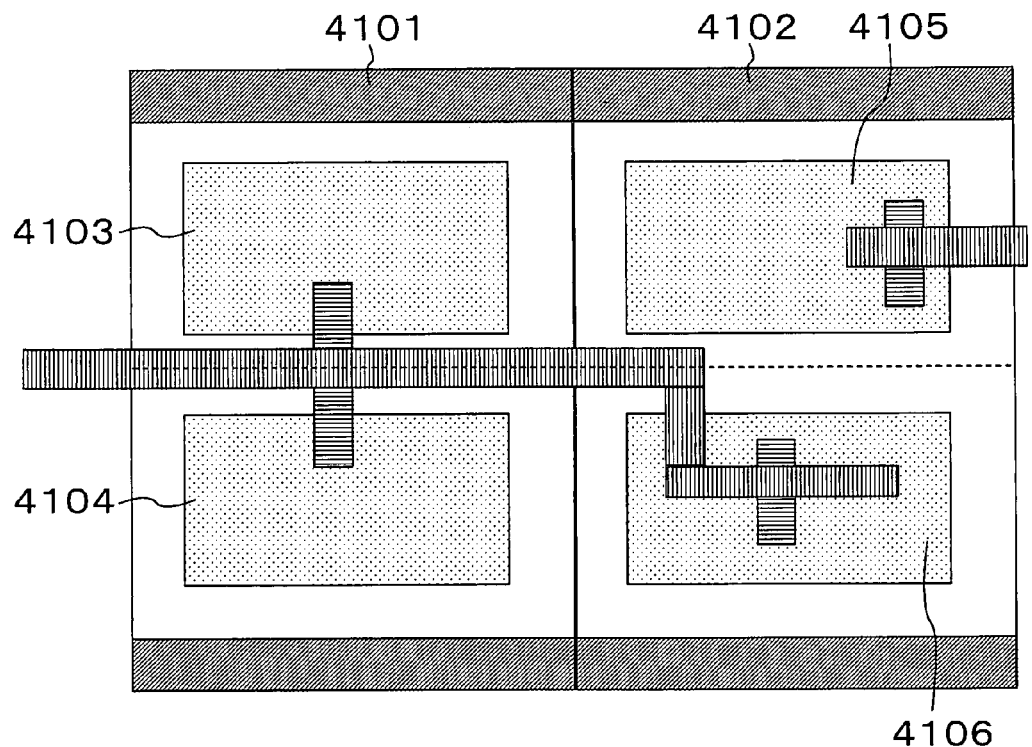
FIG. 41 is a diagram showing antenna protection elements arranged adjacent to each other.

FIG. 41 shows antenna protection elements arranged adjacently to each other. In FIG. 41, an antenna protection element 4101 includes an n well side active region 4103 and a p well side active region 4104 while an antenna protection element 4102 includes an n well side active region 4105 and a p well side active region 4106. The active regions 4103, 4104, 4106 are connected to a first gate while the active region 4105 is connected to a different second gate.

Figure 42:
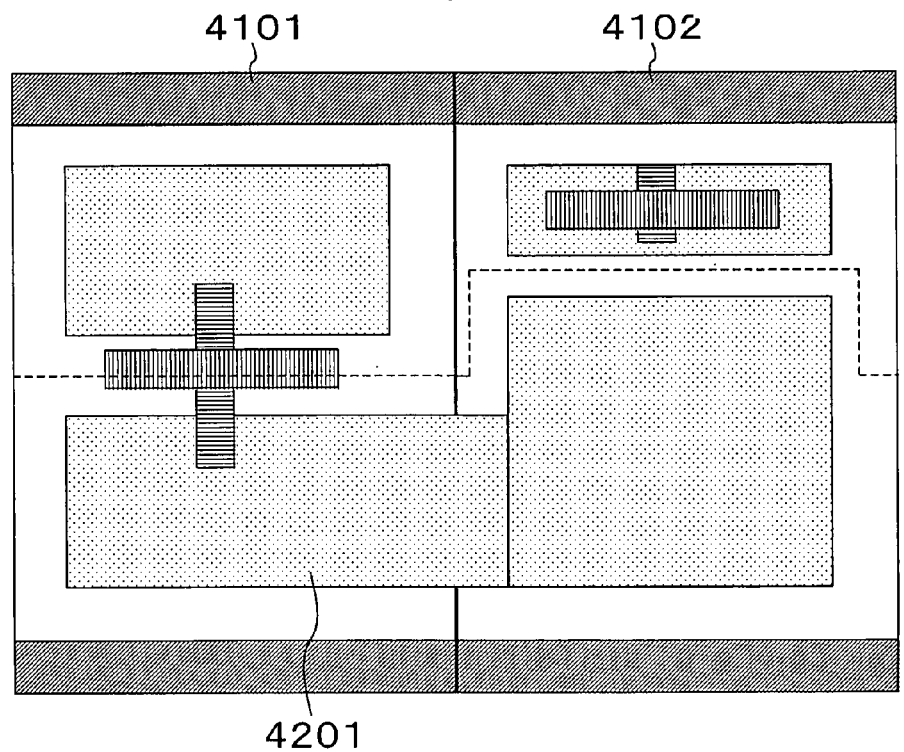
FIG. 42 is a diagram showing antenna protection elements of which area ratios of a p well to an n well are different from each other.
Figure 43A:
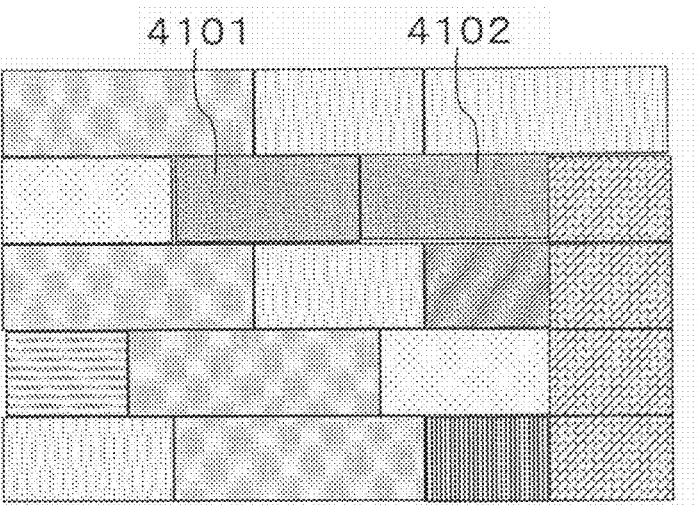
FIG. 43 is a diagram showing a semiconductor layout in which the antenna protection elements in FIG. 42 are arranged.
Figure 43B:
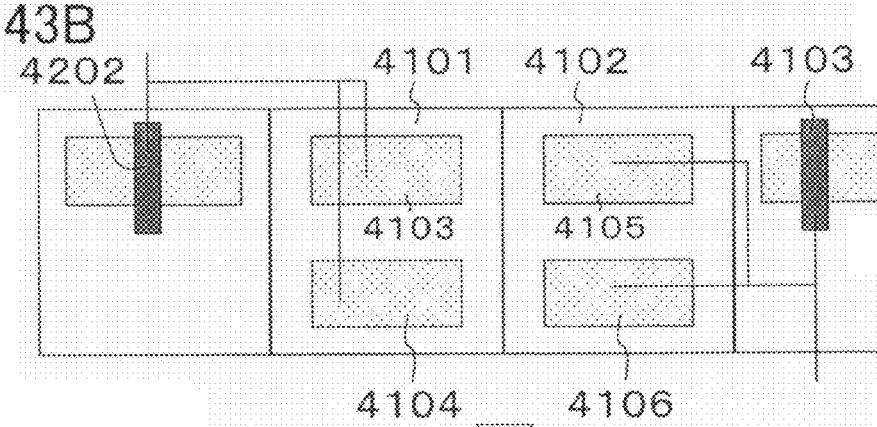
Figure 43C:
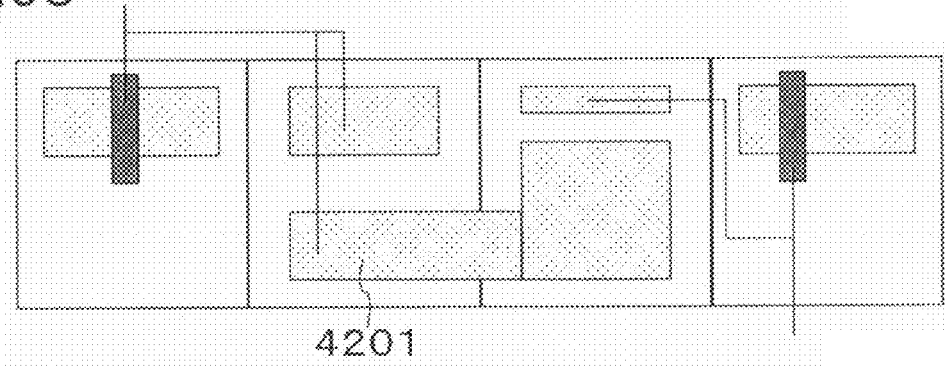

Suppose that the second gate has an antenna safety margin while antenna damage error is caused at the first gate. In order to avoid the antenna damage error, as shown in FIG. 42, the n well of the antenna protection element 4102 is minimized within a limit that satisfies the design rule while the p well is enlarged by the minimization to make the p well side active region large. Then, the enlarged p well side active region of the antenna protection element 4102 is connected to the p well side active region of the antenna protection element 4101 to form a larger active region 4201. This avoids the antenna damage error at the first gate. FIG. 43 shows layout conversion described herein, wherein reference numerals 4202 and 4203 denote the first gate and the second gate, respectively.

In FIG. 42, the area ratios of the p well to the n well are different from each other between the antenna protection element 4101 and the antenna protection element 4102. If both antenna protection elements different from each other in area ratio of the p well to the n well are present, an antenna protection element having appropriate performance can be provided to a gate that would cause antenna damage error. Hence, antenna damage can be addressed by a minimum number of antenna protection elements, and space in an LSI can be utilized efficiently.

When any techniques described in the present embodiment cannot eliminate antenna damage error in antenna damage verification, layout modification is performed in the end.

Embodiment 7

Figure 44:
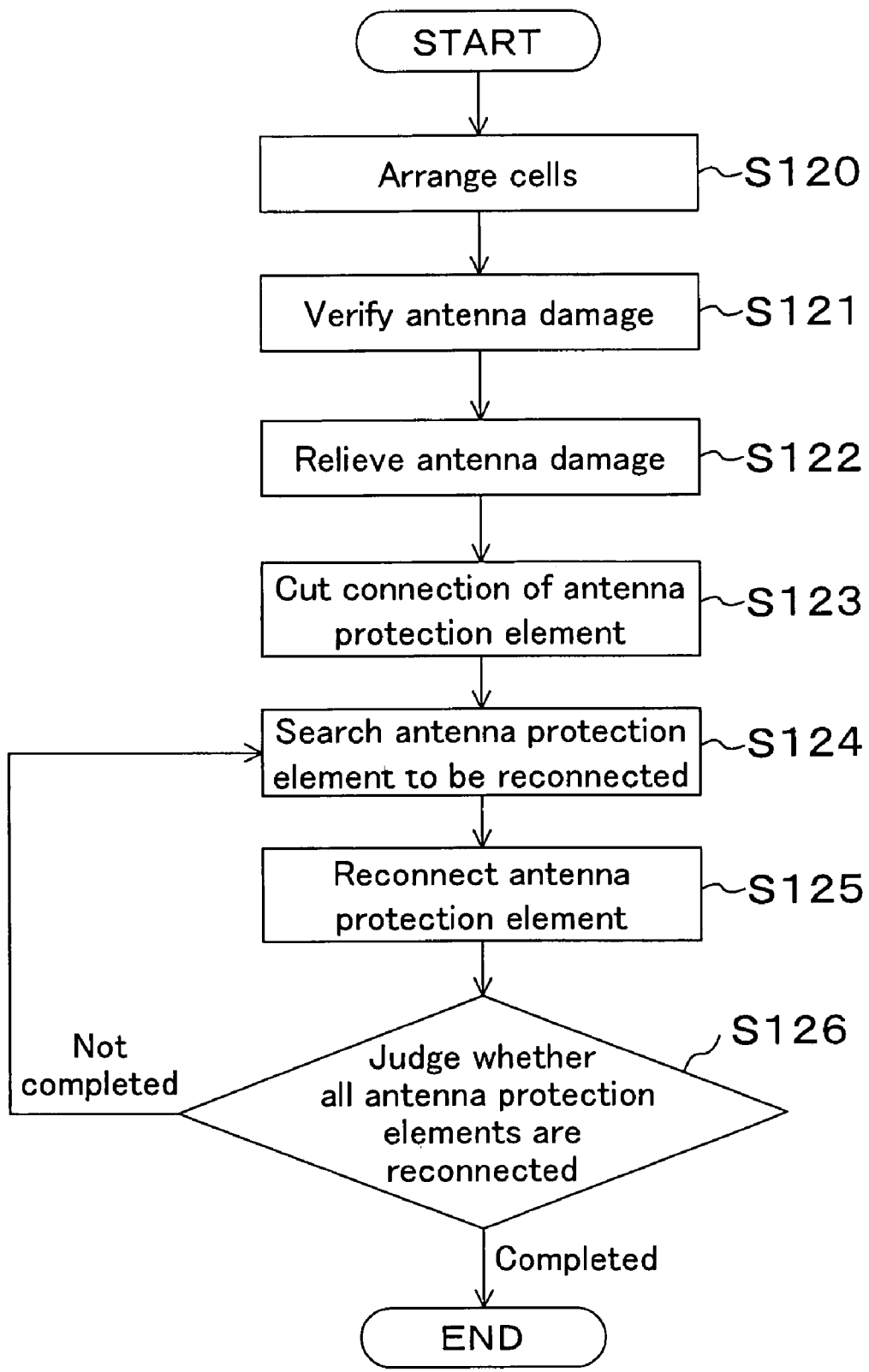
FIG. 44 is a flowchart depicting a layout designing method according to Embodiment 7 of the present invention.

FIG. 44 is a flowchart depicting a layout designing method according to Embodiment 7. In FIG. 44, S120 indicates a cell arranging step, S121 indicates an antenna damage verifying step, S122 indicates an antenna damage relieving step, S123 indicates an antenna protection element connection cutting step, S124 indicates a protection element reconnection searching step, S125 indicates a protection element reconnecting step, and S126 indicates a protection element reconnection judging step.

First, in the cell arranging step S120, gates and a plurality of cells including antenna protection elements connected to the gates are arranged. Then in the antenna damage verifying step S121, antenna damage verification is performed on the arrangement result by the cell arranging step S120. Subsequently, the antenna damage relieving step is performed on the basis of the result by antenna damage verification. The antenna damage relief herein includes any step for improvement described in any of Embodiments 1 to 6, such as steps of deleting an overlap area between an antenna protection element and a wiring, connecting antenna protection elements, dividing an antenna protection element, and the like.

After antenna error relief is performed, every connection between the gates and the antenna protection elements is cut in the antenna protection element connection cutting step S123.

Through the steps S124, S125, and S126, the gates and the antenna protection elements are reconnected. In the protection element reconnection searching step S124, a central point of a gate arrangement region is determined first. Next, one gate, which is located the closest to the central point and is in need of antenna damage relief, is selected, and an antenna protection element located the closest to the selected gate is searched. In the protection element reconnecting step S125, the searched antenna protection element is connected to the selected gate.

Subsequently, in the protection element reconnection judging step S126, judgment is performed as to whether or not every connection of the antenna protection elements to the gates in need of antenna damage relief is completed. When it is not completed, the routine returns to the step S124, and a gate the next closest to the central point is selected for executing the same processing. In other words, sequential processing of selecting a gate the closest to the central point and connecting an antenna protection element the closest to the selected gate is repeated until the antenna protection elements are reconnected to all the gates in need of antenna damage relief.

The above processing achieves reconnection between the gates and the antenna protection elements without elongating the wirings even in the case where no antenna protection element is arranged near a gate in need of antenna damage relief and an unconnected antenna protection element is present in the peripheral part of an LSI or the like.

The reconnection described above can be utilized in the case, for example, where running wirings run on an antenna protection element at a rate equal to or larger than a predetermined rate after routing.

FIG. 45A shows a layout in which a plurality of cells including an antenna protection element 360 is arranged, and FIG. 45B shows a layout after completion of routing. In some layouts, a wiring above the antenna protection element 360 might be congested locally after completion of routing, as shown in FIG. 46B. If a running wiring runs above the antenna protection element at a rate equal to or larger than a predetermined ratio, the performance of the antenna protection element becomes insufficient.

In view of this, when wiring arrangement results in the antenna protection element 360 on which the running wiring runs at a rate equal to or larger than the predetermined rate, the connection between the gate and the antenna protection element is once cut. Then, the antenna protection element 360 is replaced by a cell 361 other than an antenna protection element which involves no influence on the characteristics even if the wirings run thereabove, such as a capacitance cell, a buffer, or the like. Thereafter, the gate and the antenna protection element are reconnected to each other. This processing avoids antenna damage and achieves effective cell arrangement.

Embodiment 8

Figure 46:
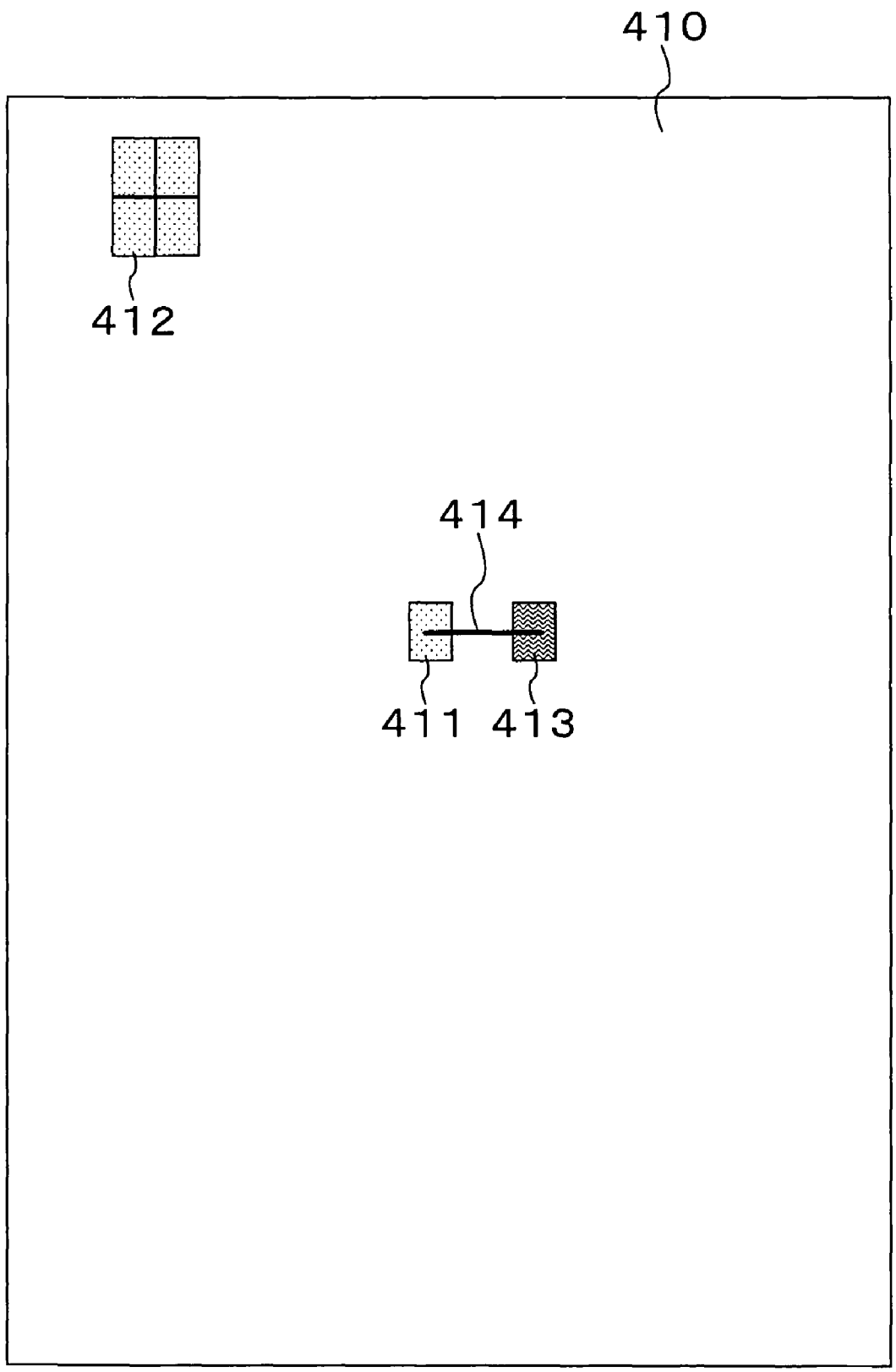
FIG. 46 is a diagram showing each position of an antenna protection element and a gate for explaining Embodiment 8 of the present invention.

FIG. 46 is a schematic diagram showing each position of antenna protection elements and a gate in a layout after cells and wirings are arranged. In FIG. 46, reference numeral 411 denotes an antenna protection element arranged near the center of a chip 410, 412 denotes an antenna protection element arranged in the peripheral part of the chip 410, 413 denotes a logic cell having a gate which would cause antenna damage, and 414 denotes a wiring that connects the gate of the logic cell 413 and the antenna protection element 411.

Suppose that a plurality of wirings are routed above the antenna protection element 411 to lower the performance of the antenna protection element 411 remarkably and that no other antenna protection element is arranged in the vicinity of the logic cell 413 having a gate in need of antenna damage relief.

Figure 47:
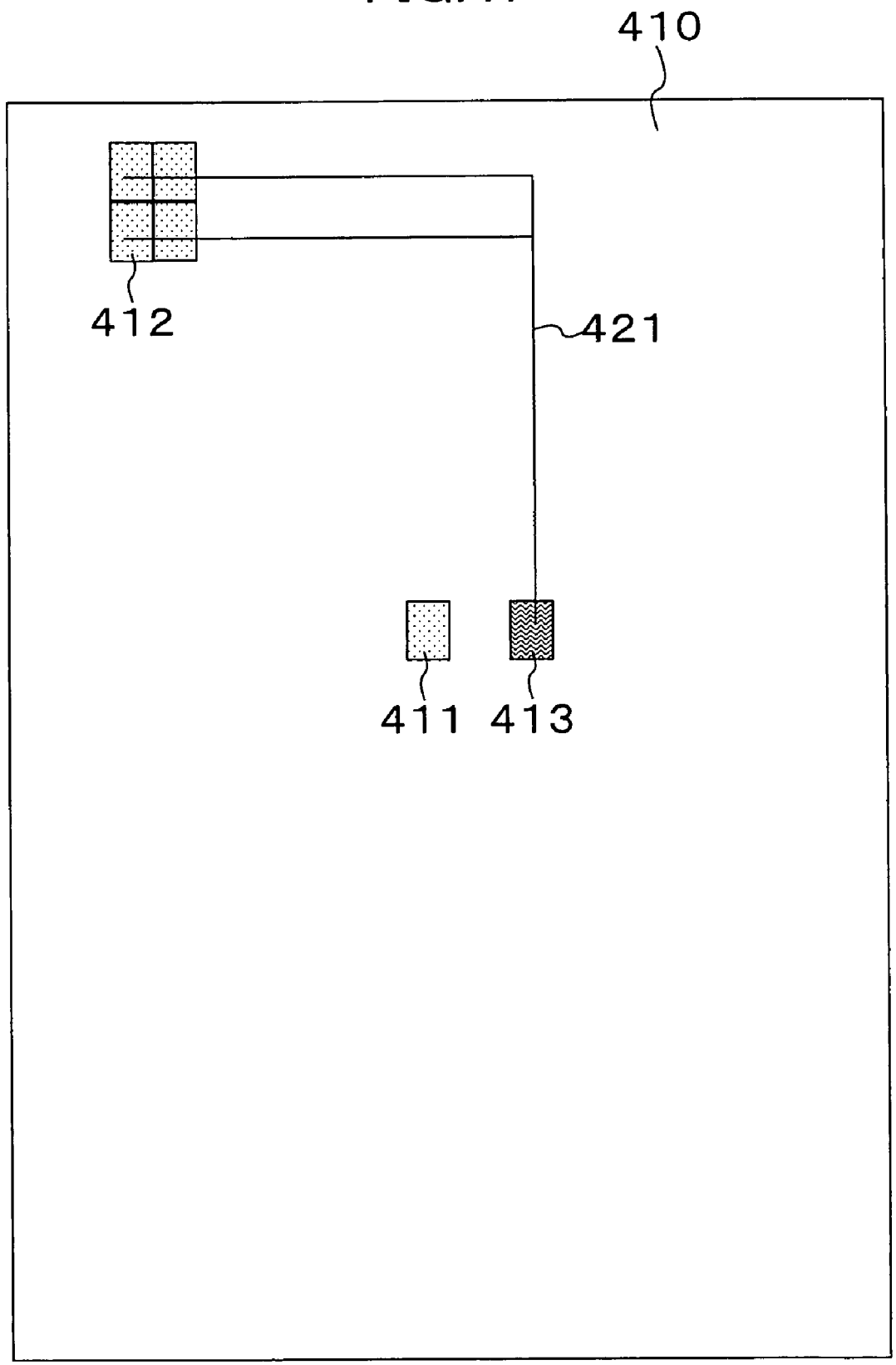
FIG. 47 is a diagrams showing reconnection between the gate and the antenna protection element in FIG. 46

As shown in FIG. 47, connection between the logic cell 413 having the gate and the antenna protection element 411 is cut, and the logic cell 413 is reconnected to the antenna protection element 412 arranged in the peripheral part of the chip 410 by means of a wiring 421. In this arrangement, the logic cell 413 having the gate is far away from the antenna protection element 412 to increase considerably the wiring length of the wiring 421 necessary for the connection. For this reason, the wiring 412 may cause an increase in plasma damage or wiring congestion to invite disablement of connection to the antenna protection element 412, as the matter of fact.

Figure 48:
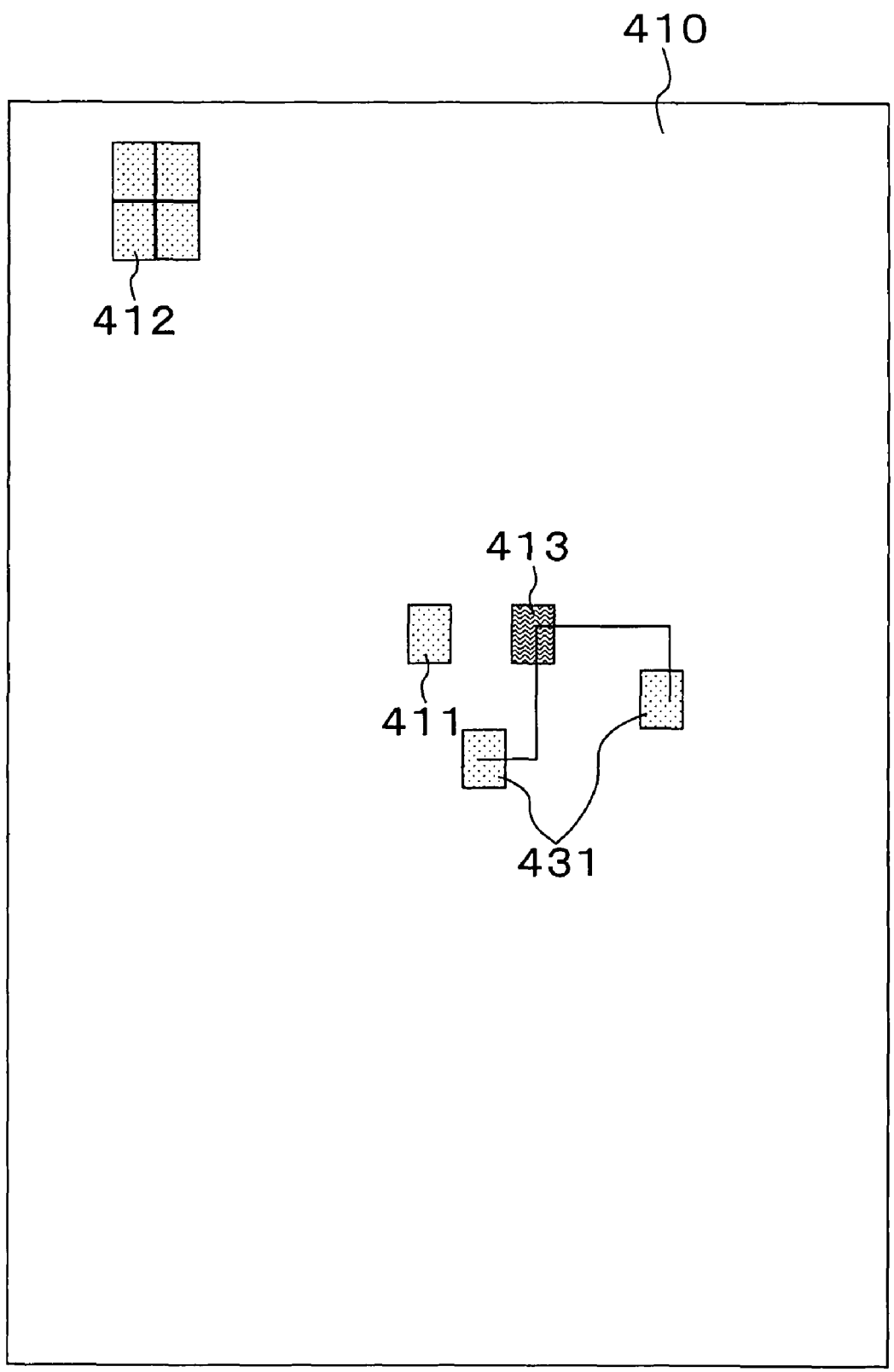
FIG. 48 is a diagram showing reconnection between the gate and the antenna protection element in FIG. 46 according to Embodiment 8 of the present invention.

In view of this, in the present embodiment, if a wiring runs at a rate equal to or larger than a predetermined rate on the antenna protection element 411 as a first antenna protection element, an antenna protection element 431 as a second antenna protection element is added within a predetermined distance range from the gate of the logic cell 413 in an unoccupied region after completion of placing and routing, as shown in FIG. 48. After arrangement is completed, the gate of the logic cell 413 is disconnected from the antenna protection element 411 and is reconnected to the antenna protection element 431. This solves the problem of performance lowering of the antenna protection element 411 which is caused due to formation of the plurality of wirings on the active region.

Figure 45:
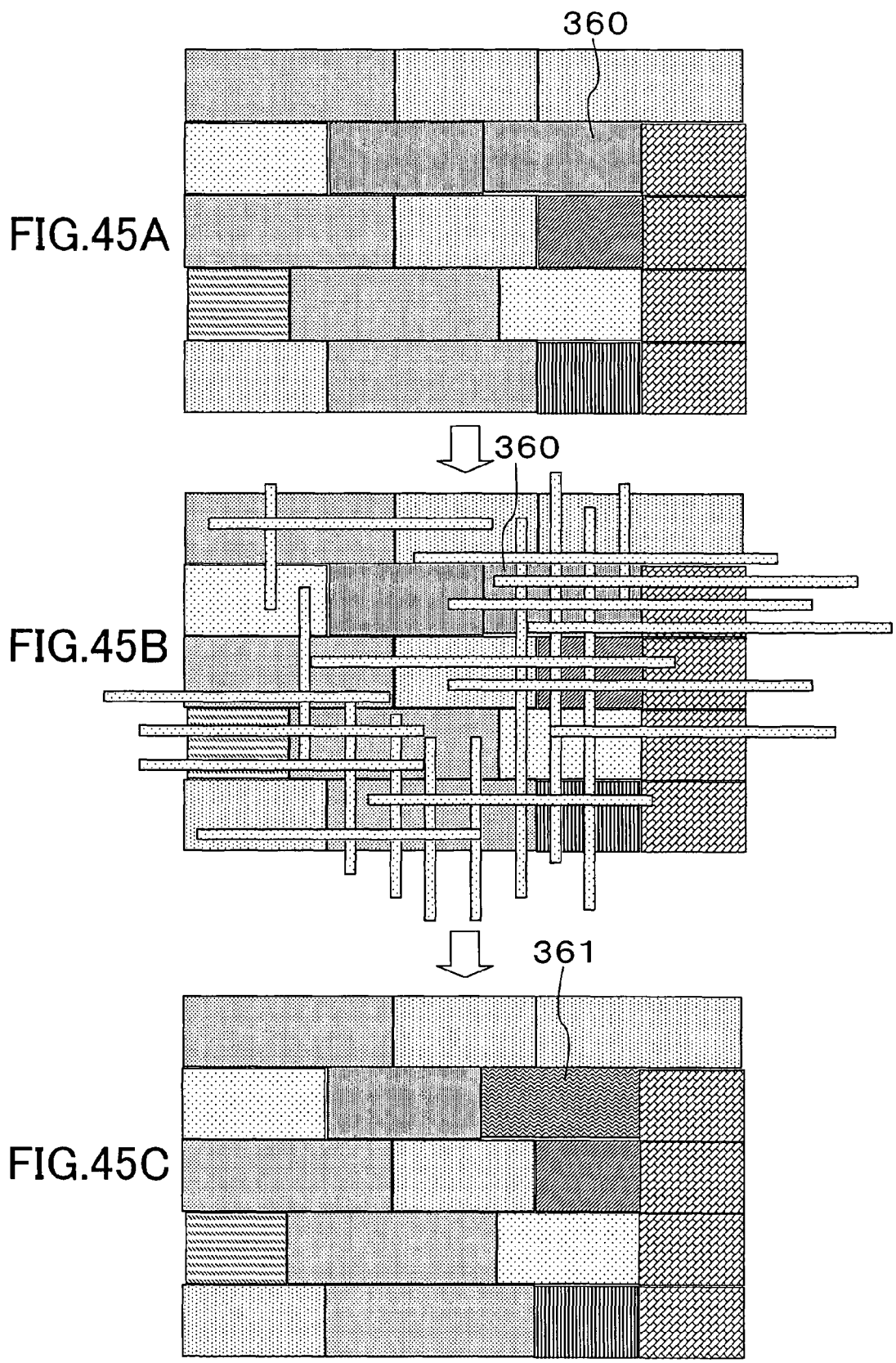
FIG. 45 is a diagrams showing the case where an antenna protection element is replaced by another cell according to Embodiment 7 of the present invention.

Further, similarly to the case of FIG. 45, the antenna protection element 411 is replaced by a cell other than an antenna protection element which involves no influence on the characteristics even when the wirings are formed thereabove, such as a capacitance cell, a buffer cell, or the like. This enables arrangement of effective elements with antenna damage avoided.

Embodiment 9

As described in Embodiment 8, antenna damage error can be avoided by arranging an antenna protection element in an unoccupied region and connecting it to a gate in need of antenna damage relief. Nonetheless, this processing adds an additional wiring pattern to change the resistance and the capacity of the wiring patterns, which may invite another timing error.

The present embodiment provides a method for avoiding this timing error. Specifically, if a wiring that connects an antenna protection element and a gate has a wiring length which is larger than a predetermined length determined according to the process and which involves high possibility of causing antenna damage, a branch wiring is connected to the wiring so as to extend to an unoccupied region which is present within a distance determined according to the process and which provides no remarkable adverse influence on timing verification.

Figure 49:
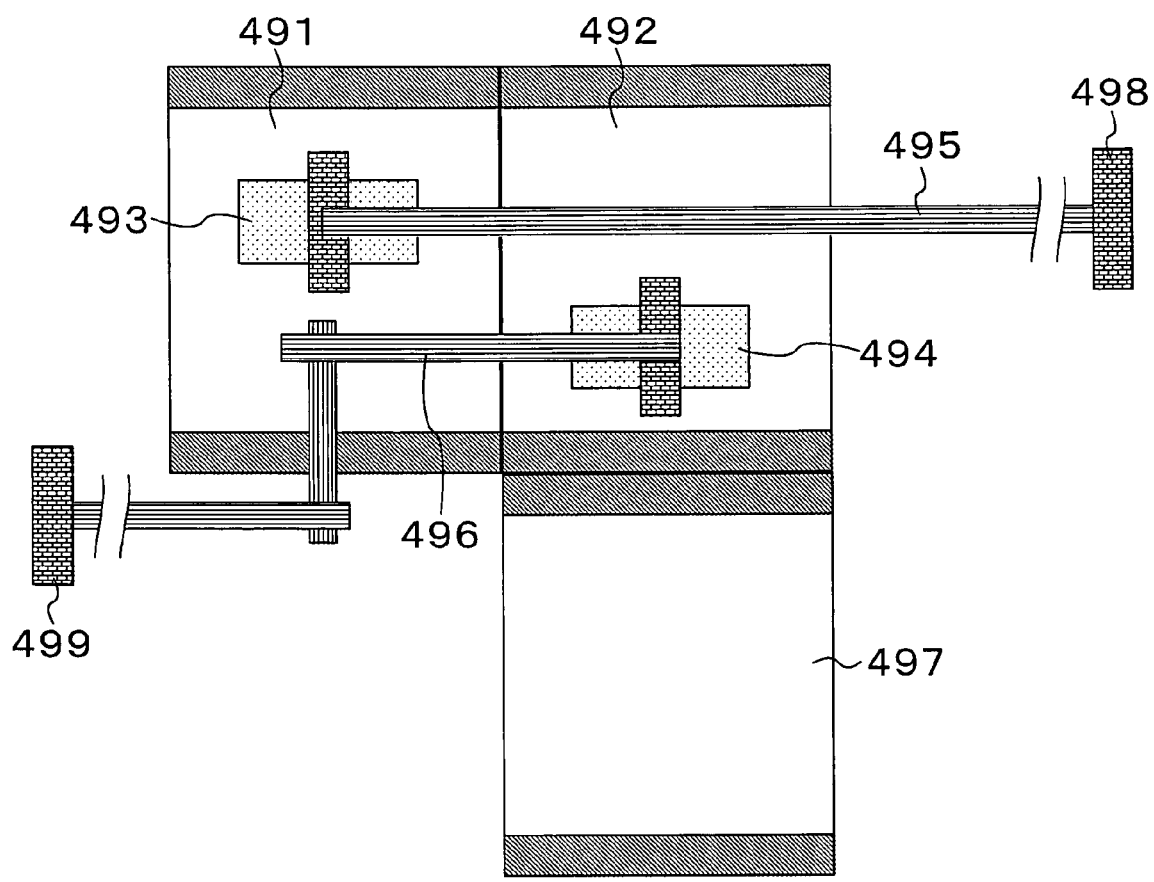
FIG. 49 is a diagram showing each position of an antenna protection element and a gate for explaining Embodiment 9 of the present invention.

FIG. 49 shows each position of antenna protection elements and gates in a layout after cells and wirings are arranged. In FIG. 49, an antenna protection element 491 has an active region 493 connected to a gate 498 by means of a wiring 495. As well, an antenna protection element 492 has an active region 494 connected to a gate 499 by means of a wiring 496. Reference numeral 497 denotes an unoccupied region.

Figure 50:
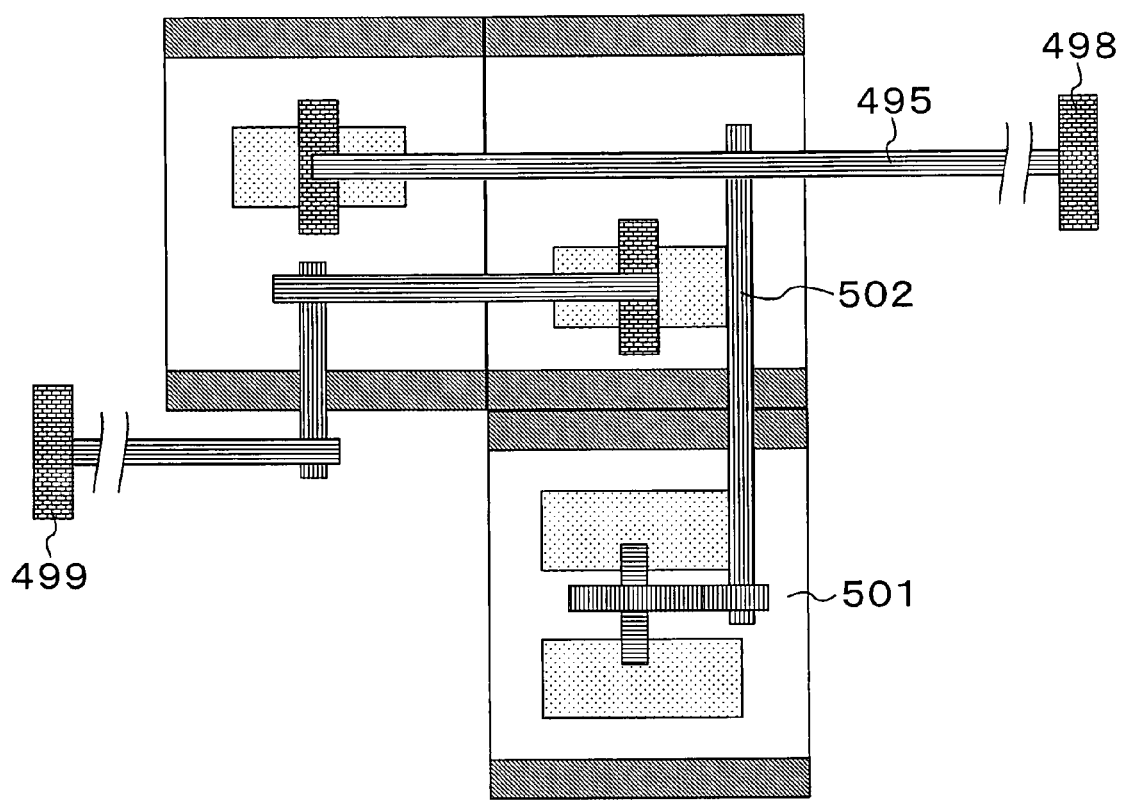
FIG. 50 is a diagram showing a result of replacement of an unoccupied region by the antenna protection element in FIG. 49.

Suppose that antenna damage verification finds antenna error caused at the gate 498. In a conventional technique, as shown in FIG. 50, the unoccupied region 497 is replaced by an antenna protection element 501, and the wiring 495 is connected to the antenna protection element 501 by means of a branch wiring 502. This connection may necessitate a longer length of the branch wiring 502. Further, if the wiring 495 has less or no timing margin and is allowed to have no capacity variation, the connection of the branch wiring 502 would cause timing error.

Figure 51:
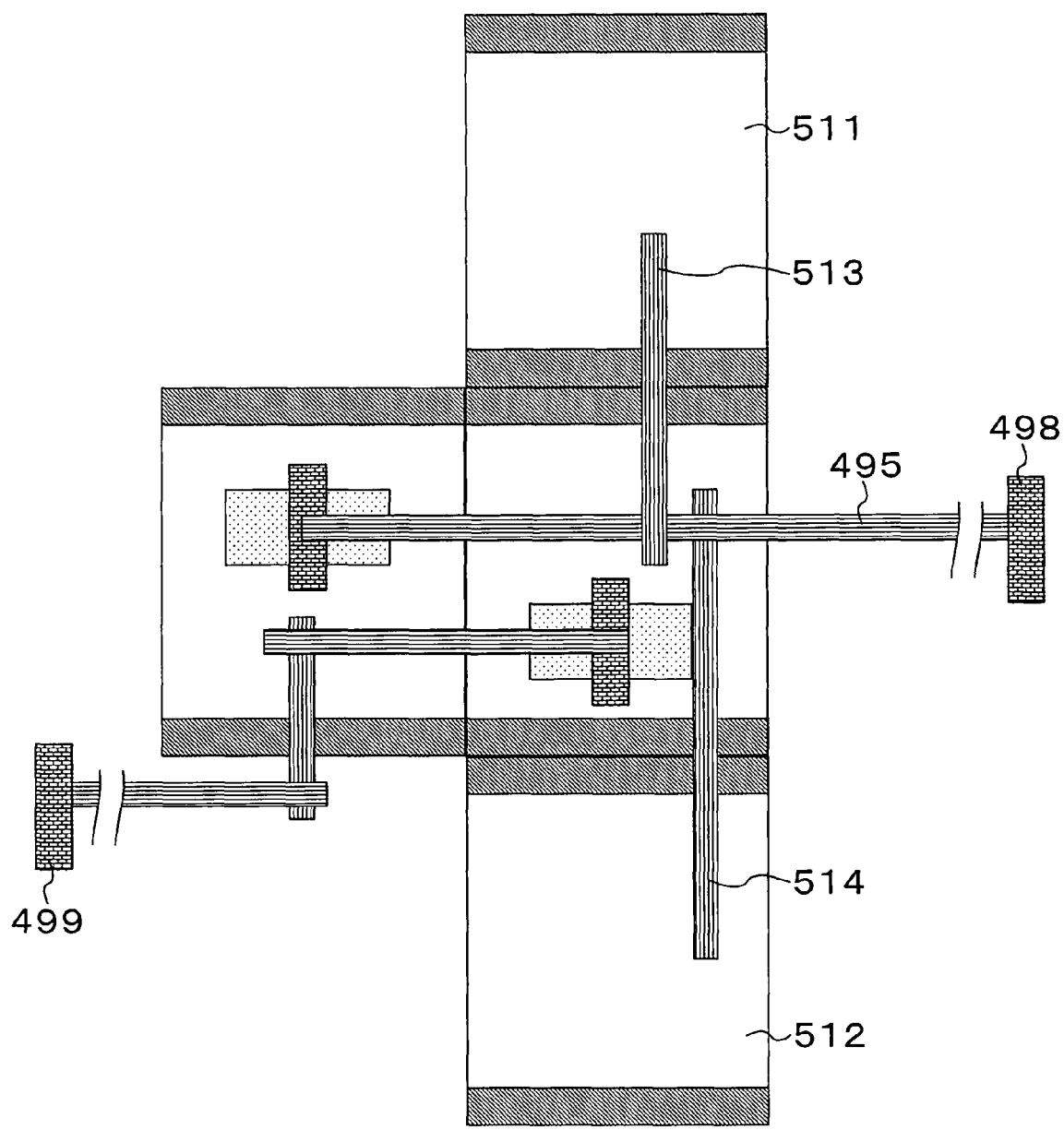
FIG. 51 is a diagrams showing the case where a branch wiring extending to an unoccupied region is routed.

In view of this, in the present embodiment, as shown in FIG. 51, branch wirings 513, 514, which extend to unoccupied regions 511, 512, respectively, and are present within a predetermined distance range determined according to the process, are arranged for the wiring 495 having a wiring length larger than a predetermined length which is determined according to the process condition and with which antenna damage error would be caused probably. Timing verification is performed after the branch wirings 513, 514 are arranged. This necessitates no additional wiring pattern even if the unoccupied regions 511, 512 would be replaced by antenna protection elements upon antenna damage error caused, so that the result of timing verification would vary little.

Further, it is preferable that an antenna protection element including a connection pin is prepared in advance for replacement with an unoccupied region and a branch wiring is routed so as to pass the point of the connection pin when the unoccupied region is replaced by the antenna protection element.

Figure 53:
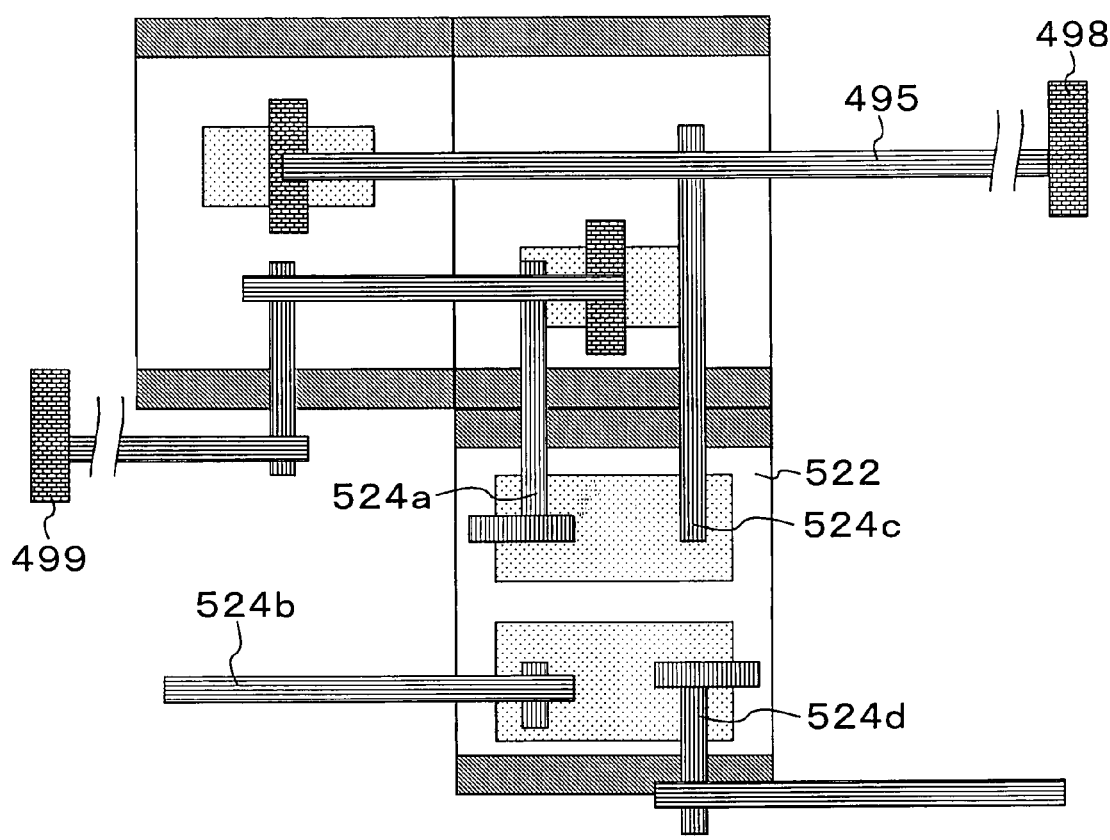
FIG. 53 is a diagram showing a result of replacement of the unoccupied region by the antenna protection element in FIG. 52.

Specifically, as shown in FIG. 52, there are prepared in advance, for example, an antenna protection element 522 including connection pins 523a, 523b, 523c, 523d respectively connected to four corners of upper left, lower left, upper right, and lower right of the active region thereof. Branch wirings 524a, 524b, 524c, 524d are arranged so as to extend to the four corners of the upper left, lower left, upper right, and lower right of an unoccupied region 521, respectively. Upon antenna damage error caused, the unoccupied region 521 is replaced by the antenna protection element 522. Since the branch wirings 524a, 524b, 524c, 524d are arranged so as to pass the points of the connection pins 523a, 523b, 523c, 523d, respectively, the antenna protection element 522 can be connected to the branch wirings 524a, 524b, 524c, 524d without changing the wiring route, as shown in FIG. 53.

This methods reduces to a minimum the increase amount of the wiring patterns in connecting the antenna protection element in place of the unoccupied region, avoiding antenna damage to cause no timing error. Hence, no design modification is required.

Figure 54:
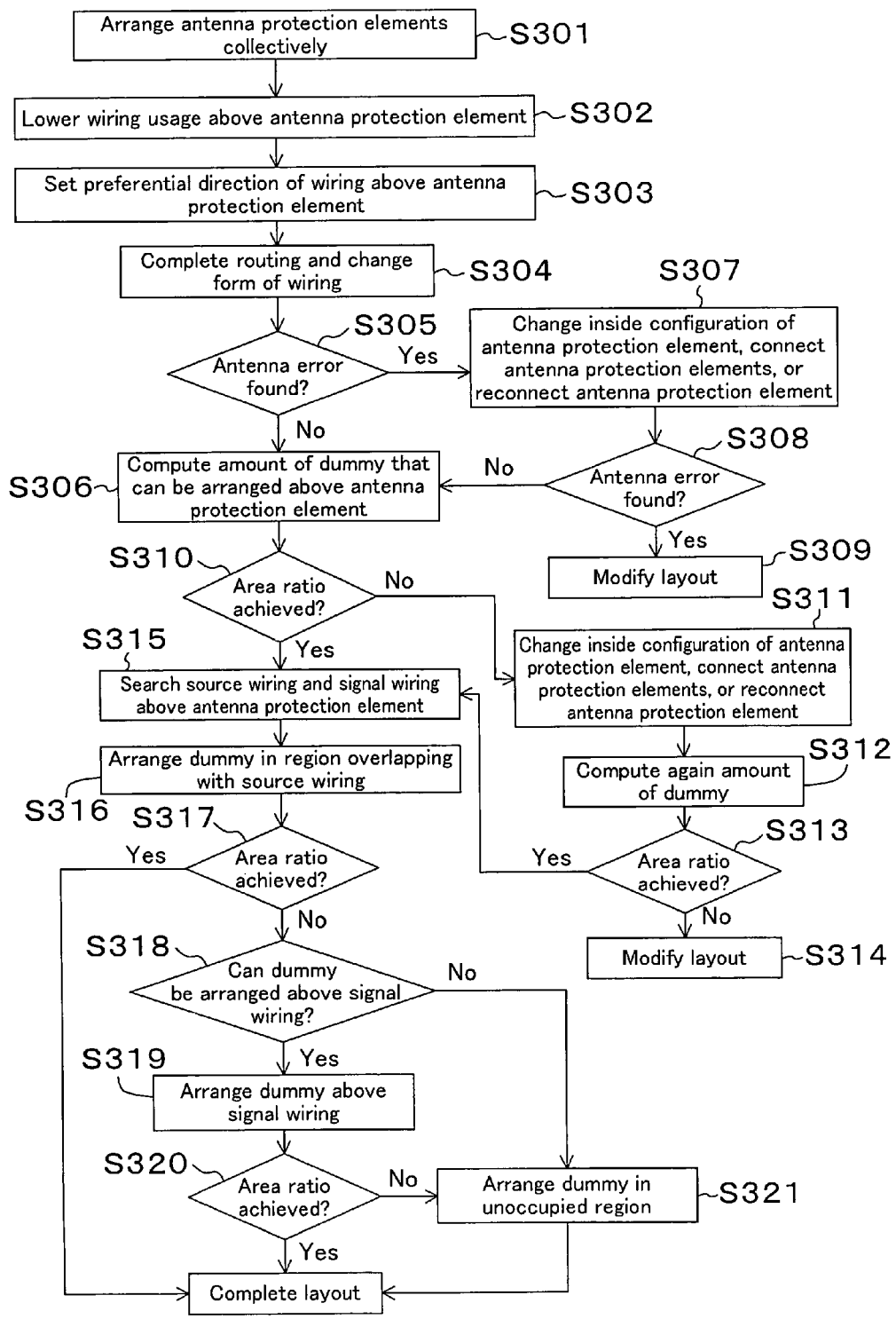
FIG. 54 is a flowchart depicting one example of a layout designing method employing a combination of the methods of the respective embodiments of the present invention.
Figure 55:
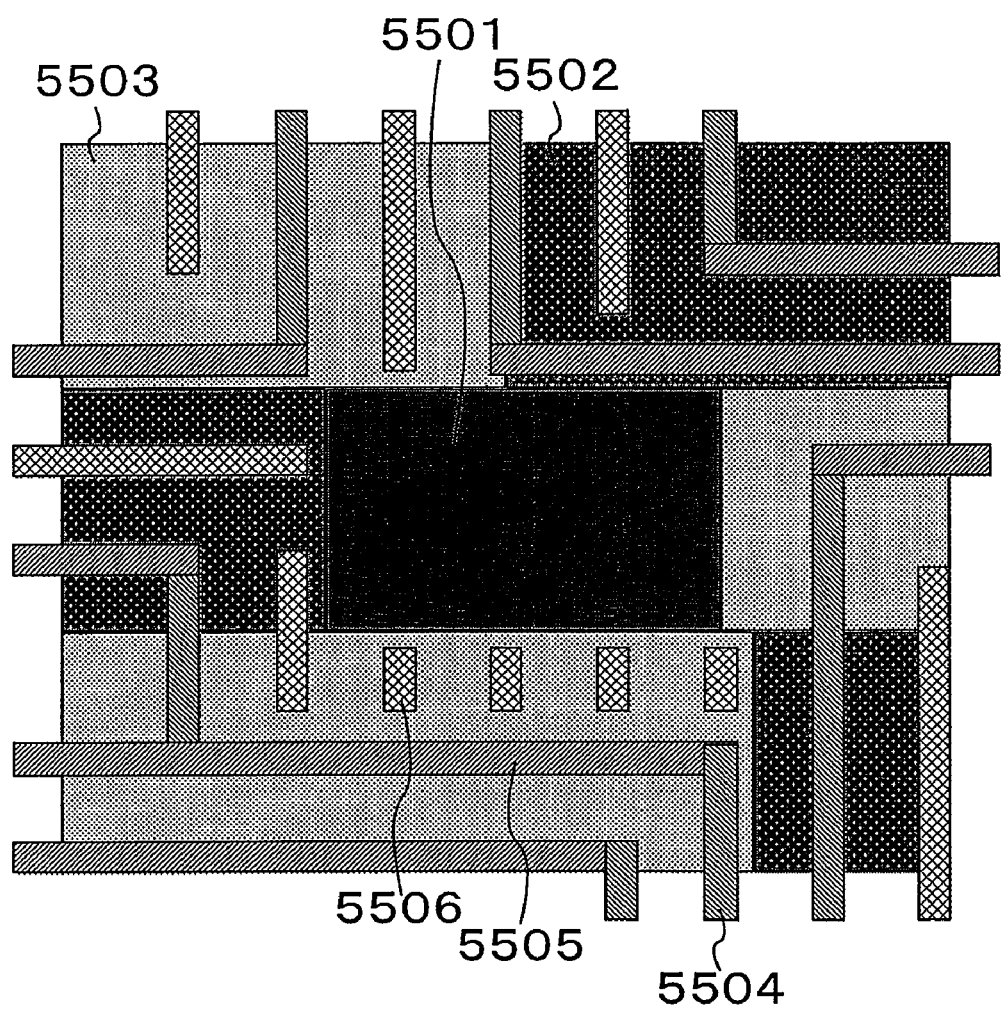
FIG. 55 is a diagram showing a conventional configuration including an antenna protection element.
Figure 56:
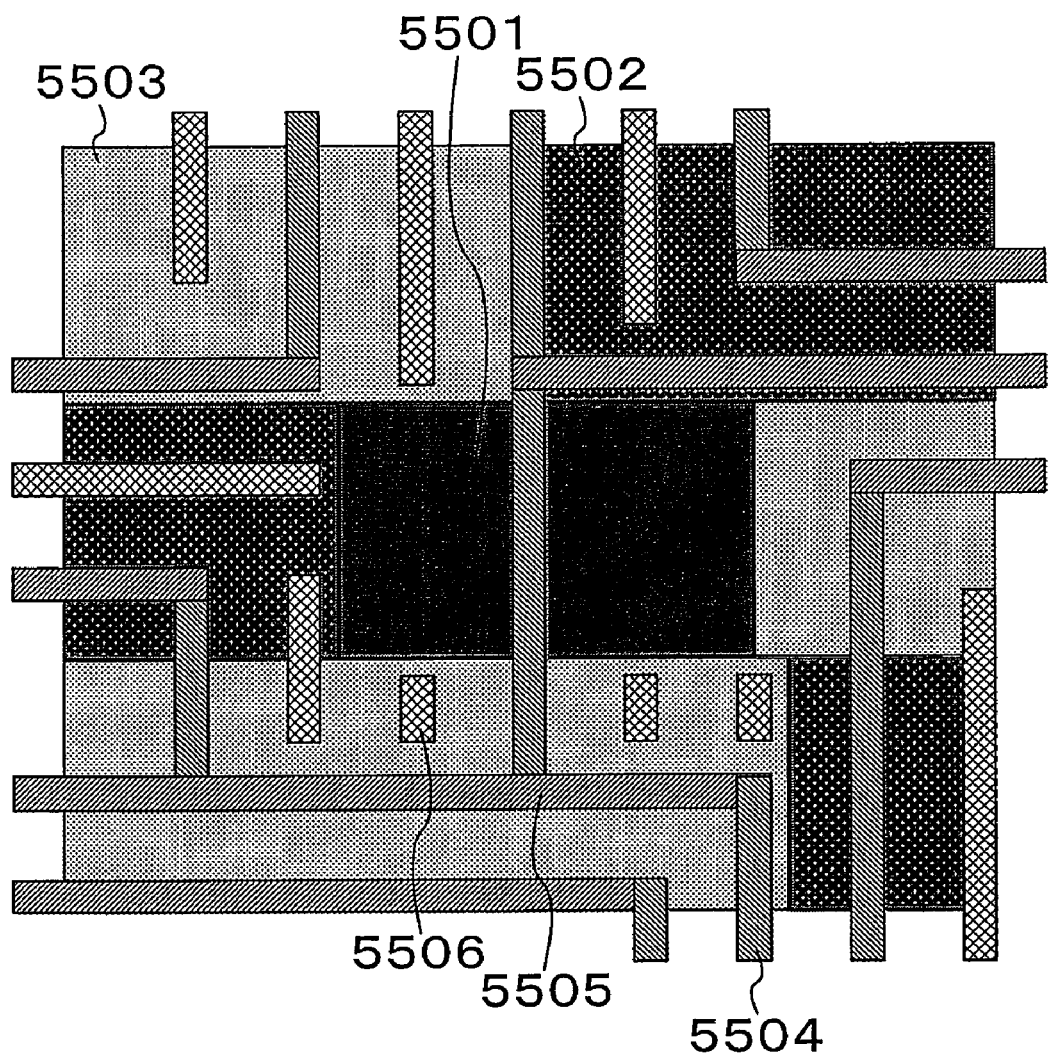
FIG. 56 is a diagram showing a conventional configuration including an antenna protection element.

FIG. 54 is a flowchart depicting one example of a layout designing method employing a combination of the methods of the above embodiments. In FIG. 54, steps S301 and S302 correspond to Embodiment 3, a step S303 corresponds to Embodiment 4, and a step S304 corresponds to Embodiment 2. Further, a step S306 corresponds Embodiment 1, steps S307 and S311 correspond to Embodiments 6, 7, and 8, and steps S315, S316, S318, S319 correspond to Embodiment 1.

In FIG. 54, after antenna protection elements are arranged collectively so that the UV light can be irradiated sufficiently to the active regions of the antenna protection elements (S301), each wiring usage on each antenna protection element is lowered (S302). As well, a preferential direction of wirings on each antenna protection element is set in one direction, for example, the longitudinal direction (S303).

Subsequently, actual routing is performed (S303). After routing is completed, a source wiring is processed within a range that IR-Drop allows by cutting the source wiring, by forming a slit therein, or the like (S304). After the source wiring is processed, antenna damage verification is performed (S305). When antenna damage error is caused at this stage, a countermeasure is taken, such as change in inside configuration of a protection element, connection to a protection element therearound, reconnection to an protection element in the peripheral part, or the like, to avoid the antenna damage error (S307). When the antenna damage error cannot be resolved by any means (Yes in S308), the layout is modified at this stage (S309).

On the other hand, when no antenna error is caused, the amount of dummy patterns that can be arranged on the antenna protection elements is computed (S306). Then, area ratio verification is performed on the basis of the computed amount of the dummy patterns (S310). The area ratio verification results in that the area ratio is judged to be smaller, operation similar to the step S307, such as change in inside configuration of a protection element or the like is performed to increase the amount of the dummy patterns that can be arranged on the antenna protection elements in a region where the area ratio is smaller (S311 and S312). When the area ratio cannot be achieved by any means for increasing the amount of the dummy patterns (No in S313), the layout is modified because of insufficient area ratio (S314).

When the area ratio is achieved (Yes in S310 or S313), a source wiring and a signal wiring on the antenna protection element are searched (S315), and a dummy pattern is arranged only on or below the searched source wiring (S316) so that the amount of the UV light irradiated to the antenna protection element is secured. After the dummy pattern is arranged, area ratio verification is performed (S317) for checking whether or not the area ratio is achieved. When the area ratio is achieved, which means both the area ratio verification and the antenna damage verification are cleared, the layout is completed at this stage.

Unless arrangement of the dummy pattern on or below the wiring source achieves the area ratio (No in S317), whether or not arrangement of the dummy pattern on or below a signal wiring satisfies timing is checked (S318). If the timing is not satisfied (No in S318), a dummy pattern is arranged at a part overlapping with the active region of the antenna protection element (S321) to achieve the area ratio, and then, the layout is completed. In this case, the arranged dummy pattern has been judged in the antenna damage verification as a dummy pattern capable of being arranged, and therefore, no antenna error is caused in the second antenna damage verification.

On the other hand, when the timing is satisfied (Yes in S318), a dummy pattern is arranged on or below the signal wiring within a range satisfying the timing (S319), and area ratio verification is performed again (S320). When the area ratio is achieved in this stage, the layout is completed. When the area ratio is not achieved, the dummy pattern is arranged at a part overlapping with the active region of the antenna protection element (S321) to achieve the area ratio, and then, the layout is completed. After the layout is completed, an antenna protection element having a safety margin from antenna damage is changed to a capacitance cell or the like to increase noise resistance, so that a further high quality layout is attained.

The above described processing flow achieves both avoidance of antenna damage error and the area ratio. The flow of FIG. 54 is one example. A part thereof may be omitted, and the order thereof may be permutated.

In the present invention, a semiconductor device of which chip is planarized can be achieved easily with antenna damage avoided and with the wiring efficiency secured. Hence, the present invention is useful in designing, for example, a high quality chip within a short TAT (Turn Around Time) in the miniaturization process.

What is claimed is:

1. A semiconductor device, comprising:
   a plurality of cells including a first cell which is an antenna protection element and a second cell which is a cell other than the antenna protection element; and
   at least one dummy pattern arranged in a same layer above the plurality of cells,
   wherein the at least one dummy pattern overlaps with both the first cell and the second cell,
   an area where the first cell and the at least one dummy pattern overlap with each other is smaller than an area where the second cell and the at least one dummy pattern overlap with each other.

2. The semiconductor device of claim 1, wherein a half or less of the first cell overlaps with the at least one dummy pattern.

3. The semiconductor device of claim 1, wherein one tenth or less of the first cell overlaps with the at least one dummy pattern.

4. The semiconductor device of claim 1, wherein the at least one dummy pattern has a rectangle shape.

5. The semiconductor device of claim 4, wherein a longitudinal direction of the at least one dummy pattern accords with an extending direction of a signal wiring of the same layer.

* * * * *